(12) United States Patent
Narita

(10) Patent No.: US 10,134,659 B2
(45) Date of Patent: Nov. 20, 2018

(54) SEMICONDUCTOR DEVICE WITH OVERLAPPED LEAD TERMINALS

(71) Applicant: Renesas Electronics Corporation, Kawasaki-shi, Kanagawa (JP)

(72) Inventor: Hiroaki Narita, Tsuruta (JP)

(73) Assignee: Renesas Electronics Corporation, Tokyo (JP)

( * ) Notice: Subject to any disclaimer, the term of this patent is extended or adjusted under 35 U.S.C. 154(b) by 114 days.

(21) Appl. No.: 14/467,016

(22) Filed: Aug. 24, 2014

(65) Prior Publication Data

US 2014/0361444 A1    Dec. 11, 2014

Related U.S. Application Data

(63) Continuation of application No. 12/856,664, filed on Aug. 15, 2010, now Pat. No. 8,853,865.

(30) Foreign Application Priority Data

Sep. 29, 2009   (JP) .................................. 2009-223948
Mar. 26, 2010  (JP) .................................. 2010-072233

(51) Int. Cl.
*H01L 23/495*    (2006.01)
*H01L 23/498*    (2006.01)
(Continued)

(52) U.S. Cl.
CPC ...... *H01L 23/4951* (2013.01); *H01L 21/4821* (2013.01); *H01L 21/561* (2013.01);
(Continued)

(58) Field of Classification Search
CPC .............. H01L 24/09; H01L 24/13; H01L 2924/01028; H01L 2924/01047;
(Continued)

(56) References Cited

U.S. PATENT DOCUMENTS 6,339,254 B1 * 1/2002 Venkateshwaran .........................
H01L 25/0657
257/686
6,448,665 B1   9/2002 Nakazawa et al.
(Continued)

FOREIGN PATENT DOCUMENTS

JP    03-94460 A    4/1991
JP    11-97570 A    4/1999
(Continued)

OTHER PUBLICATIONS

Office Action dated Feb. 25, 2014, in Japanese Patent Application No. 2013-079862.
(Continued)

*Primary Examiner* — Marcos D Pizarro
(74) *Attorney, Agent, or Firm* — Shapiro, Gabor and Rosenberger, PLLC

(57) ABSTRACT

The size and thickness of a semiconductor device are reduced. A semiconductor package with a flip chip bonding structure includes: a semiconductor chip having a main surface with multiple electrode pads formed therein and a back surface located on the opposite side thereto; four lead terminals each having an upper surface with the semiconductor chip placed thereover and a lower surface located on the opposite side thereto; and a sealing body having a main surface and a back surface located on the opposite side thereto. In this semiconductor package, the distance between adjacent first lower surfaces of the four lead terminals exposed in the back surface of the sealing body is made longer than the distance between adjacent upper surfaces thereof. This makes it possible to suppress the production of a solder bridge when the semiconductor package is solder mounted to a mounting board and to reduce the size and (Continued)

thickness of the semiconductor package and further enhance the reliability of the semiconductor package.

8 Claims, 54 Drawing Sheets

(51) Int. Cl.
*H01L 21/48* (2006.01)
*H01L 21/56* (2006.01)
*H01L 21/683* (2006.01)
*H01L 23/31* (2006.01)
*H01L 23/00* (2006.01)
*H05K 3/34* (2006.01)

(52) U.S. Cl.
CPC .......... *H01L 21/565* (2013.01); *H01L 21/568* (2013.01); *H01L 21/6835* (2013.01); *H01L 23/3107* (2013.01); *H01L 23/49548* (2013.01); *H01L 23/49582* (2013.01); *H01L 23/49805* (2013.01); *H01L 24/11* (2013.01); *H01L 24/13* (2013.01); *H01L 24/16* (2013.01); *H01L 24/81* (2013.01); *H01L 24/97* (2013.01); *H01L 24/45* (2013.01); *H01L 24/48* (2013.01); *H01L 2224/0401* (2013.01); *H01L 2224/04042* (2013.01); *H01L 2224/1134* (2013.01); *H01L 2224/13099* (2013.01); *H01L 2224/13144* (2013.01); *H01L 2224/16245* (2013.01); *H01L 2224/32245* (2013.01); *H01L 2224/45144* (2013.01); *H01L 2224/45147* (2013.01); *H01L 2224/48091* (2013.01); *H01L 2224/48095* (2013.01); *H01L 2224/48247* (2013.01); *H01L 2224/48471* (2013.01); *H01L 2224/48479* (2013.01); *H01L 2224/73265* (2013.01); *H01L 2224/78301* (2013.01); *H01L 2224/81001* (2013.01); *H01L 2224/81801* (2013.01); *H01L 2224/85051* (2013.01); *H01L 2224/85986* (2013.01); *H01L 2224/97* (2013.01); *H01L 2924/00014* (2013.01); *H01L 2924/014* (2013.01); *H01L 2924/12042* (2013.01); *H01L 2924/14* (2013.01); *H01L 2924/15151* (2013.01); *H01L 2924/181* (2013.01); *H01L 2924/19041* (2013.01); *H01L 2924/30105* (2013.01); *H05K 3/3442* (2013.01)

(58) Field of Classification Search
CPC ....... H01L 2924/01079; H01L 23/4951; H01L 23/49805; H05K 3/3442
See application file for complete search history.

(56) References Cited

U.S. PATENT DOCUMENTS

| | | | |
|---|---|---|---|
| 6,828,688 B2 | 12/2004 | Yagi | |
| 6,858,919 B2 | 2/2005 | Seo et al. | |
| 6,969,905 B2 * | 11/2005 | Paulus | 257/666 |
| 6,975,022 B2 | 12/2005 | Sakamoto et al. | |
| 7,659,634 B2 | 2/2010 | Kobayashi et al. | |
| 7,960,837 B2 * | 6/2011 | Inoue | 257/773 |
| 2007/0215995 A1 * | 9/2007 | Lin | H01L 21/4828 257/676 |
| 2012/0104577 A1 * | 5/2012 | Fukumura | H01L 23/4951 257/666 |
| 2012/0153447 A1 * | 6/2012 | Jiang | H01L 21/563 257/673 |
| 2012/0181680 A1 * | 7/2012 | Li | H01L 21/4832 257/676 |
| 2012/0313234 A1 * | 12/2012 | Shen | H01L 24/11 257/677 |

FOREIGN PATENT DOCUMENTS

| | | | |
|---|---|---|---|
| JP | 11-251504 A | | 9/1999 |
| JP | 2001-332649 A | | 11/2001 |
| JP | 2001-338941 A | | 12/2001 |
| JP | 2002-289739 A | | 10/2002 |
| JP | 2005-236309 A | | 9/2005 |
| JP | 2006-278914 A | | 10/2006 |
| JP | 2006-303305 A | | 11/2006 |
| JP | 2006303305 A | * | 11/2006 |
| JP | 2007-173870 A | | 7/2007 |

OTHER PUBLICATIONS

Office Action dated Sep. 24, 2015, in Japanese Patent Application No. 2014-243182.

* cited by examiner

SEMICONDUCTOR DEVICE WITH OVERLAPPED LEAD TERMINALS

CROSS-REFERENCE TO RELATED APPLICATIONS

This application is a continuation of application Ser. No. 12/856,664 filed Aug. 15, 2010 (now U.S. Pat. No. 8,853,865). Also, the disclosure of Japanese Patent Application No. 2010-72233 filed on Mar. 26, 2010 and No. 2009-223948 filed on Sep. 29, 2009 including the specification, drawings and abstract is incorporated herein by reference in its entirety.

BACKGROUND OF THE INVENTION

The present invention relates to semiconductor devices and manufacturing technologies therefor and in particular to a technology effectively applicable to reduction in the size and thickness of a semiconductor device.

Patent Document 1 (Japanese Unexamined Patent Publication No. Hei 11(1999)-251504) discloses a structure in which an electrode in an electronic component main body is bonded to an electrode member comprised of a lead frame by thermocompression or soldering.

Patent Document 2 (Japanese Unexamined Patent Publication No. Hei 3(1991)-94460) discloses the following structure and a manufacturing method therefor: a structure in which a semiconductor chip is flip chip bonded to a bonding portion in a circuit pattern comprised of a metal layer, formed over a transfer film through a bump.

[Patent Document 1]
Japanese Unexamined Patent Publication No. Hei 11(1999)-251504 [Patent Document 2]
Japanese Unexamined Patent Publication No. Hei 3(1991)-94460

SUMMARY OF THE INVENTION

In small resin-sealed semiconductor devices fabricated using a lead frame comprised of a sheet-like metal plate, a wire bonding coupling structure is widely used and in recent years, demands for further size and thickness reduction have been increasing.

However, when an attempt is made to reduce the size of a semiconductor device with a wire bonding coupling structure, the following problem arises:

To reduce the size of a semiconductor device with a wire bonding coupling structure, the following processing is carried out as illustrated in the comparative example in FIG. 60: the outer dimensions of a die pad 53 for placing a semiconductor chip 52 are made smaller than the outer dimensions of the semiconductor chip 52; and one end of each of multiple leads (lead terminals) 54 arranged around the die pad 53 is brought close to the semiconductor chip 52 (or the die pad 53) as much as possible. This shortens the distance from each lead 54 to a corresponding chip end (edge) of the semiconductor chip 52; therefore, the length of each side of the semiconductor device 51 is reduced and the semiconductor device 51 can be reduced in size.

Subsequently, wire bonding is carried out to respectively electrically couple together multiple electrode pads (terminals) 52b provided over the main surface 52a of the semiconductor chip 52 and the leads 54 through multiple conductive wires 55. This wire bonding is implemented by forming a loop of a wire 55 using a capillary 56 as a bonding tool. At this time, as mentioned above, the distance from each chip end of the semiconductor chip 52 to each corresponding lead 54 has been very short. This causes a phenomenon (problem) in which when a loop is formed, the tip of the capillary 56 and a chip end of the semiconductor chip 52 interfere with each other and wire bonding cannot be carried out.

For this reason, the end of each lead 54 can be brought close to the semiconductor chip 52 only to the extent that the capillary 56 does not interfere with a chip end of the semiconductor chip 52 during wire bonding. This imposes a restriction on reduction in the size of the semiconductor device 51.

There are also problems peculiar to reduction in the size of the semiconductor device 51. Some examples will be taken. The size of each terminal (external terminal) itself is reduced; therefore, the area of contact (adhesion) between a sealing body and a terminal surface is reduced and each terminal is prone to come off from the semiconductor device main body. Further, since the distance between terminals is also reduced, a solder bridge is prone to be formed between terminals when the device is solder mounted to a mounting board. These problems encountered when the size of the semiconductor device 51 is reduced also relate to degradation in the reliability of the semiconductor device.

Neither Patent Document 1 (Japanese Unexamined Patent Publication No. Hei 11(1999)-251504) nor Patent Document 2 (Japanese Unexamined Patent Publication No. Hei 3(1991)-94460) discloses anything about the following technology: a technology with which it is possible to achieve reduction in the size of a semiconductor device and further cope with (solve) such problems as coming-off of a terminal and a solder bridge between terminals.

The invention has been made in consideration of the above problems and it is an object thereof to provide a technology with which the size and thickness of a semiconductor device can be reduced.

It is another object of the invention to provide a technology with which the reliability of a semiconductor device can be enhanced.

The above and other objects and novel features of the invention will be apparent from the description in this specification and the accompanying drawings.

The following is a brief description of the gist of the representative elements of the invention laid open in this application:

The invention includes: a semiconductor chip having a main surface with multiple terminals formed therein; multiple lead terminals each having an upper surface with the semiconductor chip placed thereover and a lower surface located on the opposite side to the upper surface and respectively electrically coupled with multiple terminals of the semiconductor chip; and a sealing body having a main surface and a back surface located on the opposite side to the main surface and sealing the semiconductor chip and part of each of the lead terminals. The lower surface of each of the lead terminals includes: a first lower surface exposed in the back surface of the sealing body; and a second lower surface positioned between the upper surface of the lead terminal and the first lower surface and arranged in the sealing body. The distance between the first lower surfaces of adjacent lead terminals is longer than the distance between the upper surfaces thereof as viewed in a plane.

The invention comprises the steps of: (a) preparing a sheet-like frame in which there are formed multiple lead terminals each having an upper surface over which a semiconductor chip can be placed and a lower surface located on the opposite side to the upper surface, the lower surface having a first lower surface and a second lower surface positioned between the upper surface and the first lower surface so that the distance between the adjacent first lower surfaces is longer than the distance between the adjacent upper surfaces as viewed in a plane; (b) arranging the semiconductor chip over the upper surface of each of the lead terminals of the frame and thereafter electrically coupling together the multiple terminals of the semiconductor chip and the respective upper surfaces of the lead terminals; and (c) forming the sealing body so that it seals the semiconductor chip and part of each of the lead terminals and the first lower surface of each of the lead terminals is exposed in the back surface of the sealing body. The sealing body is so formed that the distance between the respective first lower surfaces of the adjacent lead terminals is longer than the distance between the upper surfaces thereof.

The following is a brief description of the gist of effects obtained by the representative elements of the invention laid open in this application:

It is possible to suppress production of a solder bridge during solder mounting to a mounting board or the like and to reduce the size and thickness of a semiconductor device and further enhance the reliability of the semiconductor device.

Further, it is possible to prevent a lead terminal from coming off in the direction of the thickness of the sealing body and enhance the reliability of the semiconductor device.

DETAILED DESCRIPTION OF THE PREFERRED EMBODIMENTS

Figure 1:
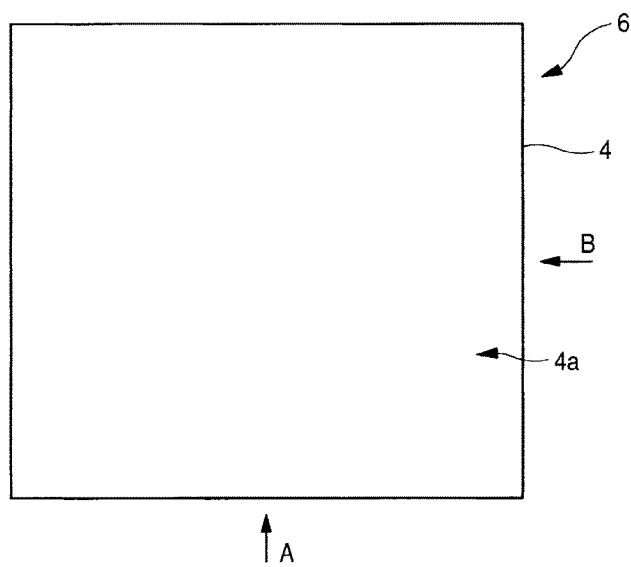
FIG. 1 is a plan view illustrating an example of the structure of a semiconductor device in a first embodiment of the invention.

In the following description of embodiments, a description of an identical or similar part will not be repeated as a rule unless especially required.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number.

In the following description of embodiments, needless to add, their constituent elements (including elemental steps and the like) are not always indispensable unless explicitly stated otherwise or they are obviously indispensable in principle.

When the wording of "comprised of A," "composed of A," "having A," or "including A" is used in the following description of embodiments with respect to a constituent element or the like, other elements are not excluded, needless to add. Unless explicitly stated otherwise, the foregoing applies. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention with reference to the drawings. In all the drawings explaining the embodiments, members having the same function will be marked with the same reference numerals and repetitive description thereof will be omitted.

(First Embodiment)

Figure 2:
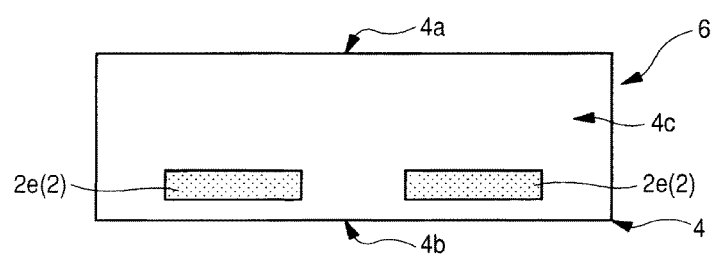
FIG. 2 is a side view illustrating an example of the structure of the semiconductor device illustrated in FIG. 1 as viewed from the direction A.
Figure 3:
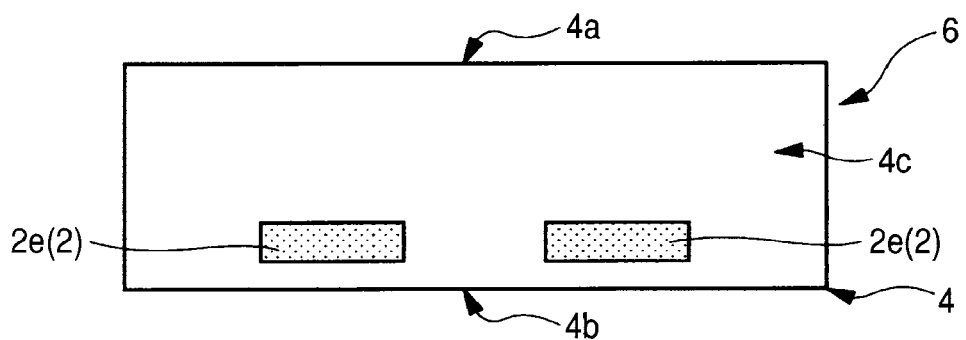
FIG. 3 is a side view illustrating an example of the structure of the semiconductor device illustrated in FIG. 1 as viewed from the direction B.
Figure 4:
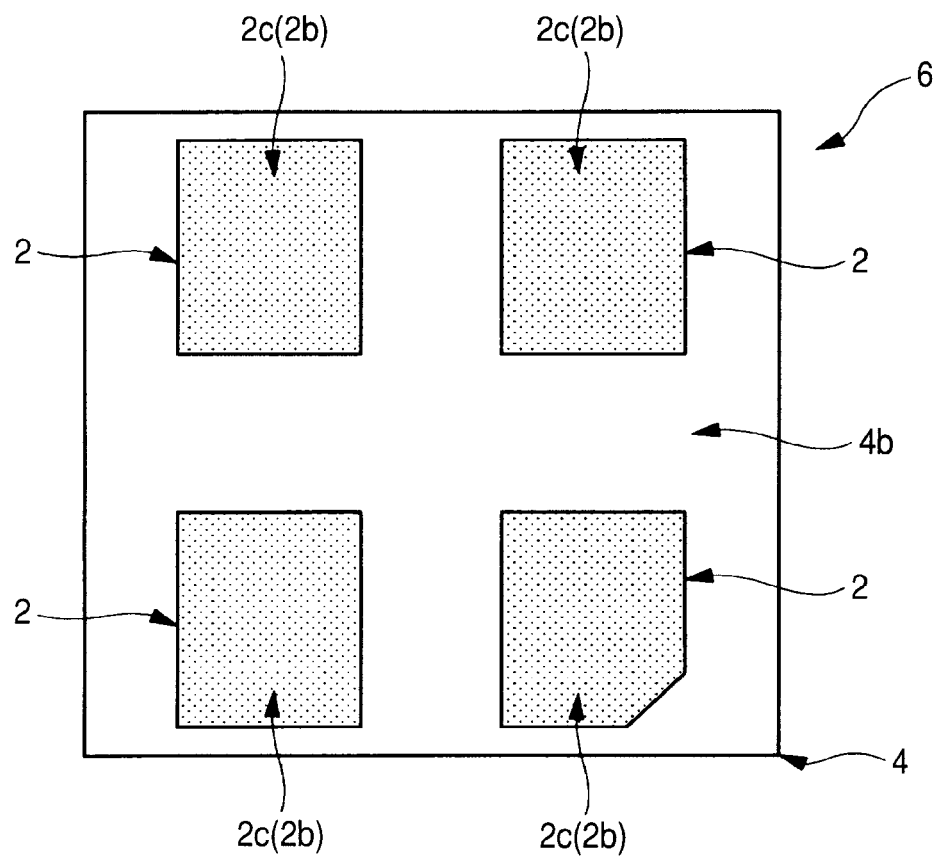
FIG. 4 is a bottom view illustrating an example of the structure of the semiconductor device illustrated in FIG. 1 on the back surface side.
Figure 5:
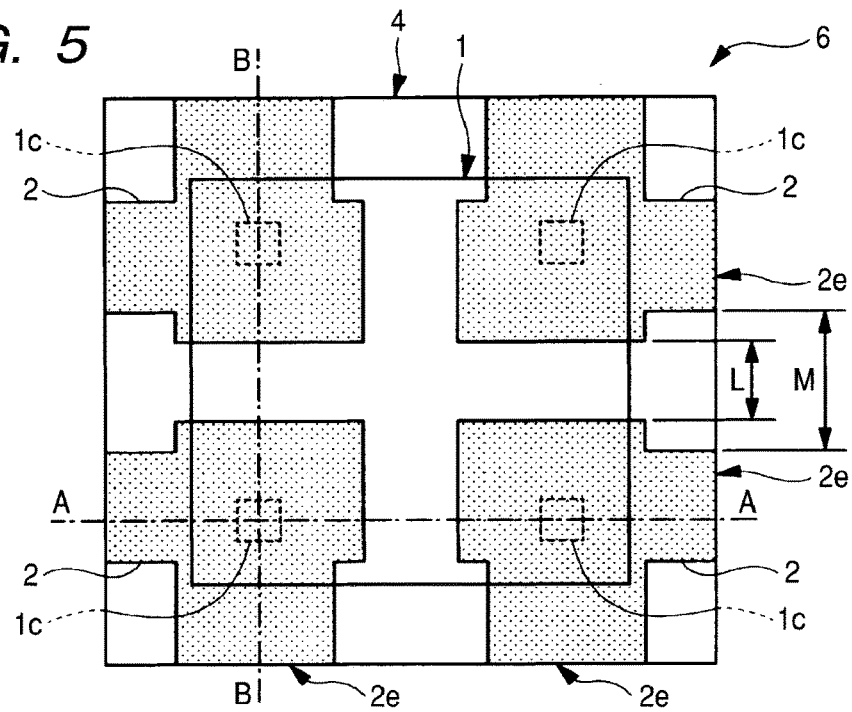
FIG. 5 is a plan view illustrating an example of the structure of the semiconductor device illustrated in FIG. 1 as seen through a sealing body and a semiconductor chip.
Figure 6:
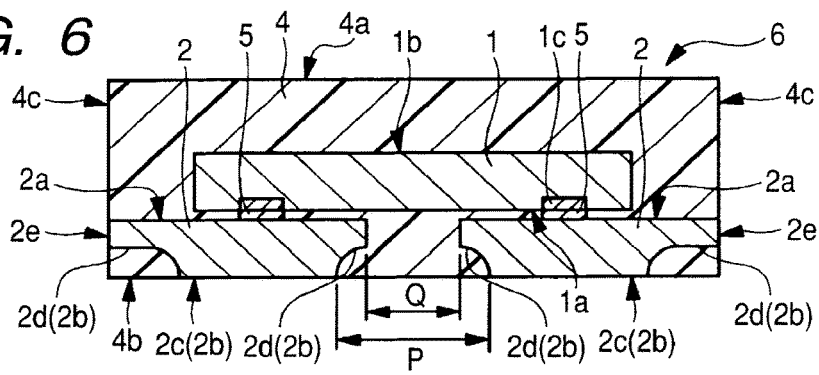
FIG. 6 is a sectional view illustrating an example of the structure cut along line A-A of FIG. 5.
Figure 7:
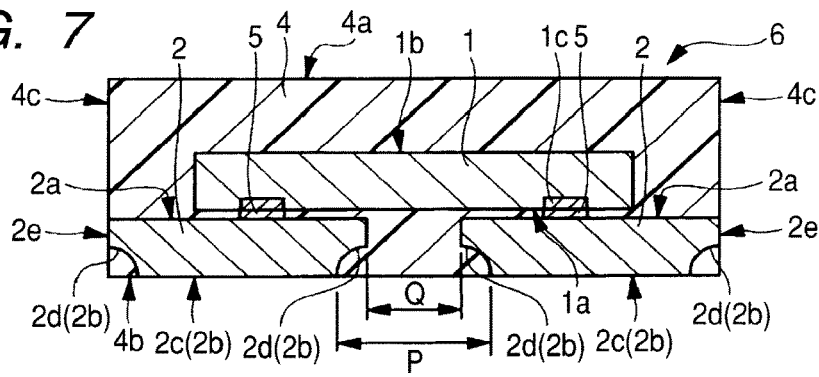
FIG. 7 is a sectional view illustrating an example of the structure cut along line B-B of FIG. 5.
Figure 8:
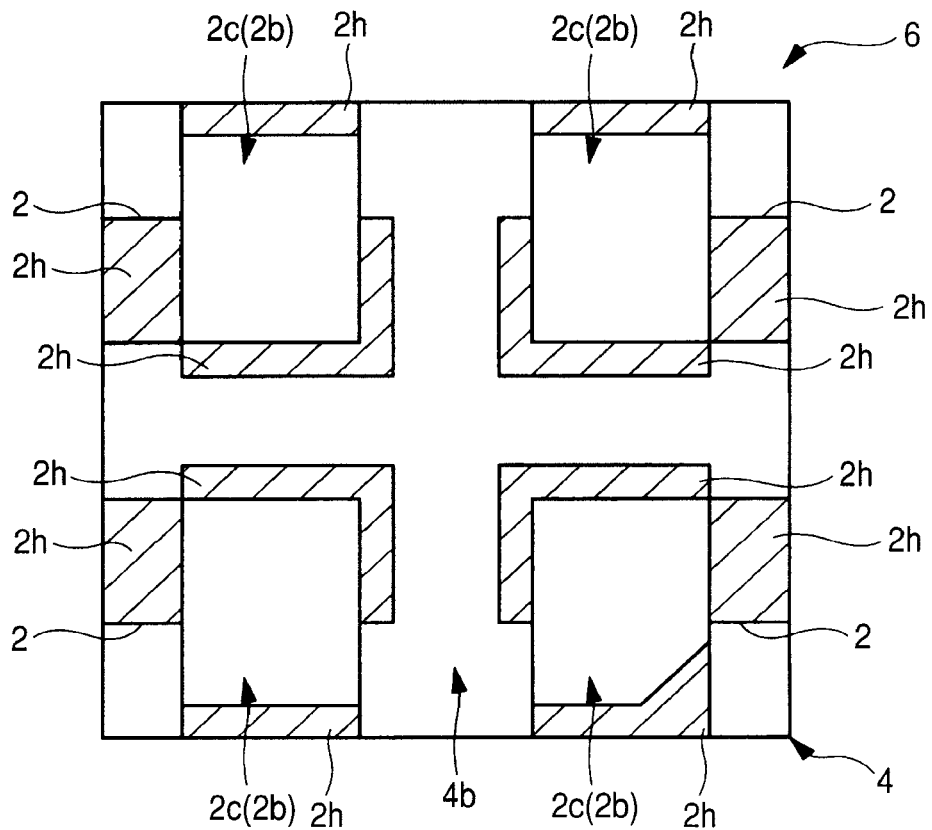
FIG. 8 is a plan view illustrating an example of half etching areas in the lead terminals of the semiconductor device illustrated in FIG. 1.
Figure 9:
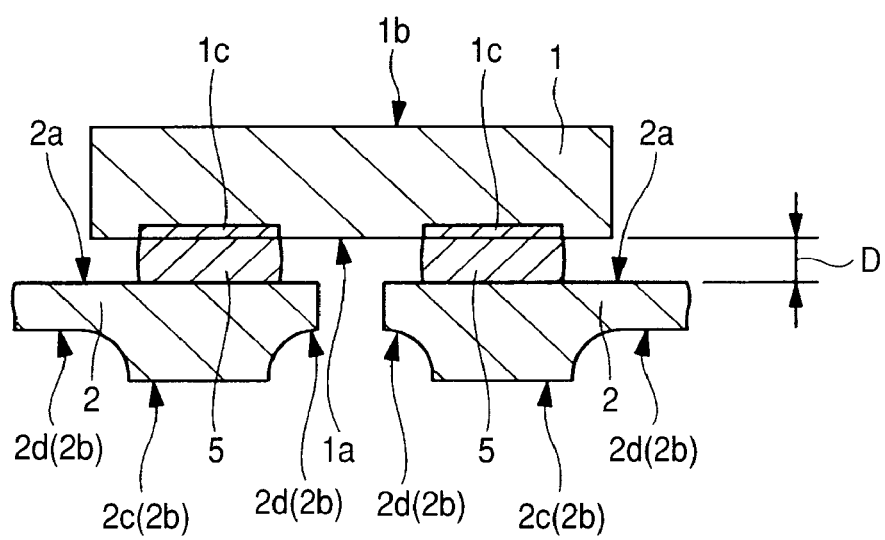
FIG. 9 is an enlarged partial sectional view illustrating an example of the structure of a flip chip bonded portion of the semiconductor device illustrated in FIG. 1.
Figure 10:
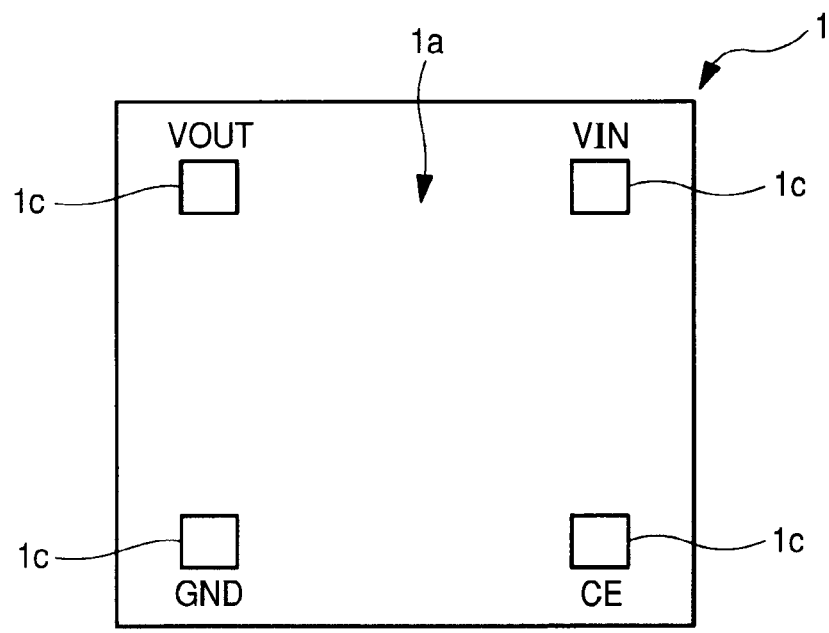
FIG. 10 is a plan view illustrating an example of a pin function in a semiconductor chip placed in the semiconductor device illustrated in FIG. 1.
Figure 11:
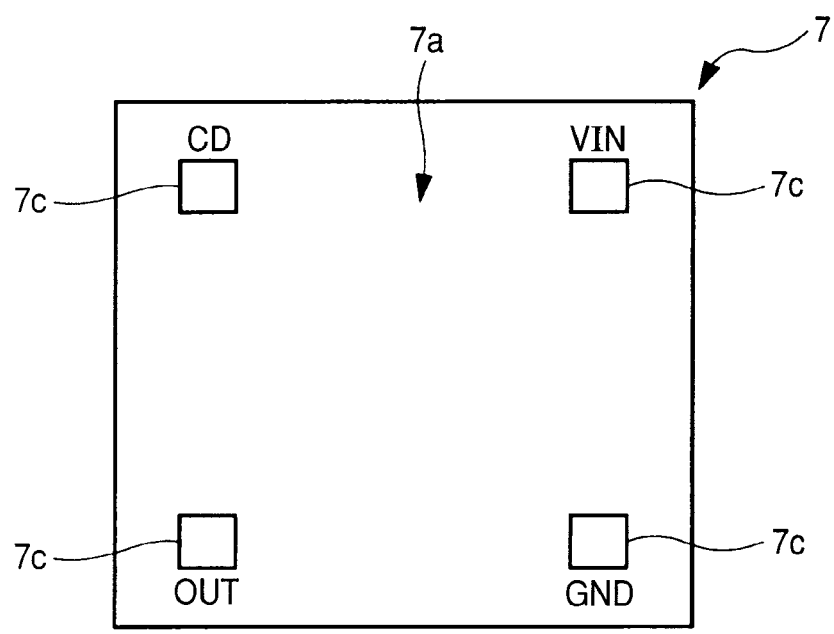
FIG. 11 is a plan view illustrating a pin function in a semiconductor chip in a modification placed in the semiconductor device illustrated in FIG. 1.

FIG. 1 is a plan view illustrating an example of the structure of a semiconductor device in the first embodiment of the invention; FIG. 2 is a side view illustrating an example of the structure of the semiconductor device illustrated in FIG. 1 as viewed from the direction A; FIG. 3 is a side view illustrating an example of the structure of the semiconductor device illustrated in FIG. 1 as viewed from the direction B; and FIG. 4 is a bottom view illustrating an example of the structure of the semiconductor device illustrated in FIG. 1 on the back surface side. FIG. 5 is a plan view illustrating an example of the structure of the semiconductor device illustrated in FIG. 1 as seen through a sealing body and a semiconductor chip; FIG. 6 is a sectional view illustrating an example of the structure cut along line A-A of FIG. 5; FIG. 7 is a sectional view illustrating an example of the structure cut along line B-B of FIG. 5; FIG. 8 is a plan view illustrating an example of half etching areas in the lead terminals of the semiconductor device illustrated in FIG. 1; and FIG. 9 is an enlarged partial sectional view illustrating an example of the structure of a flip chip bonded portion of the semiconductor device illustrated in FIG. 1. FIG. 10 is a plan view illustrating an example of a pin function in a semiconductor chip placed in the semiconductor device illustrated in FIG. 1; and FIG. 11 is a plan view illustrating a pin function in a semiconductor chip in a modification placed in the semiconductor device illustrated in FIG. 1.

The semiconductor device in the first embodiment adopts a small resin-sealed semiconductor package 6 assembled using a lead frame and in the back surface 4b of its sealing body 4, there are arranged multiple external terminals. The size of the semiconductor package 6 described in relation to the first embodiment is, for example, 1.0 mm×1.0 mm×0.35 mm (thickness).

Description will be given to the detailed configuration of the semiconductor package 6 in the first embodiment with reference to FIG. 1 to FIG. 7. The semiconductor package 6 includes: a semiconductor chip 1 having a main surface 1a with multiple electrode pads (terminals) 1c formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and the sealing body 4 having a main surface 4a and a back surface 4b located on the opposite side to the main surface 4a.

As illustrated in FIG. 4 and FIG. 5, the semiconductor package 6 in the first embodiment has four lead terminals 2. As illustrated in FIG. 6 and FIG. 7, each of the four lead terminals 2 has its upper surface 2a electrically coupled with a corresponding electrode pad 1c of the semiconductor chip 1 through a bump. In other words, the semiconductor chip 1 has four electrode pads 1c and these electrode pads 1c are respectively flip chip bonded to the four lead terminals 2 through bumps. The chief material of the bumps is, for example, gold. Therefore, the semiconductor chip 1 is flip chip bonded to the four lead terminals 2 through the gold bumps 5.

As illustrated in FIG. 6 and FIG. 7, the lower surface 2b of each of the four lead terminals 2 has: a first lower surface 2c exposed in the back surface 4b of the sealing body 4; and a second lower surface 2d positioned between the upper surface 2a and first lower surface 2c of the one of the four lead terminals 2 and arranged in the sealing body 4. The distance (lead thickness) from each upper surface 2a to the corresponding second lower surface 2d is shorter (thinner) than the distance (lead thickness) from the upper surface 2a to the corresponding first lower surface 2c. In the semiconductor package 6, the respective first lower surfaces 2c of the four lead terminals 2 are exposed in the back surface 4b of the sealing body 4; and the first lower surface 2c of each of the four lead terminals 2 makes an external terminal of the semiconductor device in the first embodiment.

The second lower surface 2d of each of the four lead terminals 2 is formed by half etching the back surface of the corresponding lead terminal 2. As illustrated in FIG. 6 and FIG. 7, in other words, each second lower surface 2d is formed by shaving the peripheral portion of the back surface of the corresponding lead terminal 2 by half etching. FIG. 8 shows the half etching areas of each lead terminal 2 as seen through the sealing body 4 from the back surface 4b side. In FIG. 8, the shaded areas indicate half etched portions 2h as areas subjected to half etching. In the half etched portions 2h of each lead terminal 2, therefore, the lead terminal 2 is reduced in thickness. The surfaces of the respective thinned areas of the lead terminals 2 facing toward the back surface 4b of the sealing body 4 are the second lower surfaces 2d illustrated in FIG. 6 and FIG. 7.

As mentioned above, the peripheral portion of the back surface of each lead terminal 2 is half etched. In each lead terminal 2, as a result, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface 2c).

Therefore, in the semiconductor package 6, as illustrated in FIG. 6 and FIG. 7, the following takes place as viewed in a plane: the distance P between adjacent first lower surfaces 2c of the four lead terminals 2 is longer than the distance Q between adjacent upper surfaces 2a thereof (P>Q). In the semiconductor device in the first embodiment illustrated in FIG. 6 and FIG. 7, the distance P is 0.24 mm or so and the distance Q is 0.14 to 0.16 mm or so. The distance P between adjacent first lower surfaces 2c of the four lead terminals 2 and the distance Q between adjacent upper surfaces 2a thereof are taken in the direction along the direction of arrangement of the four lead terminals 2. However, the relation of P>Q also holds in the distances in the directions of the diagonal lines of the four lead terminals 2.

Each of the four lead terminals 2 has two side surfaces 2e continuing into its upper surface 2a and second lower surface 2d. As illustrated in FIG. 2 and FIG. 3, two of eight side surfaces 2e in total are exposed in each of the four side surfaces 4c of the sealing body 4.

In each side surface 4c of the sealing body 4, part of the side surface 4c of the sealing body 4 is arranged around the exposed side surfaces 2e of each lead terminal 2. More specific description will be given to the exposed side surfaces 2e of each lead terminal 2. The peripheral portion of the back surface of each lead terminal 2 is shaven by half etching and formed in a recessed shape. Molding resin is filled so that the recessed portions (second lower surfaces 2d) are covered therewith. As a result, the exposed side surfaces 2e of each lead terminal 2 are encircled with part of the side surfaces 4c of the sealing body 4.

In each side surface 4c of the sealing body 4, as illustrated in FIG. 5, the distance M of adjacent side surfaces 2e of the four lead terminals 2 is longer than the distance L between adjacent upper surfaces 2a thereof (M>L). In the semiconductor device in the first embodiment, the distance M is 0.24 mm or so and the distance L is 0.14 to 0.16 mm or so.

Description will be given to the semiconductor chip 1 placed in the semiconductor package 6. The semiconductor chip 1 illustrated in FIG. 10 is, for example, a voltage regulator. The functions of the four electrode pads (terminals) 1c formed in the main surface 1a thereof are VOUT (output)), VIN (input: power supply), CE (chip enable), and GND (ground: earth).

The semiconductor chip 7 in a modification illustrated in FIG. 11 is, for example, a voltage detector. The functions of the four electrode pads (terminals) 7c formed in the main surface 7a thereof are CD (delay capacitor coupling terminal), VIN (input: power supply), GND (ground: earth), and OUT (output).

Description will be given to the distance between the main surface 1a of the semiconductor chip 1 flip chip bonded in the semiconductor package 6 and the upper surface 2a of each lead terminal 2. The distance between the main surface 1a of the semiconductor chip 1 and the upper surface 2a of each lead terminal 2 refers to the following distance: the distance D between the main surface 1a of the semiconductor chip 1 flip chip bonded to each lead terminal 2 through the gold bump 5 illustrated in FIG. 9 and the upper surface 2a of each lead terminal 2. It is equivalent to the height (stand-off) of each gold bump 5 after flip chip bonding. In the semiconductor package 6 in the first embodiment, the following distance is ensured as the distance between the main surface 1a of the semiconductor chip 1 and the upper surface 2a of each of the four lead terminals 2: a distance D sufficient to fill molding resin (sealing resin) between the semiconductor chip 1 and the lead terminals 2. In this example, a distance of 20 μm or above is ensured.

As a result, the area between the main surface 1a of the semiconductor chip 1 and the upper surface 2a of each of the four lead terminals 2 is filled with part of the sealing body 4 formed of molding resin.

In the semiconductor package 6, each lead terminal 2 is formed of, for example, copper alloy. The surface of each lead terminal 2 is totally plated with palladium (Pd). In more detail, each lead terminal 2 is plated upward from its surface with nickel (Ni), palladium (Pd), and gold (Au) in this order.

In place of total palladium (Pd) plating, each lead terminal 2 may be partially plated with Ag or the like. For example, only the area (flip chip bonding area) of the upper surface 2a of each lead terminal 2 where it overlaps with the semiconductor chip 1 is plated with Ag. As a result, portions of each lead terminal 2 exposed to the outside are not plated with Ag; therefore, the occurrence of Ag migration can be prevented.

The sealing body 4 is comprised of molding resin (sealing resin) such as thermosetting epoxy resin or the like and resin seals the semiconductor chip 1, four gold bumps 5, and part of each of the four lead terminals 2. In other words, the sealing body 4 resin seals the semiconductor chip 1 and the gold bumps 5 so that the first lower surface 2c of each lead terminal 2 is exposed from its back surface 4b.

Up to this point, description has been given to major features of the semiconductor device (semiconductor package 6) in the first embodiment. The following is a description of effects obtained by these features:

In the semiconductor device (semiconductor package 6) in the first embodiment, the following takes place: the distance between adjacent first lower surfaces 2c of the four lead terminals 2 exposed in the back surface 4b of the sealing body 4 is longer than the distance between adjacent upper surfaces 2a thereof. Semiconductor devices downsized to approximately 1.0 mm square, like one in the first embodiment, have such a structure that external terminals (adjacent first lower surfaces 2c of the lead terminals 2) are also very close to each other. (That external terminals are very close to each other is equivalent to that the pitch between terminals is very narrow.) This increases the risk that a solder bridge (electrical short-circuiting) will occur between terminals when the semiconductor device is solder mounted to a mounting board. For this reason, the production of a solder bridge during solder mounting can be suppressed by lengthening the distance (distance M) between adjacent first lower surfaces 2c of the four lead terminals 2 to be external terminals as much as possible.

Conversely, the distance (distance L) between adjacent upper surfaces 2a of the four lead terminals 2 is smaller (shorter) than the distance between adjacent first lower surfaces 2c on the back surface 4b side of the sealing body 4. The reason why this structure is adopted is to make it possible to place semiconductor chips 1 having various chip sizes (outside dimensions) over the upper surfaces 2a. If the distance L between adjacent upper surfaces 2a is carelessly extended, a semiconductor chip 1 whose sides are shorter than the distance L cannot be placed and this leads to the narrowed range of size of chips that can be placed. For this reason, shortening the distance (distance L) between adjacent upper surfaces 2a as much as possible is effective in placing a wide variety of chip sizes of semiconductor chips 1.

As mentioned above, the distance between adjacent first lower surfaces 2c of the four lead terminals 2 exposed in the back surface 4b of the sealing body 4 is longer than the distance between adjacent upper surfaces 2a thereof. (The distance between adjacent upper surfaces 2a of the four lead terminals 2 is shorter than the distance between adjacent first lower surfaces 2c thereof located on the back surface 4b side of the sealing body 4.) This achieves two things: suppression of the production of a solder bridge when the semiconductor device is solder mounted and expansion of the range of size of semiconductor chips that can be placed.

The structure in which the distance between adjacent first lower surfaces 2c and the distance between adjacent upper surfaces 2a are different from each other is obtained by half etching each lead terminal 2 (providing it with half etched portions 2h). The second lower surfaces 2d formed in the half etched portions 2h are arranged in the sealing body 4. Each lead terminal 2 can be thereby prevented from coming off in the direction of the thickness of the sealing body 4.

In each side surface 4c of the sealing body 4, the exposed side surfaces 2e of each lead terminal 2 have their entire circumference encircled with part (sealing resin, resin) of the side surface 4c of the sealing body 4. This makes it possible to prevent each lead terminal 2 from coming off also in the horizontal direction (lateral direction) relative to the sealing body 4. In each side surface 4c of the sealing body 4, the distance M between adjacent side surfaces 2e of the four lead terminals 2 is longer than the distance L between adjacent upper surfaces 2a thereof. This similarly produces the effect of preventing coming-off of each lead terminal 2 in the horizontal direction (lateral direction) relative to the sealing body 4.

In semiconductor packages 6 downsized to approximately 1.0 mm square like the semiconductor device in the first embodiment, the area of contact between each lead terminal 2 and the sealing body 4 is also very small. This reduces the force of adhesion of the sealing resin of the sealing body 4 to each lead terminal 2. For this reason, some above-mentioned features are effective in preventing each lead terminal 2 from coming off from the sealing body 4.

Figure 60:
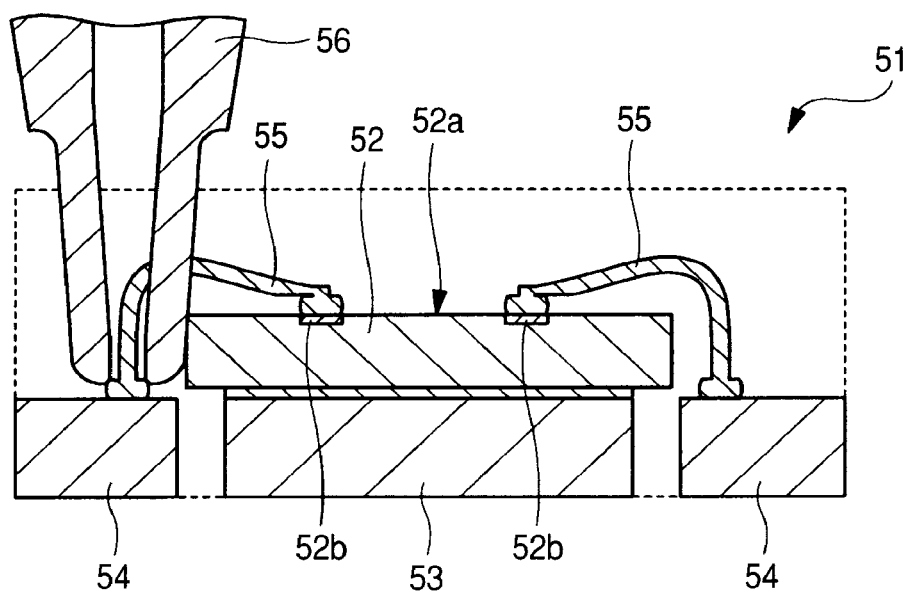
FIG. 60 is a sectional view illustrating the action of a capillary in wire bonding for a semiconductor device in a comparative example.

The semiconductor package 6 in the first embodiment adopts a flip chip bonding structure. In the flip chip bonding structure, a wire loop is not formed. Therefore, the thickness of the semiconductor package 6 can be reduced by an amount equivalent to wire loop height (wire height) as compared with the wire bonding coupling structure. In the flip chip bonding structure, a lead and a bump located under a semiconductor chip are bonded together in an area that planarly overlaps with the semiconductor chip. Unlike the wire bonding coupling structure, therefore, it is unnecessary to provide an area for bonding a wire and a lead terminal 2 together around the semiconductor chip. In the flip chip bonding structure, for this reason, the planar size (area) of the semiconductor package 6 can also be reduced as compared with the wire bonding coupling structure. Also as compared with a reverse bonding method with the wire bonding coupling structure, the flip chip bonding structure is superior in the respect described below. The reverse bonding method with the wire bonding coupling structure makes it possible to suppress increase in wire loop height. In this method, therefore, it is easier to reduce the thickness of a semiconductor device than in a normal bonding method. However, when leads are brought close to a chip in the direction of the plane of the semiconductor device for the purpose of downsizing, the problem described above arises. When a wire loop is formed, the capillary 56 and a chip edge begin to interfere with each other as in the comparative example in FIG. 60 and wire bonding cannot be carried out. For this reason, leads cannot be brought close to a chip beyond some degree and this imposes a restriction on reduction in the size of the semiconductor device 51.

For the above reason, the flip chip bonding structure is more advantageous than the wire bonding coupling structure to reduction of the size of a semiconductor package.

In the semiconductor package 6 in the first embodiment, as illustrated in FIG. 9, a distance of 20 μm or above is ensured as the following distance: the distance D between the main surface 1a of the semiconductor chip 1 and the upper surface 2a of each of the four lead terminal 2. Molding resin (sealing resin) is filled in the gap between the semiconductor chip 1 and the lead terminal 2. The result of investigation conducted by the present inventors revealed that the following took place if the distance D between the main surface 1a of the semiconductor chip 1 and the upper surface 2a of each of the four lead terminal 2 is less than 20 µm: sealing resin does not sufficiently spread in the gap and a resin void (air bubble) can be produced. This resin void highly probably leads to the occurrence of package cracking. If moisture collects in this resin void, the following takes place when the semiconductor device (semiconductor package 6) is solder mounted to a mounting board: the volume of the moisture in the void is expanded by heat from solder reflow and the sealing body 4 is broken by the resulting force. This is the generating mechanism of package cracking. To prevent this, it is required to closely fill the gap between the semiconductor chip 1 and the lead terminals 2 with molding resin. As the material for filling the gap between the semiconductor chip 1 and the lead terminals 2, underfill (liquid resin) of the same thermosetting epoxy resin as the molding resin and the like may be used. The underfill is higher in flowability than the molding resin. With use of the underfill, therefore, the gap between the semiconductor chip 1 and the lead terminals 2 can be closely filled even though the distance D is narrower than 20 µm.

However, the following measure is more advantageous to reduce the cost of the entire semiconductor device in consideration of the material cost of the underfill and the necessity for a step for applying underfill aside from a step for forming the sealing body 4: underfill is not adopted and the gap between the semiconductor chip 1 and the lead terminals 2 is filled with the molding resin for forming the sealing body 4 at the same time as the formation of the sealing body 4. For the above reason, the semiconductor device (semiconductor package 6) in the first embodiment adopts a structure in which the following is implemented: a distance of 20 µm or above is ensured as the distance D between the main surface 1a of the semiconductor chip 1 and the upper surface 2a of each of the four lead terminals 2; and the gap between the semiconductor chip 1 and the lead terminals 2 is filled with molding resin.

The major features described up to this point make it possible to reduce the size and thickness of the semiconductor package 6 and further enhance the reliability of the semiconductor package 6.

(Second Embodiment)

Figure 12:
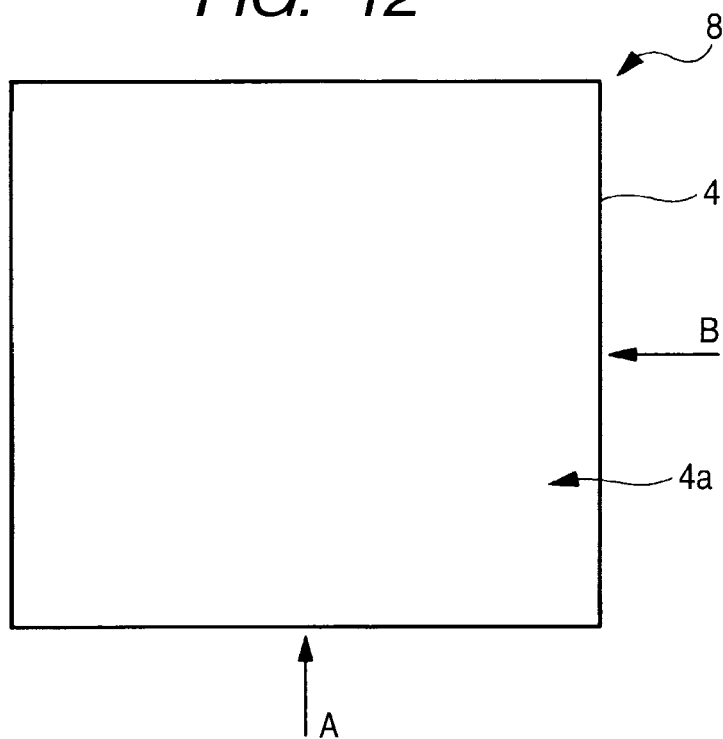
FIG. 12 is a plan view illustrating an example of the structure of a semiconductor device in a second embodiment of the invention.
Figure 13:
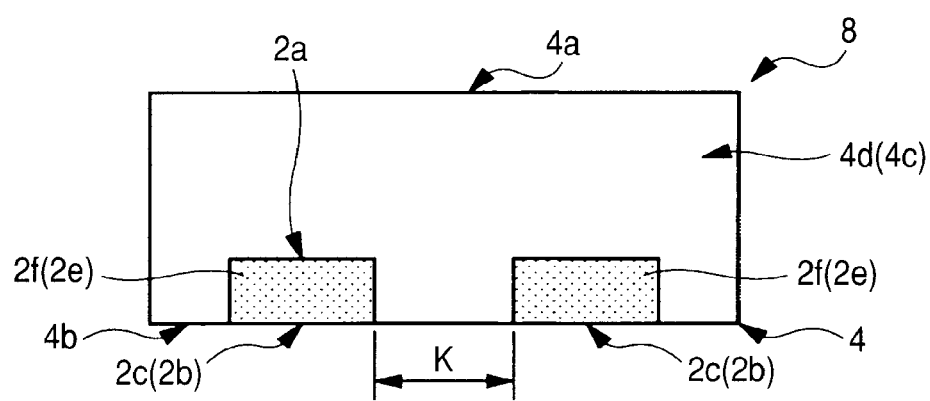
FIG. 13 is a side view illustrating an example of the structure of the semiconductor device illustrated in FIG. 12 as viewed from the direction A.
Figure 14:
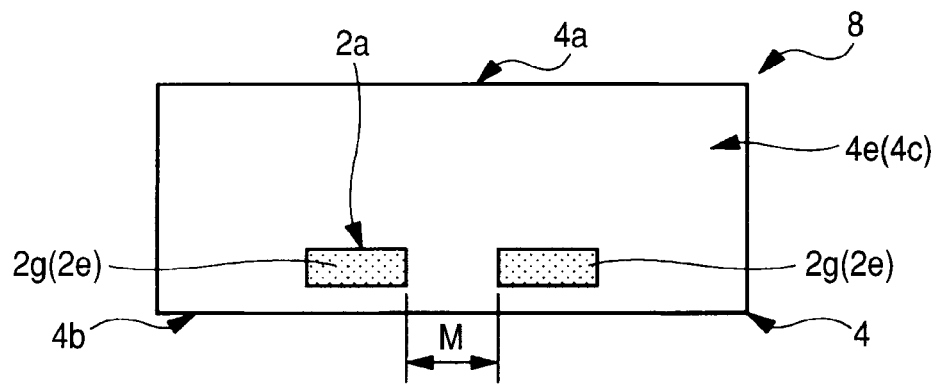
FIG. 14 is a side view illustrating an example of the structure of the semiconductor device illustrated in FIG. 12 as viewed from the direction B.
Figure 15:
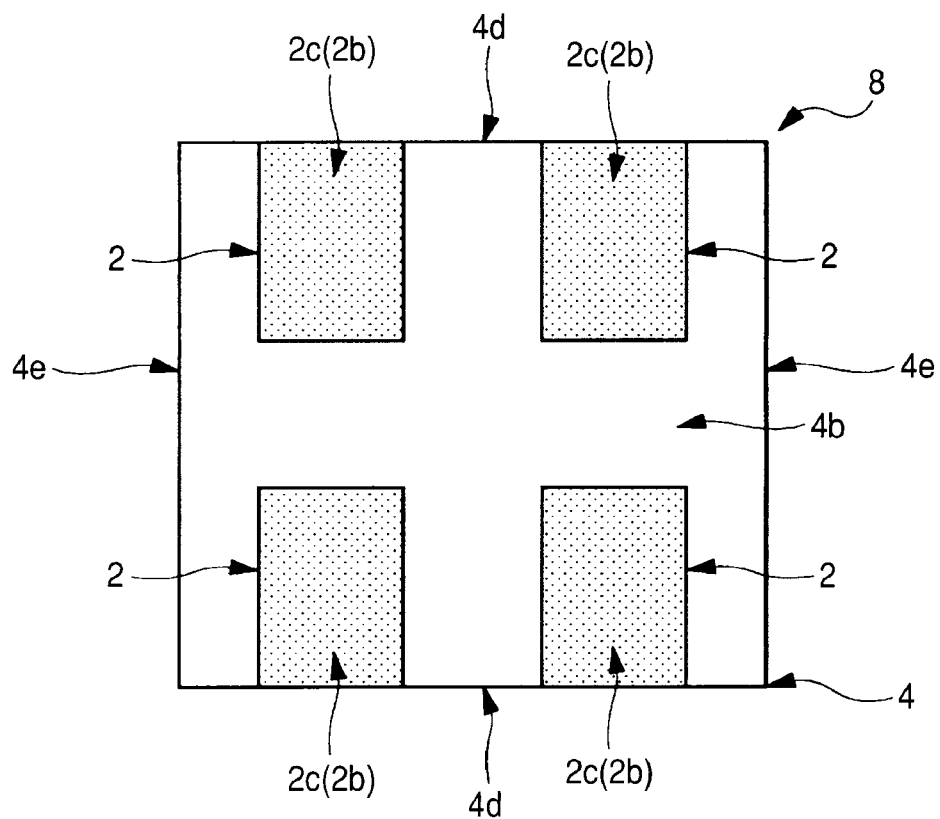
FIG. 15 is a bottom view illustrating an example of the structure of the semiconductor device illustrated in FIG. 12 on the back surface side.
Figure 16:
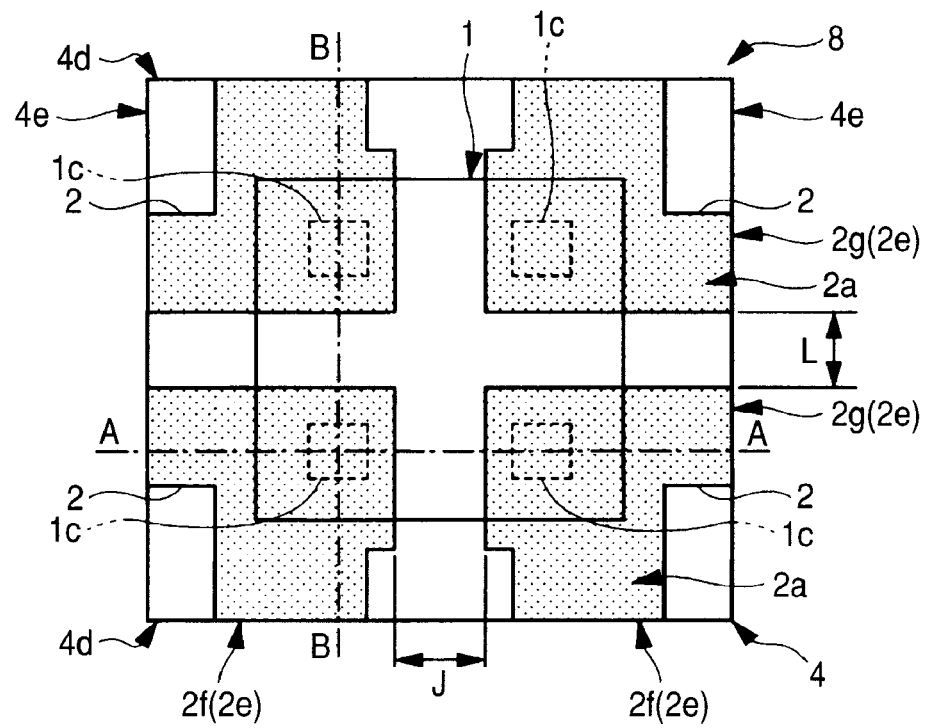
FIG. 16 is a plan view illustrating an example of the structure of the semiconductor device illustrated in FIG. 12 as seen through a sealing body and a semiconductor chip.
Figure 17:
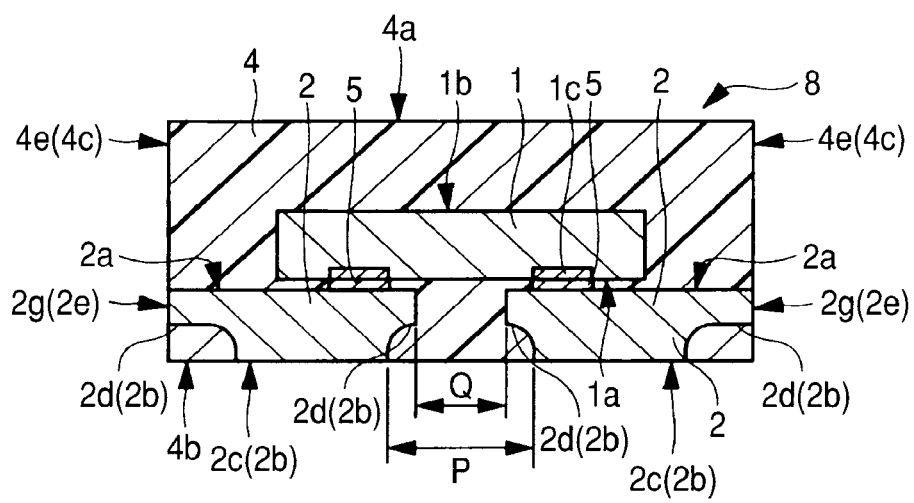
FIG. 17 is a sectional view illustrating an example of the structure cut along line A-A of FIG. 16.
Figure 18:
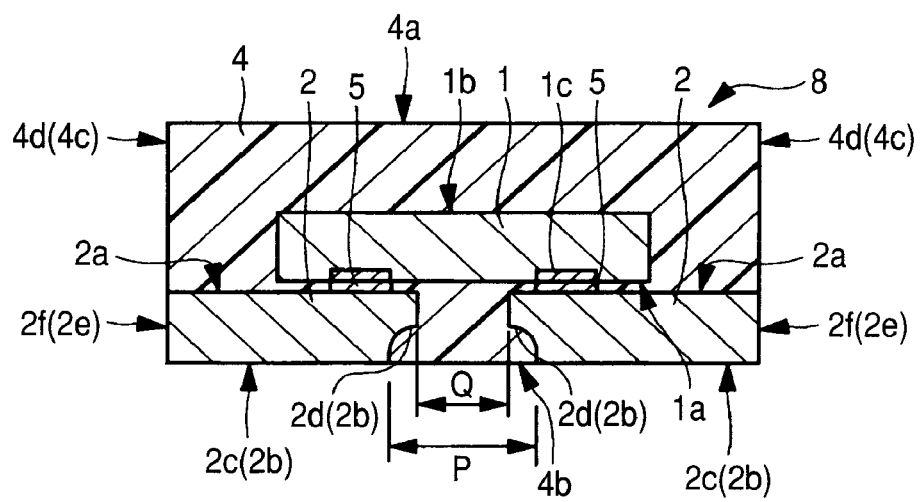
FIG. 18 is a sectional view illustrating an example of the structure cut along line B-B of FIG. 16.
Figure 19:
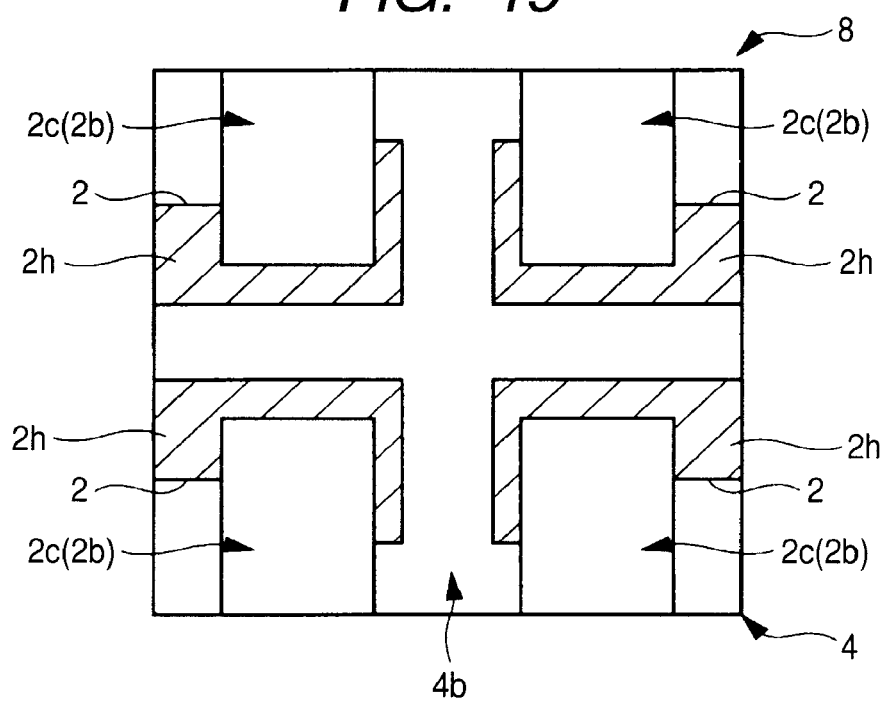
FIG. 19 is a plan view illustrating an example of half etching areas in the lead terminals of the semiconductor device illustrated in FIG. 12.
Figure 20:
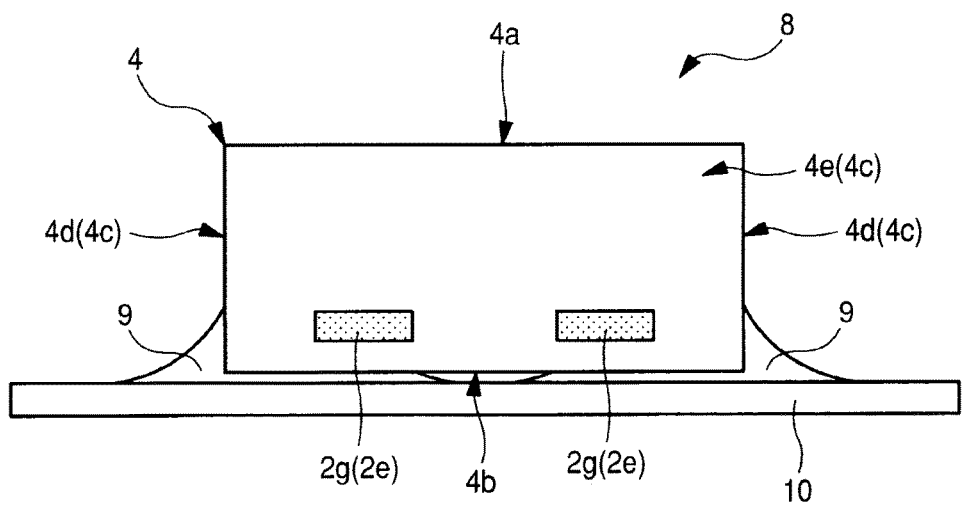
FIG. 20 is a side view illustrating an example of the mounting structure of the semiconductor device illustrated in FIG. 12.
Figure 21:
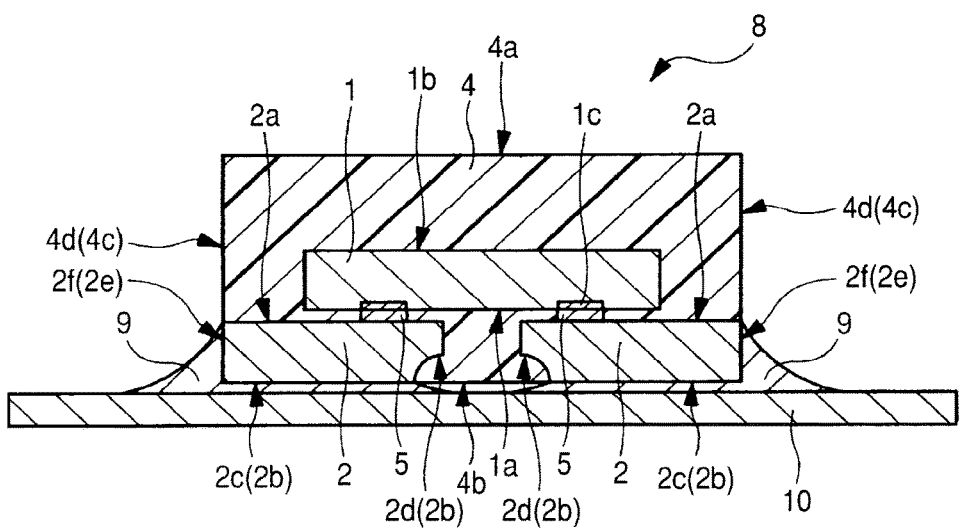
FIG. 21 is a sectional view illustrating an example of the mounting structure of the semiconductor device illustrated in FIG. 20.

FIG. 12 is a plan view illustrating an example of the structure of a semiconductor device in the second embodiment of the invention; FIG. 13 is a side view illustrating an example of the structure of the semiconductor device illustrated in FIG. 12 as viewed from the direction A; FIG. 14 is a side view illustrating an example of the structure of the semiconductor device illustrated in FIG. 12 as viewed from the direction B; FIG. 15 is a bottom view illustrating an example of the structure of the semiconductor device illustrated in FIG. 12 on the back surface side; and FIG. 16 is a plan view illustrating an example of the structure of the semiconductor device illustrated in FIG. 12 as seen through a sealing body and a semiconductor chip. FIG. 17 is a sectional view illustrating an example of the structure cut along line A-A of FIG. 16; FIG. 18 is a sectional view illustrating an example of the structure cut along line B-B of FIG. 16; FIG. 19 is a plan view illustrating an example of half etching areas in the lead terminals of the semiconductor device illustrated in FIG. 12; FIG. 20 is a side view illustrating an example of the mounting structure of the semiconductor device illustrated in FIG. 12; and FIG. 21 is a sectional view illustrating an example of the mounting structure of the semiconductor device illustrated in FIG. 20.

The semiconductor device in the second embodiment is a small resin-sealed semiconductor package 8 assembled using a lead frame like the semiconductor package 6 in the first embodiment. It has substantially the same structure as that of the semiconductor package 6 in the first embodiment and is further reduced in size than the semiconductor package 6. The size of the semiconductor package 8 described in relation to the second embodiment is, for example, 0.8 mm×0.8 mm×0.35 mm (thickness).

Description will be given to the detailed configuration of the semiconductor package 8 in the second embodiment with reference to FIG. 12 to FIG. 18. The semiconductor package 8 includes: a semiconductor chip 1 having a main surface 1a with multiple electrode pads (terminals) 1c formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and a sealing body 4 having a main surface 4a and a back surface 4b located on the opposite side to the main surface 4a.

As illustrated in FIG. 15 and FIG. 16, the semiconductor package 8 also has four lead terminals 2. As illustrated in FIG. 17 and FIG. 18, each of the four lead terminals 2 has its upper surface 2a electrically coupled with a corresponding electrode pad 1c of the semiconductor chip 1 through a bump. That is, the semiconductor chip 1 is flip chip bonded to the four lead terminals 2 through multiple bumps. The chief material of the bumps is, for example, gold. Therefore, the semiconductor chip 1 is flip chip bonded to the four lead terminals 2 through the gold bumps 5.

As illustrated in FIG. 17 and FIG. 18, the lower surface 2b of each of the four lead terminals 2 has: a first lower surface 2c exposed in the back surface 4b of the sealing body 4; and a second lower surface 2d positioned between the upper surface 2a and first lower surface 2c of the one of the four lead terminals 2 and arranged in the sealing body 4. The distance (lead thickness) from each upper surface 2a to the corresponding second lower surface 2d is shorter (thinner) than the distance (lead thickness) from the upper surface 2a to the corresponding first lower surface 2c.

More specific description will be given. Also in the semiconductor package 8, the respective first lower surfaces 2c of the four lead terminals 2 are exposed in the back surface 4b of the sealing body 4; and the first lower surface 2c of each of the four lead terminals 2 makes an external terminal of the semiconductor device in the second embodiment.

The second lower surface 2d of each of the four lead terminals 2 is formed by half etching the back surface of the corresponding lead terminal 2. As illustrated in FIG. 17 and FIG. 18, each second lower surface 2d is formed by shaving the peripheral portion of the back surface of the corresponding lead terminal 2 by half etching. FIG. 19 shows the half etching areas of each lead terminal 2 as seen through the sealing body 4 from the back surface 4b side. In FIG. 19, the shaded areas indicate half etched portions 2h as areas subjected to half etching. In the half etched portion 2h of each lead terminal 2, therefore, the lead terminal 2 is reduced in thickness. The surfaces of the respective thinned areas of the lead terminals 2 facing toward the back surface 4b of the sealing body 4 are the second lower surfaces 2d.

As mentioned above, the peripheral portion of the back surface of each lead terminal 2 is half etched. In each lead terminal 2, as a result, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface 2c).

Therefore, also in the semiconductor package 8 in the second embodiment, as illustrated in FIG. 17 and FIG. 18, the following takes place as viewed in a plane: the distance P between adjacent first lower surfaces 2c of the four lead terminals 2 is longer than the distance Q between adjacent upper surfaces 2a thereof (P>Q). In the semiconductor device in the second embodiment illustrated in FIG. 17 and FIG. 18, the distance P is 0.20 mm or so and the distance Q is 0.10 to 0.12 mm or so. The distance P between adjacent first lower surfaces 2c of the four lead terminals 2 and the distance Q between adjacent upper surface 2a thereof are taken in the direction along the direction of arrangement of the four lead terminals 2. However, the relation of P>Q also holds in the distances in the directions of the diagonal lines of the four lead terminals 2.

In the semiconductor package 8, as illustrated in FIG. 13, each of the four lead terminals 2 has two side surfaces 2e including a first side surface 2f continuing into its upper surface 2a and first lower surface 2c. Further, the sealing body 4 has four side surfaces 4c including two first side surface 4d continuing into its main surface 4a and back surface 4b. In the first side surfaces 4d and back surface 4b of the sealing body 4, as illustrated in FIG. 13 and FIG. 15, the first side surface 2f and first lower surface 2c of each of the four lead terminals 2 are exposed as coupled to each other.

As illustrated in FIG. 14, each of the four lead terminals 2 has a second side surface 2g continuing into its upper surface 2a and second lower surface 2d. Further, the sealing body 4 has two second side surfaces 4e continuing into its main surface 4a and back surface 4b and intersecting with the first side surfaces 4d. The respective second side surfaces 2g of the four lead terminals 2 are exposed in the two second side surfaces 4e of the sealing body 4.

In each second side surface 4e of the sealing body 4, part of the second side surfaces 4e of the sealing body 4 is arranged around the respective second side surfaces 2g of the four lead terminals 2 including both their sides. More specific description will be given. In the two second side surfaces 4e of the sealing body 4, the peripheral portion of the back surface of each lead terminal 2 is shaven by half etching and formed in a recessed shape. Molding resin is filled so that the recessed portions (second lower surfaces 2d) are covered therewith. As a result, the exposed second side surface 2g of each lead terminal 2 is encircled with part (molding resin) of the second side surfaces 4e of the sealing body 4.

In the semiconductor package 8, as illustrated in FIG. 13 and FIG. 16, the following measure is taken in each first side surface 4d of the sealing body 4: the distance K between adjacent first side surfaces 2f of the lead terminals 2 is made longer than the distance J between adjacent upper surfaces 2a thereof (K>J). In the semiconductor device in the second embodiment, the distance K is 0.20 mm or so and the distance J is 0.10 mm or so.

Meanwhile, in each second side surface 4e of the sealing body 4, as illustrated in FIG. 14 and FIG. 16, the following measure is taken: the distance M between adjacent second side surfaces 2g of the lead terminals 2 and the distance L between adjacent upper surfaces 2a thereof are made equal to each other (L=M). In the semiconductor device in the second embodiment, the distance M and the distance L are 0.12 mm or so.

The semiconductor package 8 in the second embodiment is equivalent to the semiconductor package 6 in the first embodiment whose size is further reduced. Therefore, the area of the first lower surface 2c of each of the four lead terminals 2 as external terminals exposed in the back surface 4b of the sealing body 4 is also reduced. As a result, there is a possibility that when the semiconductor package 8 is solder mounted to a mounting board, the strength of junction with solder is reduced. As a measure for ensuring the strength of junction with solder, therefore, the first lower surfaces 2c and first side surfaces 2f of the lead terminals 2 are exposed so that the following is implemented: the first lower surfaces 2c continue into the first side surfaces 2f from the back surface 4b to the first side surfaces 4d of the sealing body 4.

As the result of adoption of this structure, the following is implemented when the semiconductor package 8 is solder mounted to the mounting board 10: a solder fillet 9 is formed to the height of the first side surfaces 2f as illustrated in FIG. 20 and FIG. 21. This makes it possible to enhance the mounting strength of the semiconductor package 8. Even though the size of the semiconductor package 8 is reduced, the terminal area contributing to solder junction can be increased by taking the following measure: the side surface 2e and back surface (lower surface 2b) of each terminal are exposed so that the side surface continues into the back surface from the side surface to the back surface of the semiconductor package. As a result, a large area of junction with solder can be ensured and thus the mounting strength of the semiconductor package 8 can be enhanced.

In each first side surface 4d of the sealing body 4, as mentioned above, part of the first side surface 4d of the sealing body 4 is arranged on both sides of the first side surface 2f of each lead terminal 2. This makes it possible to prevent each lead terminal 2 from coming off in the horizontal direction (lateral direction) relative to the sealing body 4.

In each second side surface 4e of the sealing body 4, part of the second side surface 4e of the sealing body 4 is arranged around the second side surface 2g of each lead terminal 2. That is, the second side surface 2g of each lead terminal 2 is encircled with the molding resin (sealing resin) of the sealing body 4. Therefore, it is possible to prevent each lead terminal 2 from coming off both in the horizontal direction (lateral direction) and in the height direction relative to the sealing body 4. As a result, the reliability of the semiconductor package 8 can be enhanced.

The other respects in the structure of and the other effects of the semiconductor package 8 in the second embodiment are the same as those of the semiconductor package 6 of the first embodiment and description thereof will be omitted.

(Third Embodiment)

Figure 22:
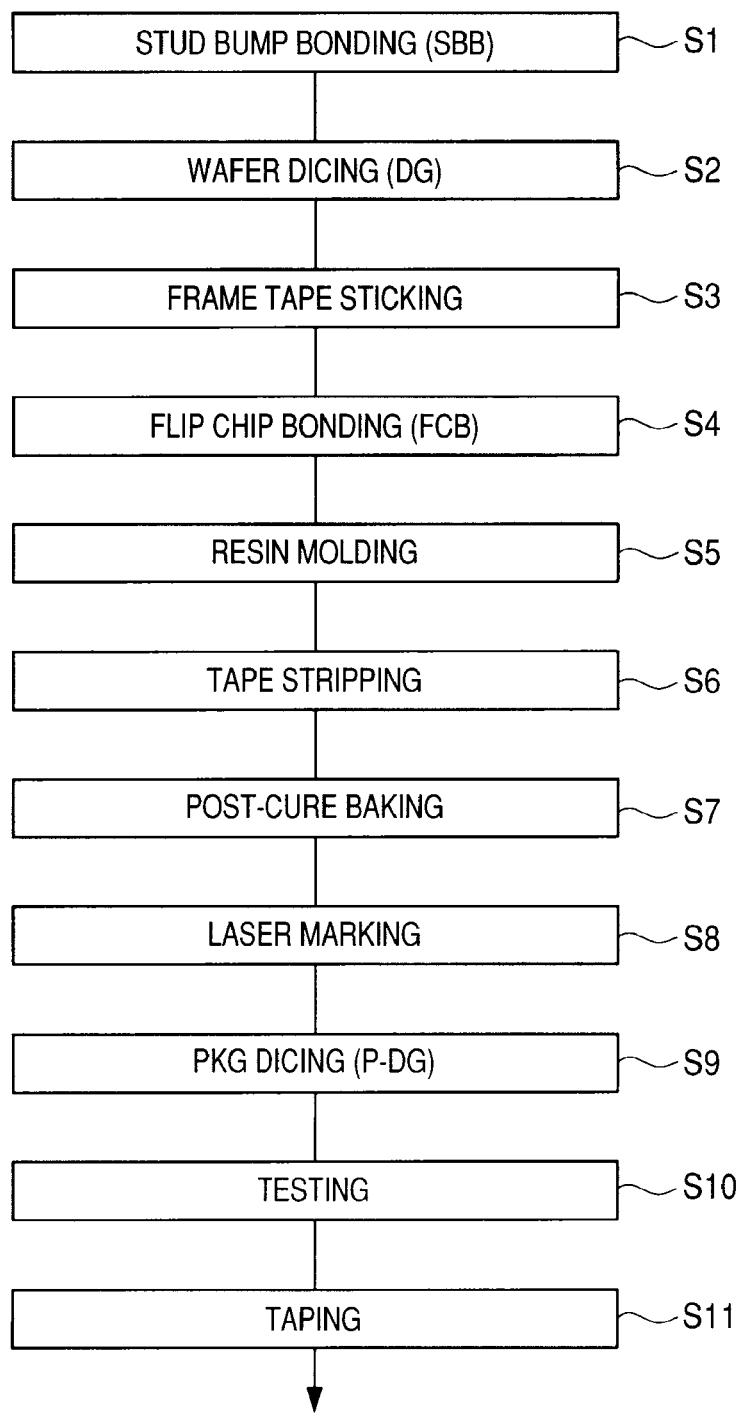
FIG. 22 is a manufacturing flowchart illustrating an example of the assembling procedure for a semiconductor device in a third embodiment of the invention.
Figure 23:
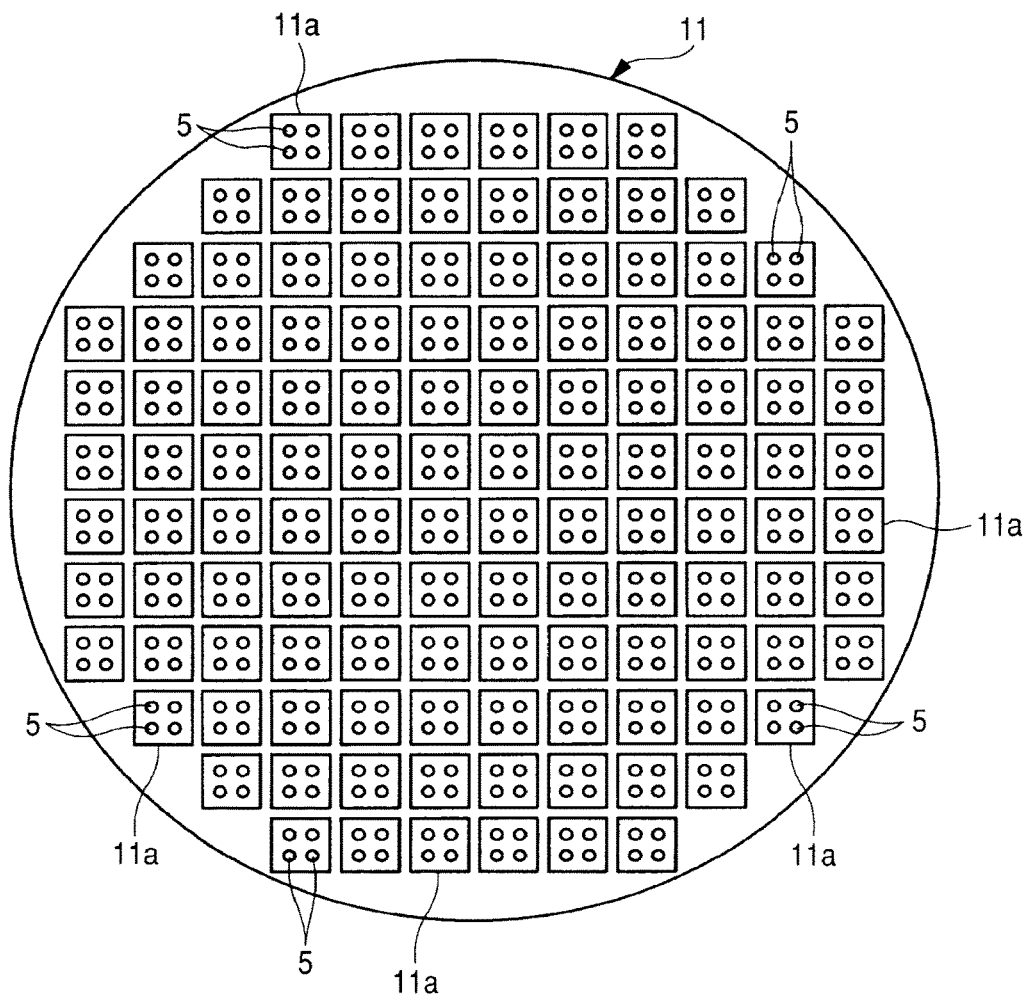
FIG. 23 is a plan view illustrating an example of the structure after stud bump bonding in the assembly of the semiconductor device in FIG. 22.
Figure 24:
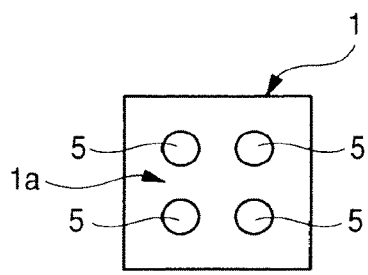
FIG. 24 is a plan view illustrating an example of the structure after wafer dicing in the assembly of the semiconductor device in FIG. 22.
Figure 25:
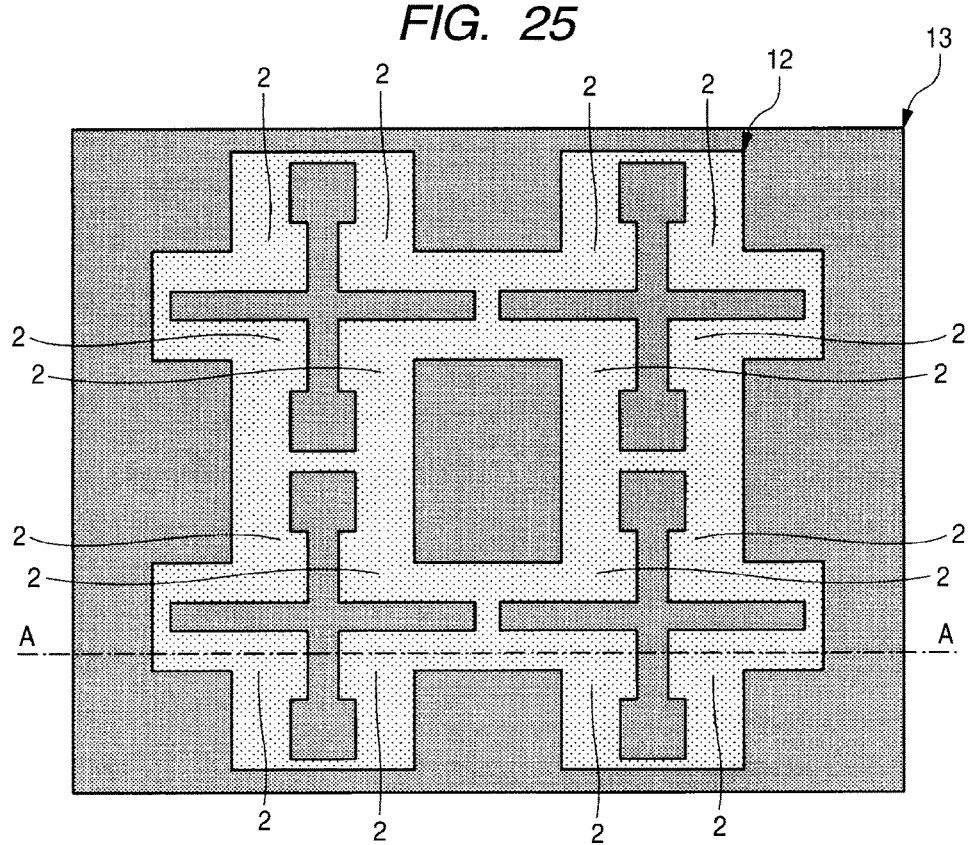
FIG. 25 is a plan view illustrating an example of the structure after frame tape sticking in the assembly of the semiconductor device in FIG. 22.
Figure 26:
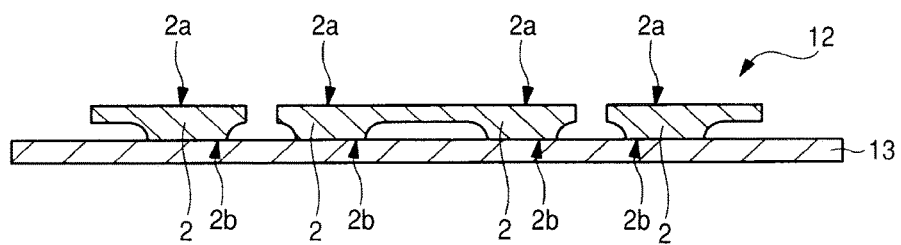
FIG. 26 is a sectional view illustrating an example of the structure cut along line A-A of FIG. 25.
Figure 27:
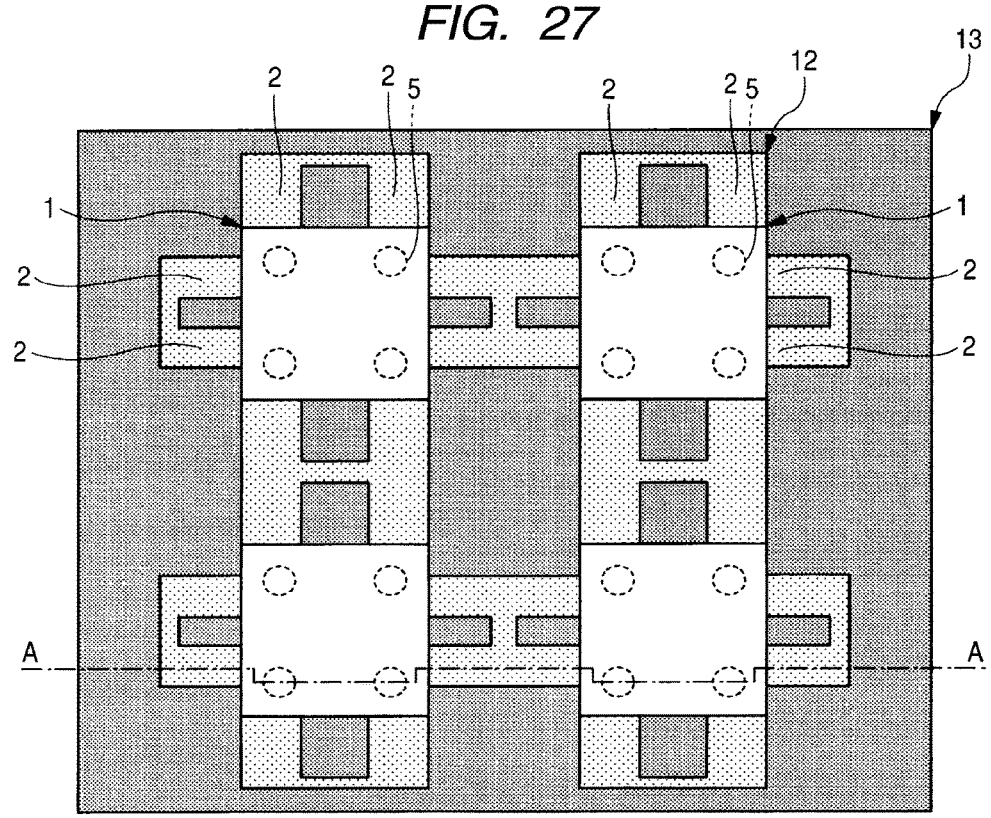
FIG. 27 is a plan view illustrating an example of the structure after flip chip bonding in the assembly of the semiconductor device in FIG. 22.
Figure 28:
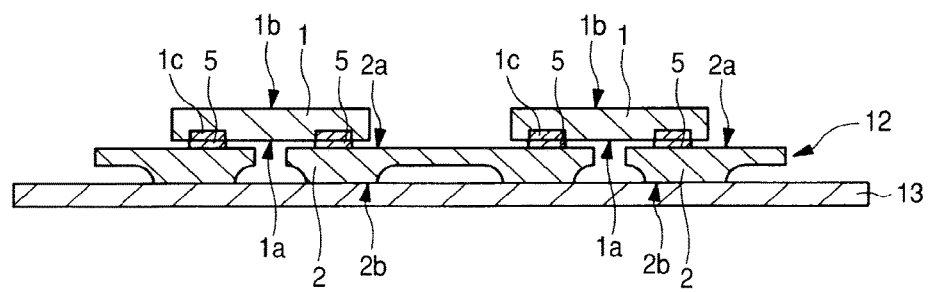
FIG. 28 is a sectional view illustrating an example of the structure cut along line A-A of FIG. 27.
Figure 29:
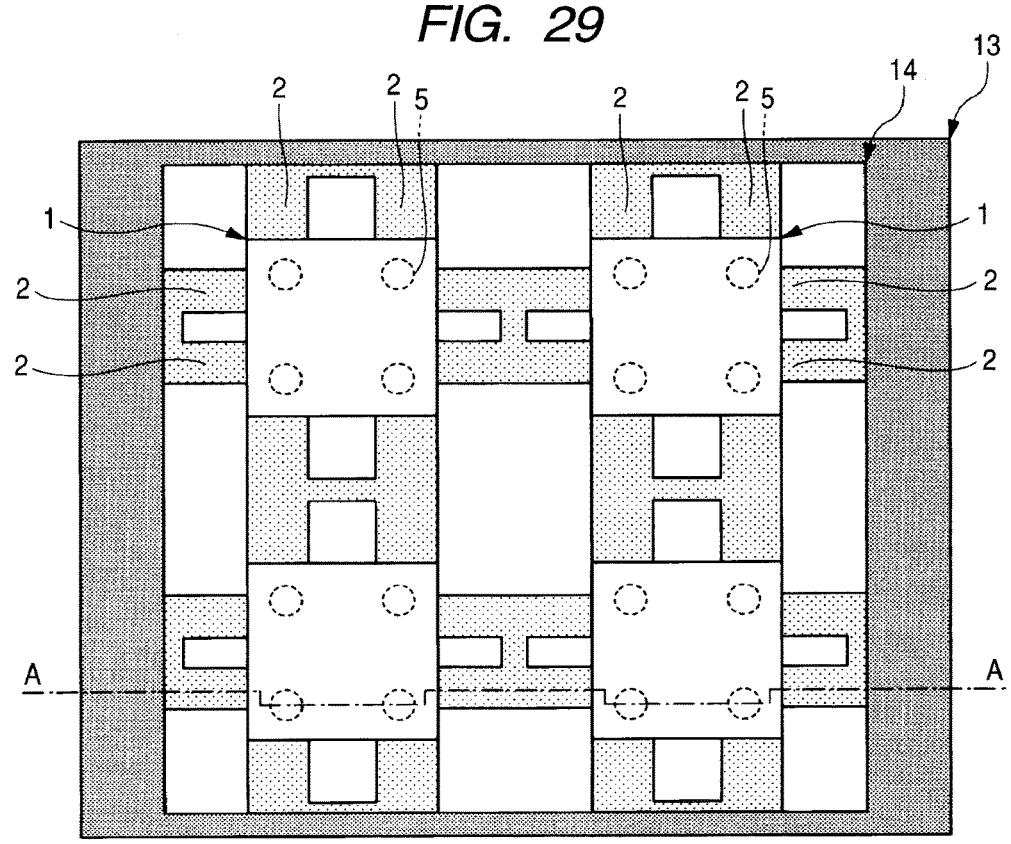
FIG. 29 is a plan view illustrating an example of the structure after resin molding in the assembly of the semiconductor device in FIG. 22.
Figure 30:
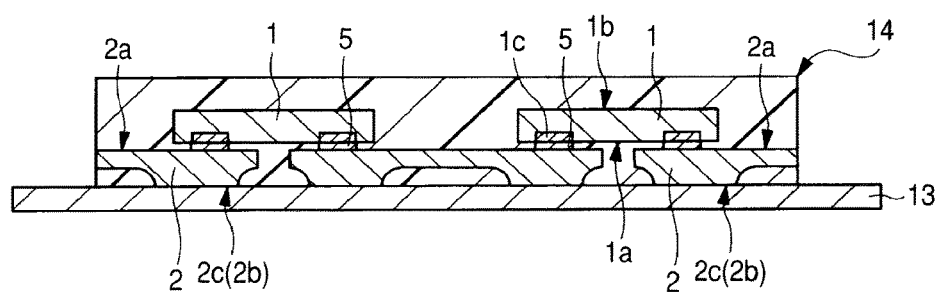
FIG. 30 is a sectional view illustrating an example of the structure cut along line A-A of FIG. 29.
Figure 31:
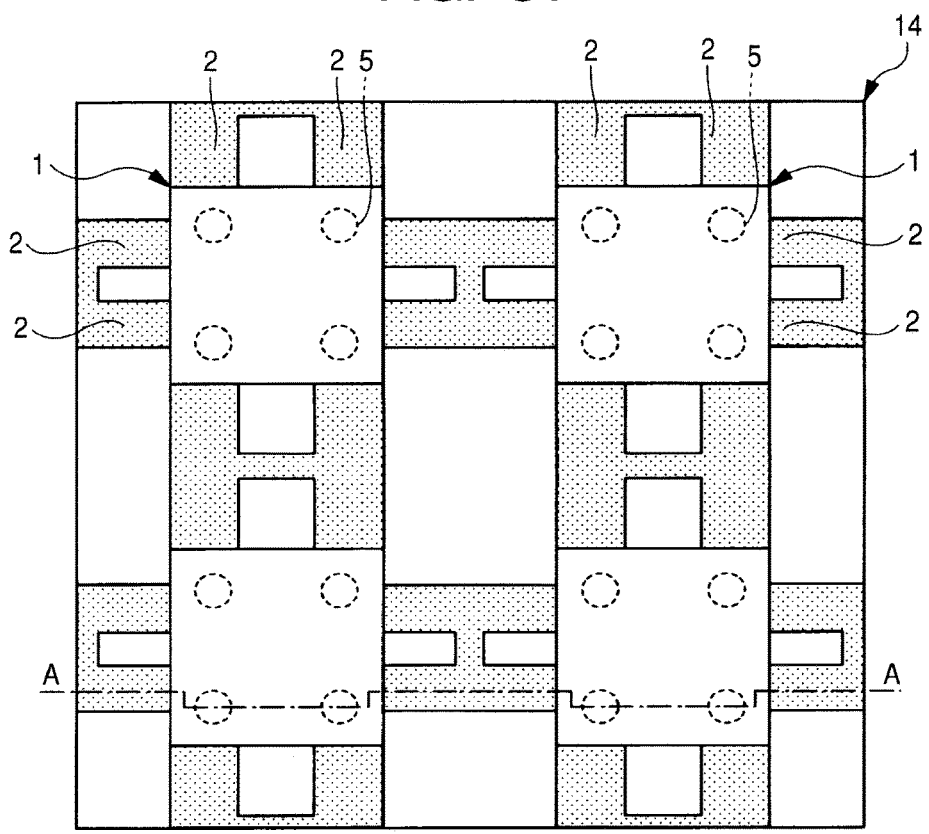
FIG. 31 is a plan view illustrating an example of the structure after tape stripping in the assembly of the semiconductor device in FIG. 22.
Figure 32:
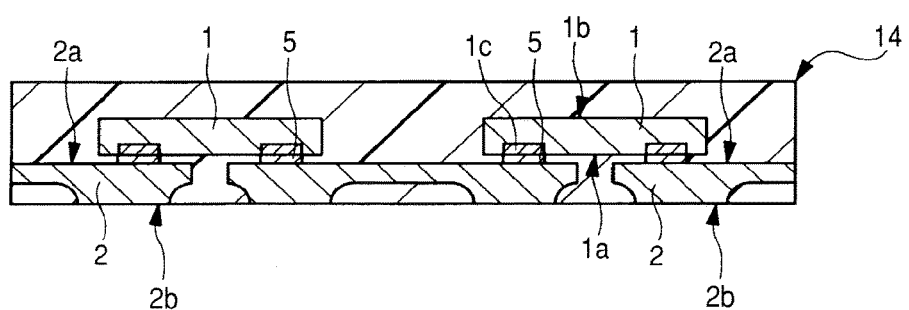
FIG. 32 is a sectional view illustrating an example of the structure cut along line A-A of FIG. 31.
Figure 33:
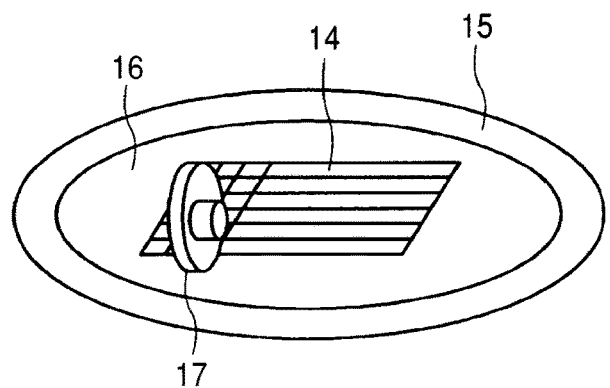
FIG. 33 is a perspective view illustrating an example of the state of PKG dicing in the assembly of the semiconductor device in FIG. 22.
Figure 34:
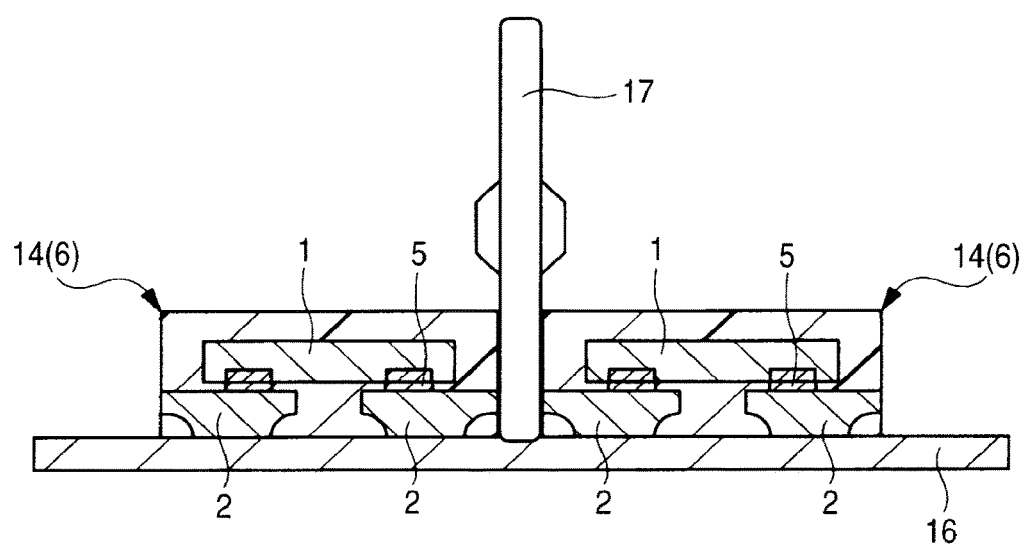
FIG. 34 is a sectional view illustrating an example of the detailed structure during the PKG dicing illustrated in FIG. 33.
Figure 35:
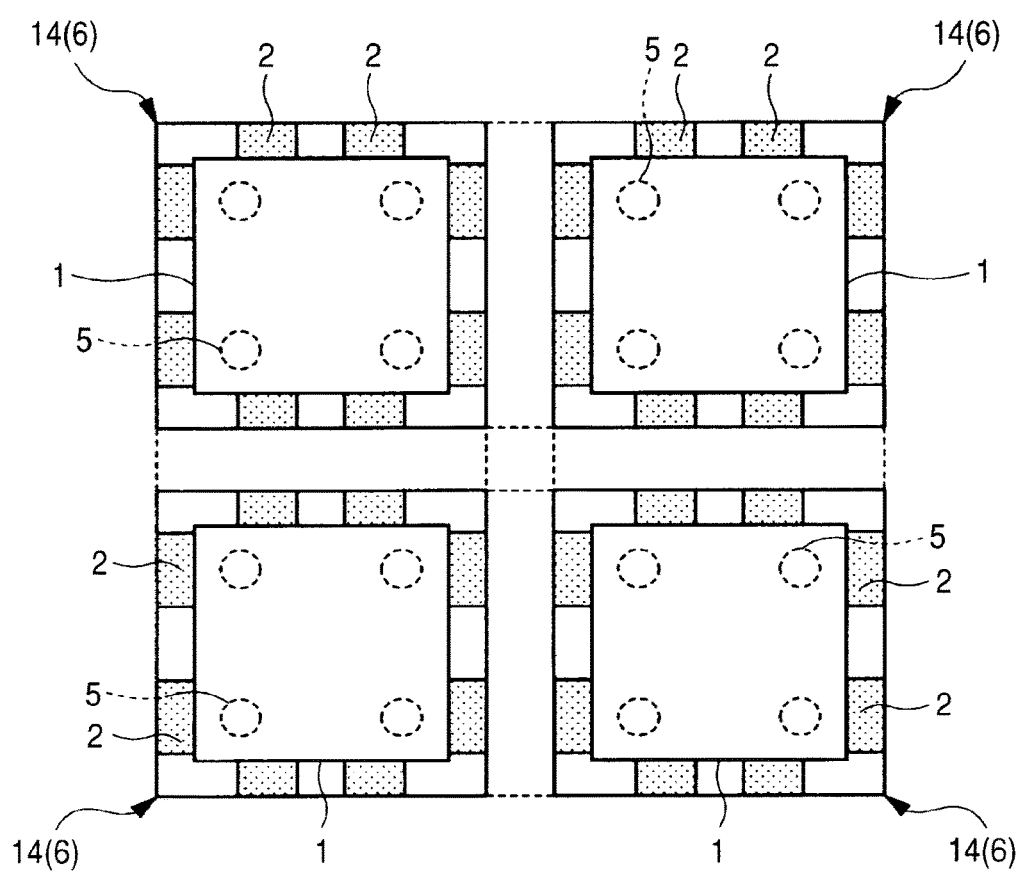
FIG. 35 is a plan view illustrating an example of the structure after the PKG dicing illustrated in FIG. 34.
Figure 36:
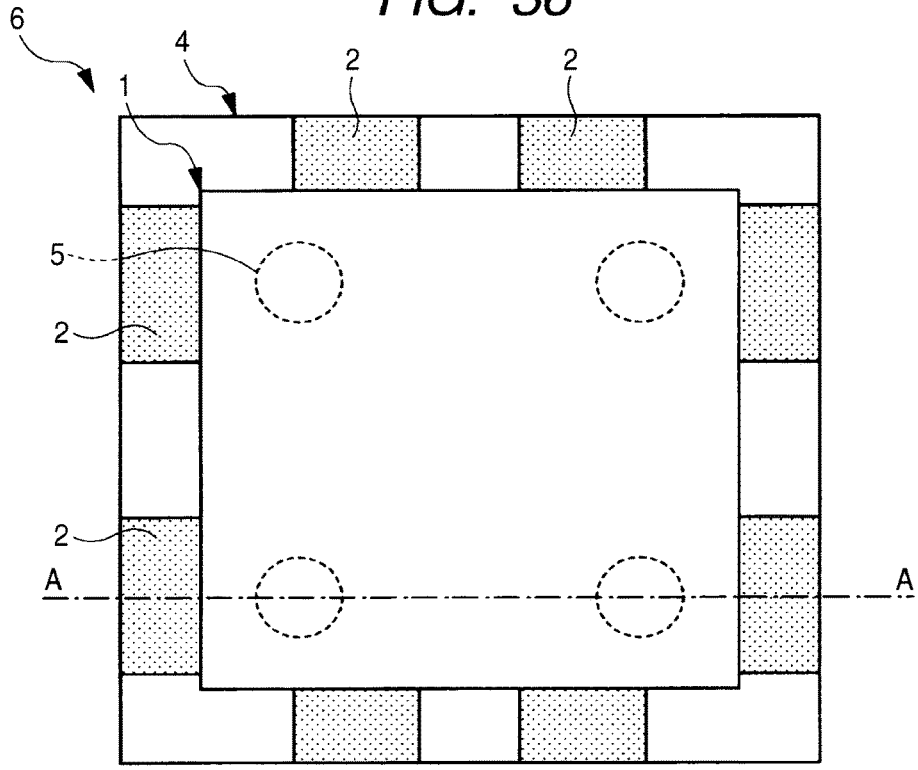
FIG. 36 is a plan view illustrating an example of the structure after testing and taping in the assembly of the semiconductor device in FIG. 22.
Figure 37:
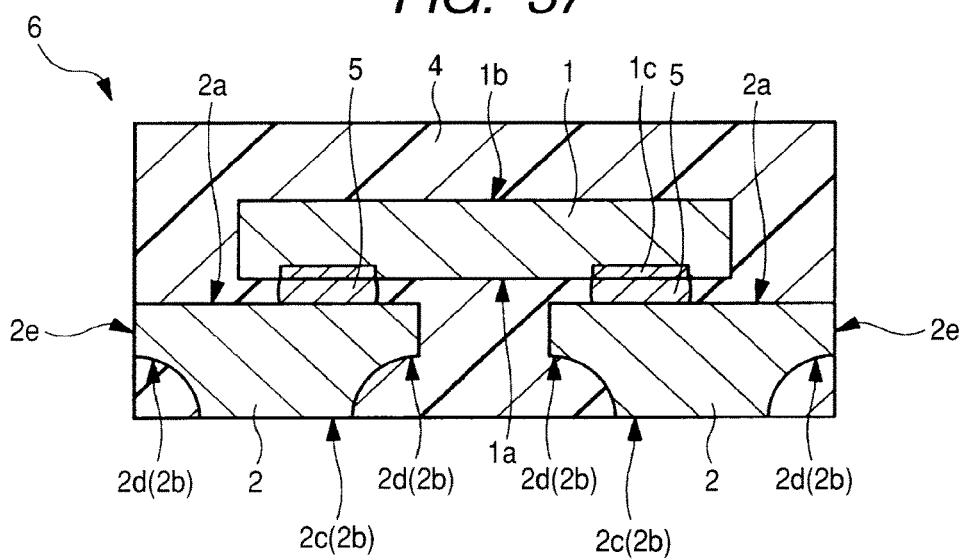
FIG. 37 is a sectional view illustrating an example of the structure cut along line A-A of FIG. 36.

FIG. 22 is a manufacturing flowchart illustrating an example of the assembling procedure for a semiconductor device in the third embodiment of the invention; FIG. 23 is a plan view illustrating an example of the structure after stud bump bonding in the assembly of the semiconductor device in FIG. 22; FIG. 24 is a plan view illustrating an example of the structure after wafer dicing in the assembly of the semiconductor device in FIG. 22; and FIG. 25 is a plan view illustrating an example of the structure after frame tape sticking in the assembly of the semiconductor device in FIG. 22. FIG. 26 is a sectional view illustrating an example of the structure cut along line A-A of FIG. 25; FIG. 27 is a plan view illustrating an example of the structure after flip chip bonding in the assembly of the semiconductor device in FIG. 22; FIG. 28 is a sectional view illustrating an example of the structure cut along line A-A of FIG. 27; FIG. 29 is a plan view illustrating an example of the structure after resin molding in the assembly of the semiconductor device in FIG. 22; and FIG. 30 is a sectional view illustrating an example of the structure cut along line A-A of FIG. 29. FIG. 31 is a plan view illustrating an example of the structure after tape stripping in the assembly of the semiconductor device in FIG. 22; FIG. 32 is a sectional view illustrating an example of the structure cut along line A-A of FIG. 31; FIG. 33 is a perspective view illustrating an example of the state of PKG dicing in the assembly of the semiconductor device in FIG. 22; FIG. 34 is a sectional view illustrating an example of the detailed structure during the PKG dicing illustrated in FIG. 33; and FIG. 35 is a plan view illustrating an example of the structure after the PKG dicing illustrated in FIG. 34. FIG. 36 is a plan view illustrating an example of the structure after testing and taping in the assembly of the semiconductor device in FIG. 22 and FIG. 37 is a sectional view illustrating an example of the structure cut along line A-A of FIG. 36.

The description of the third embodiment relates to a method for assembling the semiconductor package 6 in the first embodiment and description will be given in line with the manufacturing flow in FIG. 22.

First, the stud bump bonding (SBB) described as Step S1 in FIG. 22 is carried out. A semiconductor wafer 11, illustrated in FIG. 23, having multiple chip sections 11a in each of which a semiconductor integrated circuit is formed is prepared. A gold bump 5 is formed over the pads in each chip section 11a of this semiconductor wafer 11. The gold bumps 5 are formed using a dedicated device for stud bump bonding (stud bump bonder). The stud bump bonder has a capillary as a bonding tool and a gold wire is passed through the interior of the capillary. A gold bump 5 is formed by: initially letting a high-voltage spark fly to a gold wire exposed from the tip of the capillary to form a gold ball (initial ball); metal-joining it to a pad in each chip section 11a using both heat and an ultrasonic wave; and last, tearing off the gold wire.

Subsequently, the wafer dicing (DG) described as Step S2 is FIG. 22 is carried out. In this example, the semiconductor wafer 11 illustrated in FIG. 23 is segmented into each semiconductor chip 1 illustrated in FIG. 24 by dicing. At this time, the pads in each semiconductor chip 1 have been provided with a gold bump 5.

Subsequently, the frame tape sticking described as Step S3 in FIG. 22 is carried out. At the frame tape sticking step, first, a sheet-like lead frame 12 having multiple package sections is prepared. Each package section has an upper surface 2a over which a semiconductor chip 1 can placed and a lower surface 2b located on the opposite side to the upper surface 2a. The lead frame 12 is formed by, for example, etching a copper alloy. In the lead frame 12, each lower surface 2b of each package section has the first lower surface 2c illustrated in FIG. 6 and FIG. 7 and the second lower surface 2d positioned between the corresponding upper surface 2a thereof and the first lower surface 2c. Thus the multiple lead terminals 2 are formed so that the distance P between adjacent first lower surfaces 2c is longer than the distance Q between adjacent upper surfaces 2a as viewed in a plane (P>Q).

Subsequently, as illustrated in FIG. 25 and FIG. 26, a frame tape 13 is stuck to the lead frame 12 on the lower surface 2b side. In the description of the assembly of the semiconductor package 6 in the third embodiment, an area equivalent to four packages of the lead frame 12 will be taken as a representative example. In actuality, areas equivalent to more packages are formed in one lead frame 12.

The frame tape 13 stuck to the lead frame 12 is, for example, a polyimide tape or the like high in heat resistance (for example, 220° C. or so in heat resistant temperature). The flip chip bonding described later is carried out by vacuum sucking this frame tape 13 to suck and fix the entire lead frame 12. Further, the frame tape 13 also functions to prevent leakage of resin (sealing resin) during resin molding.

Subsequently, the flip chip bonding (FCB) described as Step S4 in FIG. 22 is carried out. A semiconductor chip 1 is placed over the upper surface 2a of each of the lead terminals 2 of the lead frame 12. Thereafter, the multiple electrode pads 1c of the semiconductor chip 1 and the respective upper surfaces 2a of the lead terminals 2 are respectively electrically coupled together. In the third embodiment, as illustrated in FIG. 27 and FIG. 28, the electrode pads 1c of each semiconductor chip 1 and the respective upper surfaces 2a of the lead terminals 2 are electrically coupled (flip chip bonded) together through gold bumps (stud bumps) 5. In metal joining between the lead terminals 2 and the gold bumps 5, both an ultrasonic wave and heat are used. The frame temperature in flip chip bonding is, for example, 70 to 100° C. and a load of 50 to 200 g or so is applied to each semiconductor chip in flip chip bonding. (However, this is an example illustrating a case where the semiconductor chip 1 is of four pins and a load in flip chip bonding is varied according to the number of pins of the semiconductor chip 1, needless to add.) To flip chip bond the semiconductor chip 1, as described in relation to the first embodiment, it is required to closely fill molding resin (sealing resin) in the gap between the flip chip bonded semiconductor chip 1 and the lead terminals 2. Therefore, flip chip bonding is carried out so that the following is implemented: a distance of 20 μm or above is ensured as the distance D between the main surface 1a of the flip chip bonded semiconductor chip 1 and the upper surface 2a of each lead terminal 2, illustrated in FIG. 9. The above-mentioned load condition corresponds to this.

During flip chip bonding, it is advisable to use a porous bonding stage to suck the entire frame tape 13 from the stage side. As the result of this, the entire lead frame is reliably sucked and fixed on the bonding stage; therefore, an ultrasonic wave does not escape during bonding and flip chip bonding can be carried out with stability.

Subsequently, the resin molding described as Step S5 in FIG. 22 is carried out. In this example, as illustrated in FIG. 29 and FIG. 30, the multiple semiconductor chips 1 and the multiple lead terminals 2 are covered with molding resin (sealing resin) in a lump to form a blanket sealing body 14.

When molding resin is filled, the sealing body 4 is formed so that the following is implemented: each semiconductor chip 1 and part of each of the lead terminals 2 are sealed; and as illustrated in FIG. 6 and FIG. 7, the first lower surface 2c of each of the lead terminals 2 is exposed in the back surface 4b of the sealing body 4. Further, the sealing body 4 is so formed that the distance P between adjacent first lower surfaces 2c of the lead terminals 2 is longer than the distance Q between adjacent upper surfaces 2a thereof (P>Q) as viewed in the plane of the semiconductor package 6.

The first lower surface 2c of each lead terminal 2 exposed in the back surface 4b of the sealing body 4 is an external terminal surface of the semiconductor device. This external terminal surface is electrically coupled with a terminal provided in a mounting board by solder when the semiconductor device is mounted over the mounting board. For this reason, foreign matter, if any, sticking to the first lower surface 2c of a lead terminal 2 interferes with wetting of solder and this increases a risk that semiconductor device mounting failure is caused. To prevent this, it is required to pay attention to contamination on the first lower surface 2c of each lead terminal 2 during assembly. As illustrated in FIG. 30, the frame tape 13 is stuck to the first lower surface 2c of the lead frame 12. (Refer to FIG. 28.) This prevents the occurrence of resin leakage when molding resin is filled. Therefore, it is possible to prevent molding resin from sticking to the first lower surface 2c.

At the flip chip bonding step, a distance of 20 μm or above is ensured as the distance D between the main surface 1a of each semiconductor chip 1 and the upper surfaces 2a of the corresponding four lead terminals 2. Therefore, it is possible to closely fill molding resin (sealing resin) in the gap between each semiconductor chip 1 and the corresponding lead terminals 2. The filler diameter of the sealing resin is, for example, 10 μM or so on an average. During resin molding, a distance of 20 μm or above is ensured between the main surface 1a of each semiconductor chip 1 and the respective upper surfaces 2a of the corresponding four lead terminals 2. Filler whose particle size is smaller than this is not caught. For this reason, the production of a molding resin void can be prevented when molding resin (sealing resin) is filled.

Subsequently, the tape stripping described as Step S6 in FIG. 22 is carried out. In this example, as illustrated in FIG. 31 and FIG. 32, the frame tape 13 illustrated in FIG. 30 stuck to the back surface of the blanket sealing body 14 (the lower surface of each lead terminal 2) is stripped.

Subsequently, the post-cure baking described as Step S7 in FIG. 22 is carried out. The blanket sealing body 14 formed of resin (sealing resin) is baked to accelerate curing of the sealing resin.

Subsequently, the laser marking described as Step S8 in FIG. 22 is carried out to put a desired mark on the surface of the blanket sealing body 14.

Subsequently, the PKG dicing (P-DG) described as Step S9 in FIG. 22 is carried out. In this example, as illustrated in the FIG. 33 to FIG. 35, the blanket sealing body 14 fixed on a wafer ring 15 with a dicing tape 16 in-between is cut with a dicing blade 17 and is segmented into individual semiconductor packages 6.

Subsequently, the testing described as Step S10 in FIG. 22 is conducted. In this example, each segmented semiconductor package 6 illustrated in FIG. 36 and FIG. 37 is inspected for electrical characteristics.

Subsequently, the taping described as Step S11 in FIG. 22 is carried out and the semiconductor package 6 is shipped.

This completes the assembly of the semiconductor package 6.

Detailed description will be given to the stud bump bonding step described as Step S1 in FIG. 22 related to the third embodiment.

Figure 38:
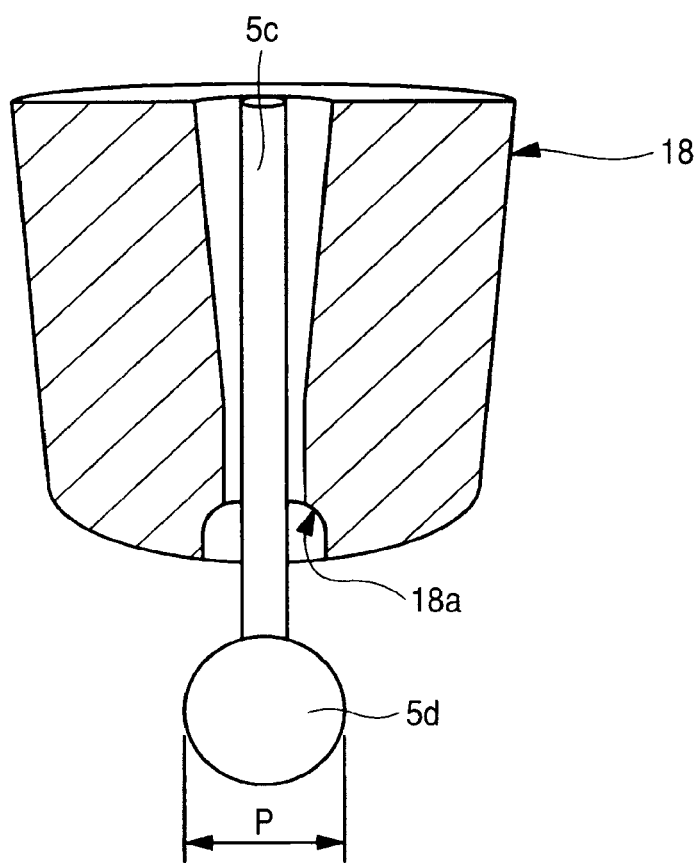
FIG. 38 is a sectional view illustrating the structure at the time of initial ball formation in stud bump bonding in the assembly of a semiconductor device in the third embodiment of the invention.
Figure 39:
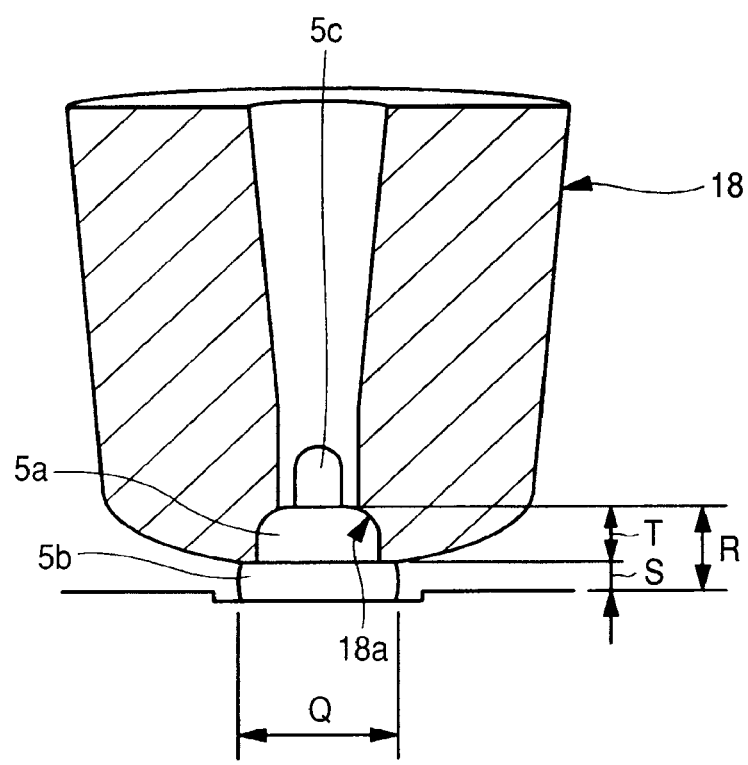
FIG. 39 is a sectional view illustrating the structure at the time of stud bump formation in the stud bump bonding in FIG. 38.
Figure 40:
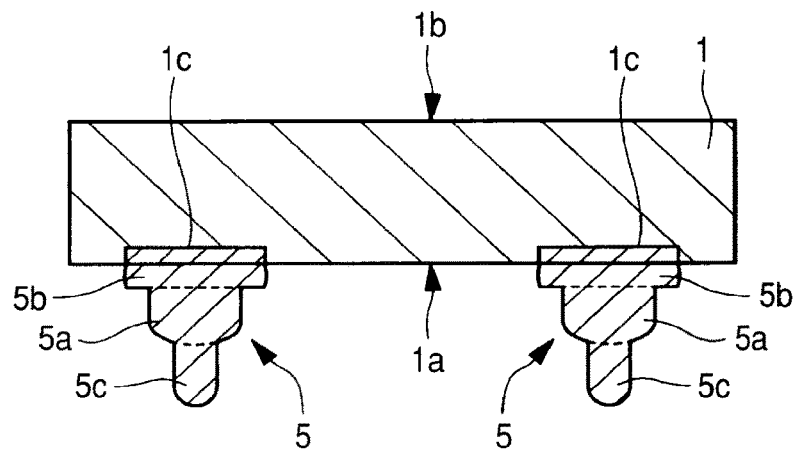
FIG. 40 is a sectional view illustrating the structure after dicing in the stud bump bonding in FIG. 38.
Figure 41:
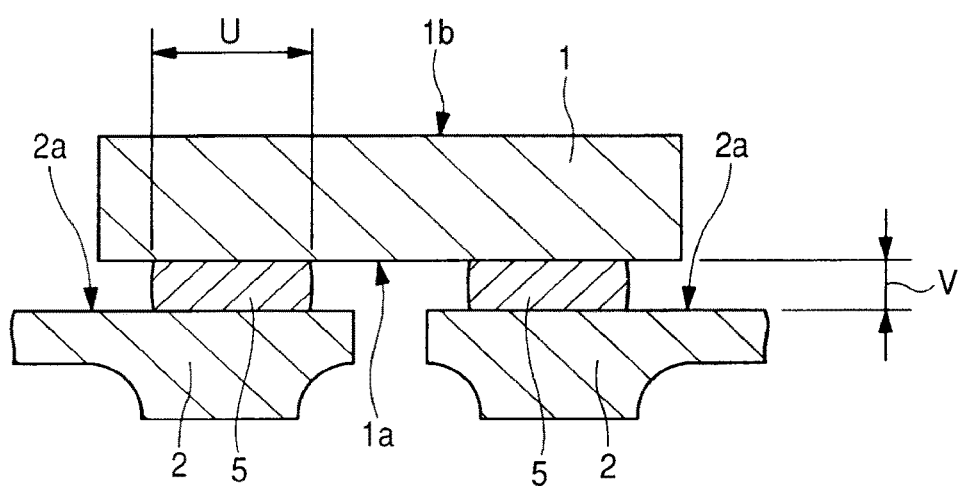
FIG. 41 is an enlarged partial sectional view illustrating the structure after flip chip bonding in the stud bump bonding in FIG. 38.
Figure 42:
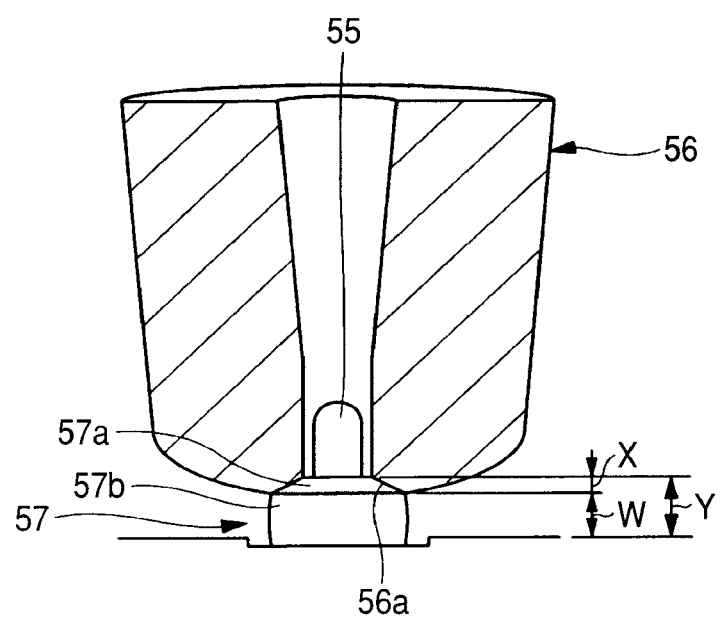
FIG. 42 is a sectional view illustrating the structure at the time of stud bump formation in stud bump bonding by a capillary in a comparative example.

FIG. 38 is a sectional view illustrating the structure at the time of initial ball formation in stud bump bonding in the assembly of the semiconductor device in the third embodiment of the invention; FIG. 39 is a sectional view illustrating the structure at the time of stud bump formation in the stud bump bonding in FIG. 38; FIG. 40 is a sectional view illustrating the structure after dicing in the stud bump bonding in FIG. 38; FIG. 41 is an enlarged partial sectional view illustrating the structure after flip chip bonding in the stud bump bonding in FIG. 38; and FIG. 42 is a sectional view illustrating the structure at the time of stud bump formation in stud bump bonding by a capillary in a comparative example.

In some semiconductor chips 1, metal wiring is placed around a pad (terminal) in their main surface 1a. If a stud bump (gold bump 5) protrudes from a pad in such a case, there is a possibility that it is electrically short-circuited. For this reason, a stud bump must be formed over a pad so that it stays within the pad.

As illustrated in FIG. 39, each stud bump is comprised of: a base 5b coupled to a pad (terminal) in the main surface 1a of a semiconductor chip 1; a chamfered portion 5a located over the base 5b; and a gold wire portion 5c located over the chamfered portion 5a. As illustrated in FIG. 38, initially, a gold ball (ball, initial ball) 5d is formed at the tip of the capillary 18 and this ball is bonded to a pad (terminal) in the main surface 1a of the semiconductor chip 1. The base 5b is formed by the ball being crushed between the capillary 18 and the pad at this time and the chamfered portion 5a is formed by the inside chamfer 18a in the capillary 18.

Incase of a pad whose pad size is, for example, 80 μm square, the dimensions of the stud bump are as follows with positional deviation also taken into account: approximately 70 μm in bump diameter and approximately 30 μm in bump thickness R (equivalent to the thickness S of the base 5b+the thickness T of the chamfered portion 5a in FIG. 39).

The result of investigation conducted by the present inventors revealed that the following: to ensure a distance of 20 μm or above as the distance from the surface of a chip flip chip bonded to leads to each lead surface, at least 25 μm of bump thickness is required. (This distance from the surface of a chip flip chip bonded to leads to each lead surface is distance V illustrated in FIG. 41 and this distance will also hereafter be referred to as stand-off value.) The result of the investigation further revealed that ensuring approximately 30 μm is sufficient. When a least 20 μm of stand-off value can be ensured, molding resin can be sufficiently filled as described in relation to the first embodiment.

If at least 20 μm of stand-off value cannot be ensured, it becomes impossible to closely fill molding resin in the gap between the chip surface and each lead surface and this leads to the production of a mold void. If a mold void is formed and solder reflow is carried out with moisture collected in the void, reflow cracking (package cracking) is caused. If a void is in contact with a bump, stress is not dispersed to the molding (sealing body) and it is concentrated on coupling portions (the boundary between a pad and a stud bump and the boundary between a stud bump and a lead terminal). As a result, a risk of breakage of a coupling portion is increased. For the above reasons, the reliability of the semiconductor device is degraded.

When the pad size is smaller than approximately 80 μm square and is approximately 70 μm square, the following measure is taken to prevent a stud bump from protruding from a pad: the size of the initial ball is reduced, that is, the volume of gold is reduced.

In this method, however, the amount of used gold (the volume of gold) is reduced and thus the minimum value of 25 μm cannot be ensured as the bump thickness (the thickness of the base+the thickness of the chamfered portion). If a least 25 μm of bump thickness cannot be ensured, the above-mentioned minimum stand-off value, 20 μm, after flip chip bonding cannot be ensured, either. This makes it difficult to sufficiently fill the molding resin.

To prevent this, it is required to ensure the volume of gold and further form a stud bump so that the stud bump does not protrude from a pad. As a matter of course, it is also required to solve the problem of ensuring the strength of junction of a stud bump to a pad.

In the third embodiment, consequently, the following capillary is used to form a stud bump: a capillary with which it is possible to ensure the amount (volume) of gold held in the inside chamfer in the capillary so that the stud bump does not protrude from a pad and further ensure the strength of junction with stability.

FIG. 38 and FIG. 39 illustrate the shape of the capillary used in the third embodiment. In the third embodiment, the pad size is 70 μm. First, an initial ball (gold ball 5d) approximately 55 μm in diameter P is formed as illustrated in FIG. 38. The capillary is in such a shape that the region (the region of the inside chamfer 18a) where a load is applied to the chamfered portion (portion sandwiched between a gold wire and the base) 5a of a stud bump (gold bump 5) is long. Thus a stud bump is firmly held against a pad while an ultrasonic wave and a load are applied.

As illustrated in FIG. 39, the chamfered portion 5a of a stud bump (gold bump 5) formed by the inside chamfer (ball holding portion) 18a in the capillary 18 is the following region: a region equivalent to the portion between the base 5b and the gold wire portion 5c and equivalent to distance T. The diameter Q of the base 5b formed by pressing a gold ball 5d, approximately 55 μm in diameter, with the capillary 18 is, for example, approximately 60 μm and it does not protrude from a pad, 70 μm square in size. At this time, the thickness S of the base 5b is approximately 10 μm and the thickness T of the chamfered portion 5a is approximately 15 μm. As the result of an attempt to hold a larger amount (volume) of gold in the inside chamfer 18a, the thickness of the chamfered portion 5a is larger than the thickness of the base 5b. Further, since the thickness of the base 5b is smaller than the thickness of the chamfered portion 5a, an ultrasonic wave is transmitted from the capillary without fail and thus the strength of junction can be enhanced. Since the volume of laterally expanding gold is small, it is also possible to reduce a risk that a bump protrudes from a small pad. The bump thickness R is equal to the sum of the thickness of the base and the thickness of the chamfered portion; therefore, it is approximately 25 μm.

In the third embodiment, the capillary is formed in such a shape that the depth of the recessed inside chamfer 18a at the tip of the capillary 18 is increased so that the thickness of the chamfered portion 5a of each gold bump is increased. Thus the region where a load is applied to the gold ball 5d is lengthened and the amount (volume) of a gold ball 5d held in the inside chamfer 18a is increased.

FIG. 42 illustrates the shape of a capillary 56 in a comparative example and the shape of a gold bump (stud bump) 57 formed therewith. With this shape of the gold bump 57, the strength of junction with a pad could not be ensured and peeling frequently occurred when the present inventors conducted investigation. The dimensions of the gold bump 57 formed with the capillary 56 in the comparative example were as follows: the thickness W of the base 57b is approximately 25 μm and the thickness X of the chamfered portion 57a is approximately 5 μm. As a result, the bump thickness Y (the thickness of the base+the thickness of the chamfered portion) was approximately 30 μm.

The respective inside chamfers 18a, 56a of the capillary 18 in the third embodiment illustrated in FIG. 39 and the capillary 56 in the comparative example illustrated in FIG. 42 will be compared with each other for volume (volumetric capacity). The volume (volumetric capacity) of the inside chamfer 18a in the capillary 18 in the third embodiment is $4.79 \times 10^{-5}$ mm$^3$/ball. Meanwhile, the volume (volumetric capacity) of the inside chamfer 56a in the capillary 56 in the comparative example is $1.59 \times 10^{-5}$ mm$^3$/ball. The capillary 18 in the third embodiment is approximately three times larger in the volume (volumetric capacity) of the inside chamfer 18a.

It can be seen from the foregoing that the following takes place when a gold ball (ball) 5d is pressed: more gold enters the inside chamfer 18a illustrated in FIG. 39 with use of the capillary 18 in the third embodiment than with use of the capillary 56 in the comparative example illustrated in FIG. 42. As a result, it is possible to ensure a sufficient volume of gold to achieve the target stand-off value after flip chip bonding even though the pad size is reduced. Since the volume (volumetric capacity) of the inside chamfer 18a is increased, the area of contact between the inner surface of the capillary and the surface of a gold bump is also increased. Therefore, it is possible to reliably transmit an ultrasonic wave and heat to a gold bump 5 through the capillary 18 during bonding.

Therefore, 20 μm or above of stand-off value (V) after flip chip bonding can be ensured as illustrated in FIG. 41. The diameter (U) of the gold bump 5 after flip chip bonding is approximately 70 μm.

The following is a summary of the foregoing. When a gold bump (stud bump) 5 is formed, the capillary 18 in the third embodiment having the recessed inside chamfer (ball holding portion) 18a formed at the tip thereof is used. This makes it possible to press the gold ball 5d while holding part thereof in the inside chamfer 18a and, after pressing, form such a gold bump 5 that the thickness of the chamfered portion 5a is larger than the thickness of the base 5b. In the third embodiment, as an example, the thickness of the chamfered portion 5a of each gold bump 5 is approximately 15 μm and the thickness of the base 5b thereof is approximately 10 μm.

In other words, the following gold bump 5 can be formed with the capillary 18 in the third embodiment: such a gold bump 5 that the thickness of its chamfered portion 5a after pressing is approximately 1.5 times the thickness of its base 5b.

The following is implemented by forming a gold bump (stud bump) 5 using the capillary 18 in the third embodiment: since the depth of the inside chamfer 18a in the capillary 18 is large, the region (area) where a load is applied to the gold ball 5d during pressing is lengthened (increased). This makes it possible to enhance the strength of junction of a gold bump 5 to a pad during flip chip bonding.

Since a sufficient volume of a gold bump 5 can be ensured, 20 μm or above of a stand-off value after mounting can be ensured. As a result, it is possible to closely fill molding resin (sealing resin) with stability during resin molding.

It is possible to fill the gap with one kind of molding resin 1 and it is unnecessary to fill it by impregnating liquid resin such as underfill. Therefore, it is possible to reduce the material cost of underfill and a step for application and thus reduce the cost of the entire semiconductor device.

(Fourth Embodiment)

Figure 43:
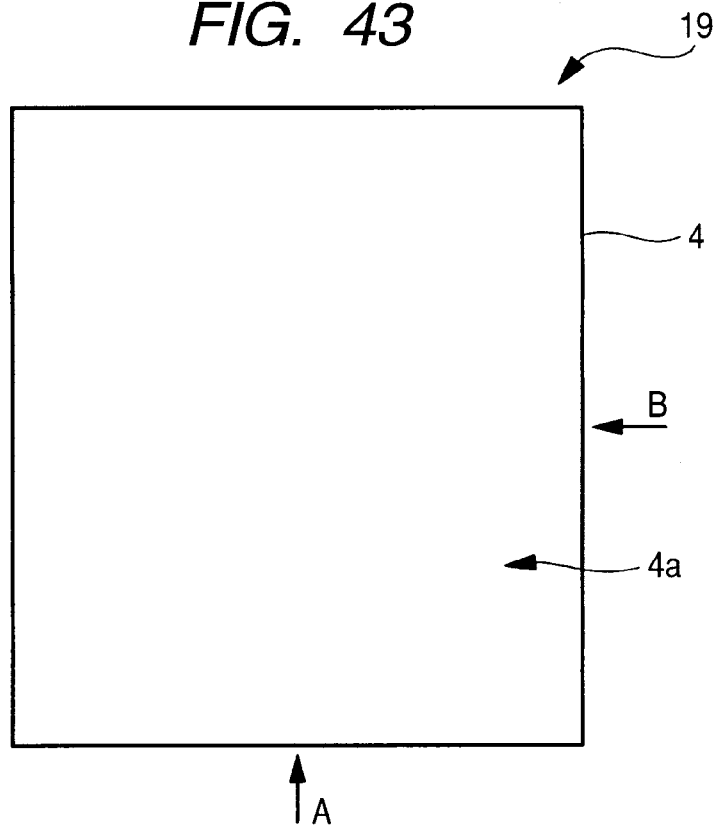
FIG. 43 is a plan view illustrating an example of the structure of a semiconductor device in a fourth embodiment of the invention.
Figure 44:
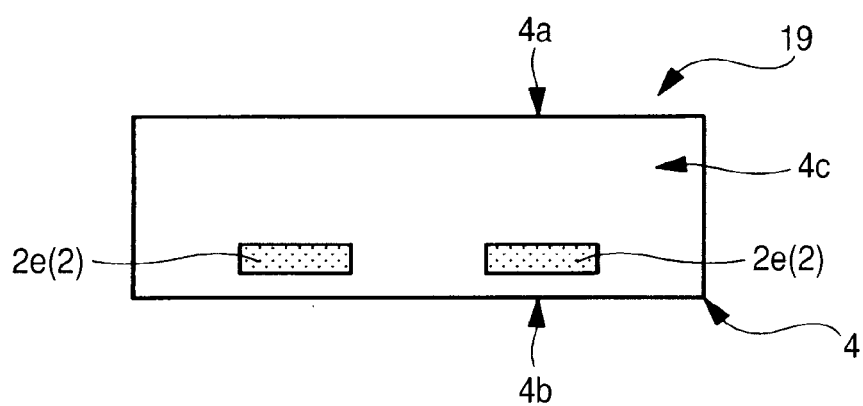
FIG. 44 is a side view illustrating an example of the structure of the semiconductor device illustrated in FIG. 43 as viewed from the direction A.
Figure 45:
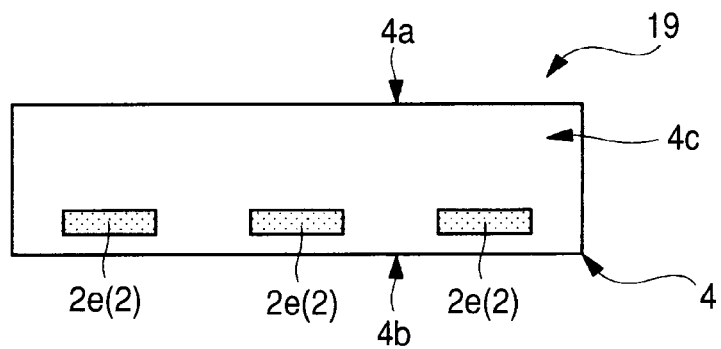
FIG. 45 is a side view illustrating an example of the structure of the semiconductor device illustrated in FIG. 43 as viewed from the direction B.
Figure 46:
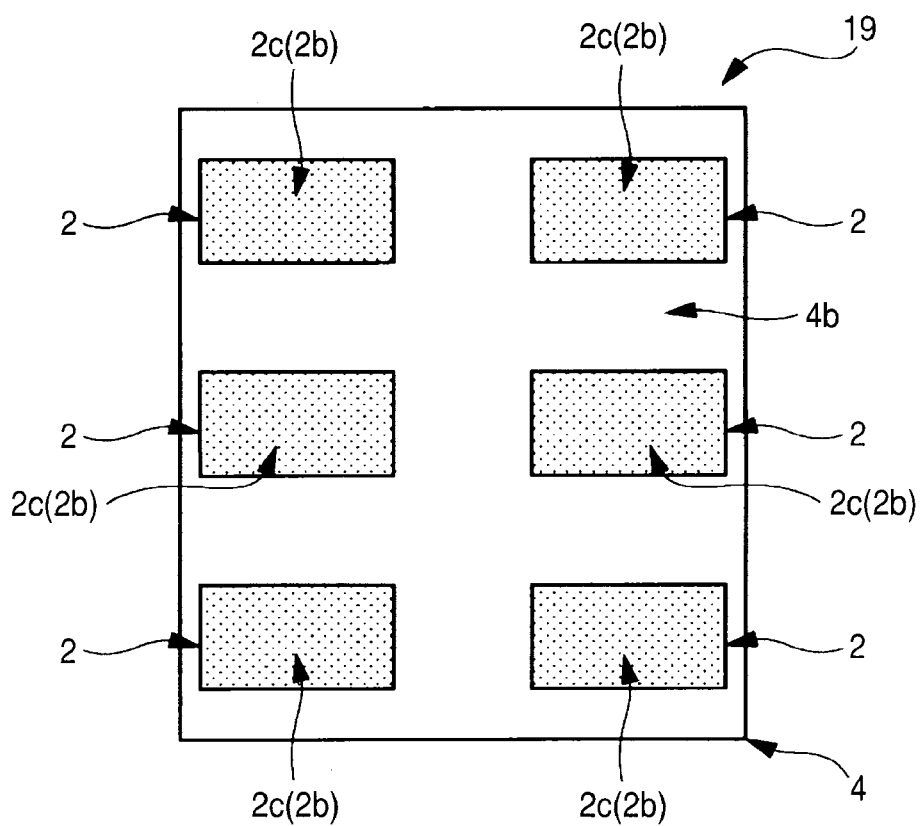
FIG. 46 is a bottom view illustrating an example of the structure of the semiconductor device illustrated in FIG. 43 on the back surface side.
Figure 47:
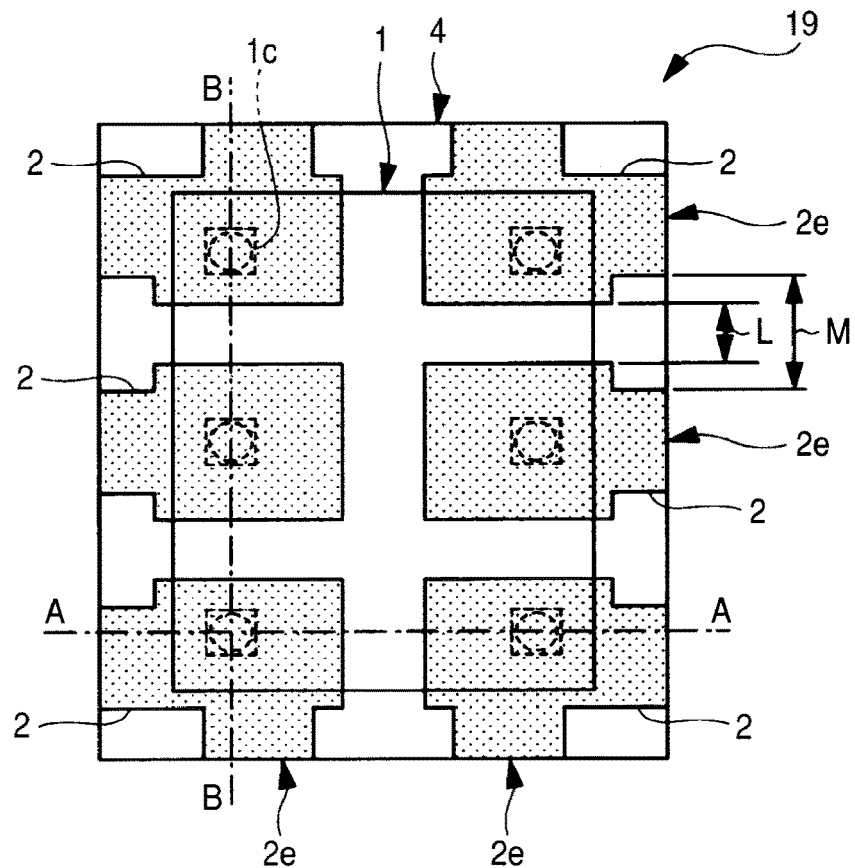
FIG. 47 is a plan view illustrating an example of the structure of the semiconductor device illustrated in FIG. 43 as seen through a sealing body and a semiconductor chip.
Figure 48:
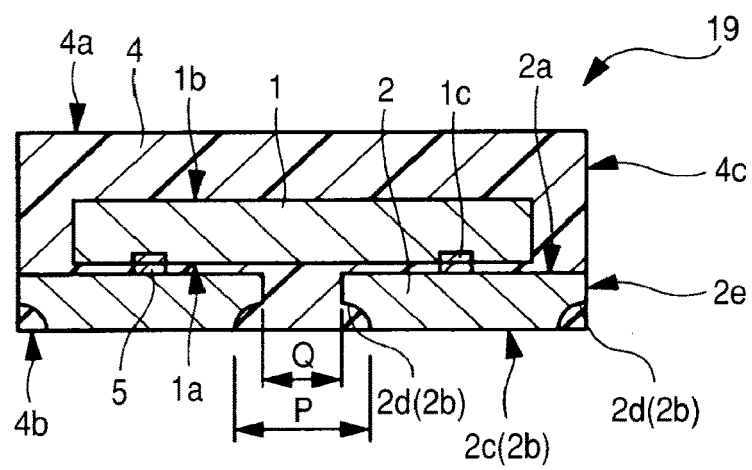
FIG. 48 is a sectional view illustrating an example of the structure cut along line A-A of FIG. 47.
Figure 49:
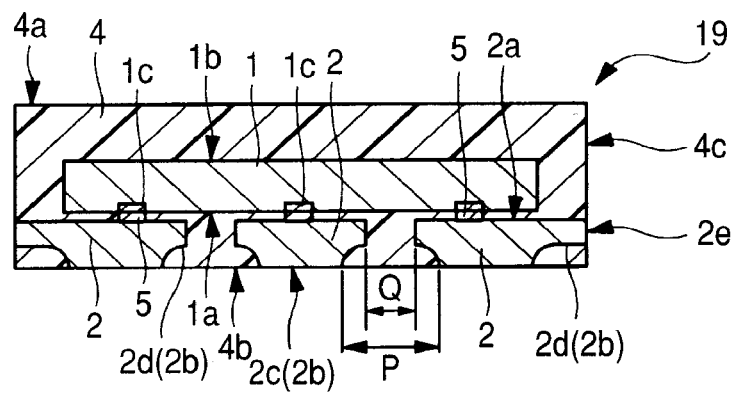
FIG. 49 is a sectional view illustrating an example of the structure cut along line B-B of FIG. 47.

FIG. 43 is a plan view illustrating an example of the structure of a semiconductor device in the fourth embodiment of the invention; FIG. 44 is a side view illustrating an example of the structure of the semiconductor device illustrated in FIG. 43 as viewed from the direction A; FIG. 45 is a side view illustrating an example of the structure of the semiconductor device illustrated in FIG. 43 as viewed from the direction B; and FIG. 46 is a bottom view illustrating an example of the structure of the semiconductor device illustrated in FIG. 43 on the back surface side. FIG. 47 is a plan view illustrating an example of the structure of the semiconductor device illustrated in FIG. 43 as seen through a sealing body and a semiconductor chip; FIG. 48 is a sectional view illustrating an example of the structure cut along line A-A of FIG. 47; and FIG. 49 is a sectional view illustrating an example of the structure cut along line B-B of FIG. 47.

The semiconductor device in the fourth embodiment is a small resin-sealed semiconductor device assembled using a lead frame like the semiconductor package 6 in the first embodiment. It has substantially the same structure as that of the semiconductor package 6 in the first embodiment. However, while the semiconductor package 6 in the first embodiment is of four pins (four terminals), the semiconductor device in the fourth embodiment is of more than four pins. In this description, a six-pin SON (Small Outline Non-leaded package) 19 will be taken as an example.

Description will be given to the detailed configuration of the SON 19 in the fourth embodiment with reference to FIG. 43 to FIG. 49. The SON 19 includes: a semiconductor chip 1 having a main surface 1a with multiple electrode pads 1c (Refer to FIG. 47) formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and a sealing body 4 having a main surface 4a and a back surface 4b located on the opposite side to the main surface 4a.

As illustrated in FIG. 46 and FIG. 47, the SON 19 has six lead terminals 2. As illustrated in FIG. 48 and FIG. 49, each of the six lead terminals 2 has its upper surface 2a electrically coupled with a corresponding electrode pad 1c of the semiconductor chip 1 through a bump. That is, the semiconductor chip 1 is flip chip bonded to the six lead terminals 2 through multiple bumps. The chief material of the bumps is, for example, gold. Therefore, the semiconductor chip 1 is flip chip bonded to the lead terminals 2 through the gold bumps 5.

As illustrated in FIG. 48 and FIG. 49, the lower surface 2b of each of the six lead terminals 2 has: a first lower surface 2c exposed in the back surface 4b of the sealing body 4; and a second lower surface 2d positioned between the upper surface 2a and first lower surface 2c of the one of the six lead terminals 2 and arranged in the sealing body 4. The distance (lead thickness) from each upper surface 2a to the corresponding second lower surface 2d is shorter (thinner) than the distance (lead thickness) from the upper surface 2a to the corresponding first lower surface 2c.

In the SON 19, the respective first lower surfaces 2c of the six lead terminals 2 are exposed in the back surface 4b of the sealing body 4; and the first lower surface 2c of each of the six lead terminals 2 makes an external terminal of the semiconductor device in the fourth embodiment.

The second lower surface 2d of each of the six lead terminals 2 is formed by half etching the back surface of the corresponding lead terminal 2. As illustrated in FIG. 48 and FIG. 49, each second lower surface 2d is formed by shaving the peripheral portion of the back surface of the corresponding lead terminal 2 by half etching.

As mentioned above, the peripheral portion of the back surface of each lead terminal 2 is half etched. In each lead terminal 2, as a result, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface 2c).

Therefore, also in the SON 19 in the fourth embodiment, as illustrated in FIG. 48 and FIG. 49, the following takes place as viewed in a plane: the distance P between adjacent first lower surfaces 2c of the six lead terminals 2 is longer than the distance Q between adjacent upper surfaces 2a thereof (P>Q). The distance P between adjacent first lower surfaces 2c of the six lead terminals 2 and the distance Q between adjacent upper surfaces 2a thereof are taken in the direction along the direction of arrangement of the six lead terminals 2. However, the relation of P>Q also holds in the distances in the directions of the diagonal lines of the six lead terminals 2.

Each of the six lead terminals 2 has two side surfaces 2e continuing into its upper surface 2a and second lower surface 2d. As illustrated in FIG. 44 and FIG. 45, the 10 side surfaces 2e in total are exposed in the four side surfaces 4c of the sealing body 4.

In each side surface 4c of the sealing body 4, part of the side surface 4c of the sealing body 4 is arranged around each side surface 2e of the lead terminals 2. More specific description will be given. In each exposed side surface 2e of each lead terminal 2, the peripheral portion of the back surface of the lead terminal 2 is shaven by half etching and formed in a recessed shape. Molding resin is filled so that the recessed portions (second lower surfaces 2d) are covered therewith. As a result, each exposed side surface 2e of each lead terminal 2 is encircled with part of the side surfaces 4c of the sealing body 4.

In each side surface 4c of the sealing body 4, as illustrated in FIG. 47, the distance M between adjacent side surfaces 2e of the six lead terminals 2 is longer than the distance L between adjacent upper surfaces 2a thereof (M>L).

In the SON 19 in the fourth embodiment, the production of a solder bridge can be suppressed when it is solder mounted to a mounting board or the like by taking the following measure: the distance between adjacent first lower surfaces 2c of the six lead terminals 2 exposed in the back surface 4b of the sealing body 4 is made longer than the distance between adjacent upper surfaces 2a thereof.

More specific description will be given. With a narrow pitch between external terminals, in downsized semiconductor devices, a solder bridge is produced during solder mounting. In the SON 19 in the fourth embodiment, the production of a solder bridge during solder mounting can be suppressed by lengthening the distance between adjacent first lower surfaces 2c of the six lead terminals 2 to be external terminals.

As a result, it is possible to reduce the size and thickness of the SON 19 and further enhance the reliability of the SON 19.

The other respects in the structure and the other effects of the SON 19 in the fourth embodiment are the same as those of the semiconductor package 6 in the first embodiment and description thereof will be omitted.

Description will be given to a semiconductor device in a modification to the fourth embodiment.

Figure 50:
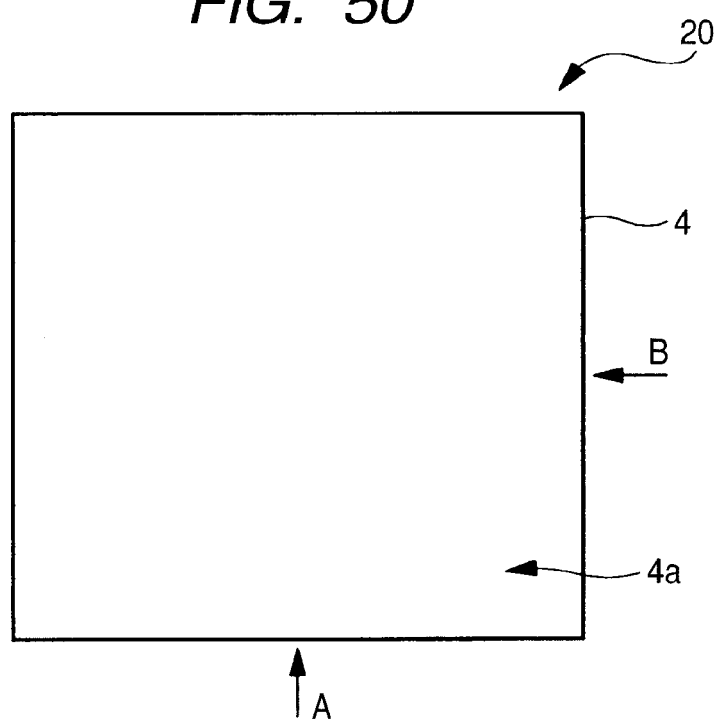
FIG. 50 is a plan view illustrating the structure of a semiconductor device in a modification to the fourth embodiment of the invention.
Figure 51:
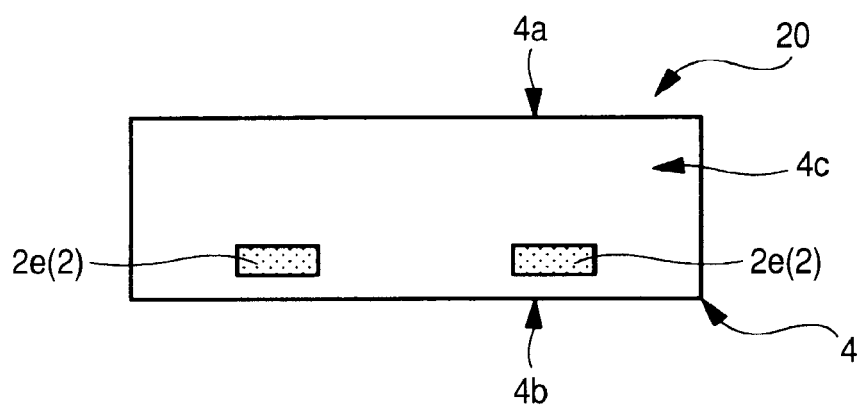
FIG. 51 is a side view illustrating an example of the structure of the semiconductor device illustrated in FIG. 50 as viewed from the direction A.
Figure 52:
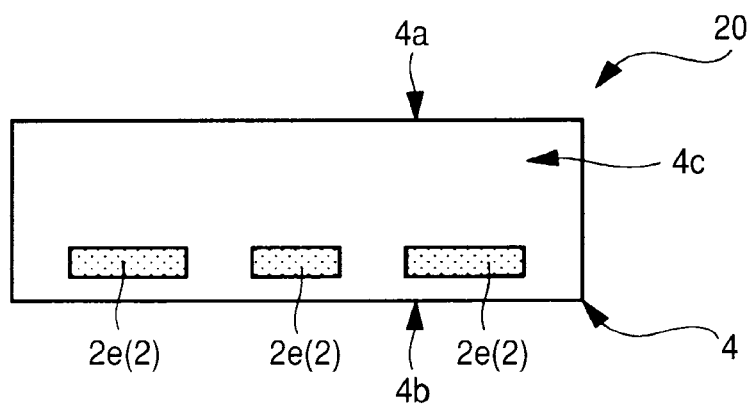
FIG. 52 is a side view illustrating an example of the structure of the semiconductor device illustrated in FIG. 50 as viewed from the direction B.
Figure 53:
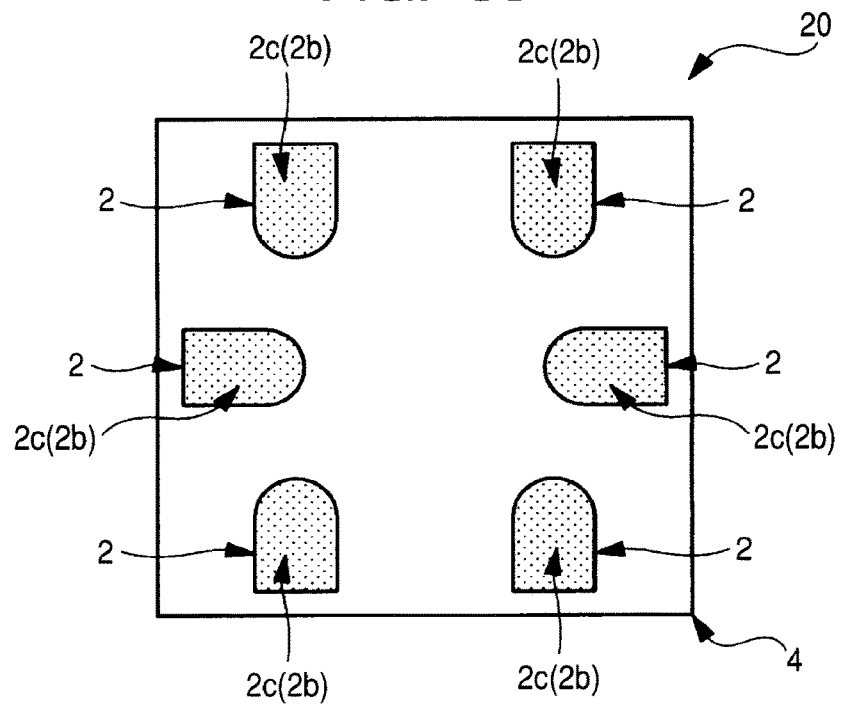
FIG. 53 is a bottom view illustrating an example of the structure of the semiconductor device illustrated in FIG. 50 on the back surface side.
Figure 54:
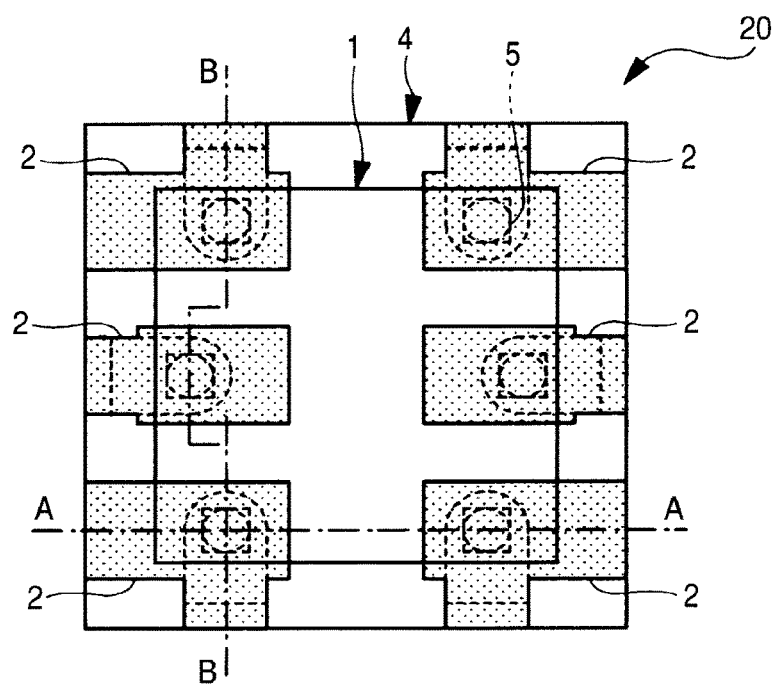
FIG. 54 is a plan view illustrating an example of the structure of the semiconductor device illustrated in FIG. 50 as seen through a sealing body and a semiconductor chip.
Figure 55:
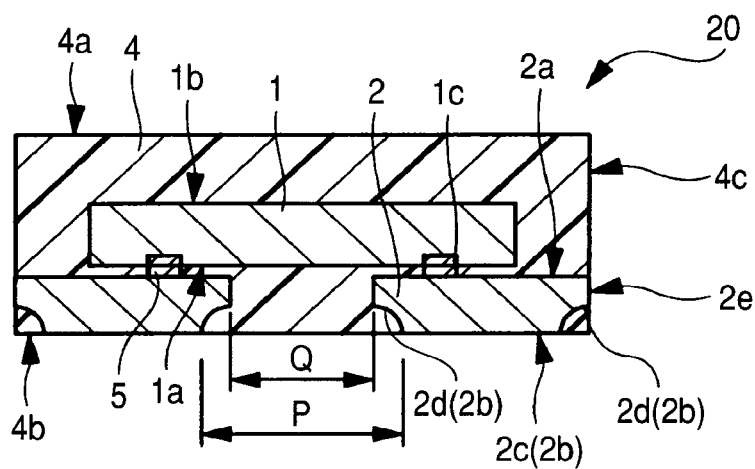
FIG. 55 is a sectional view illustrating an example of the structure cut along line A-A of FIG. 54.
Figure 56:
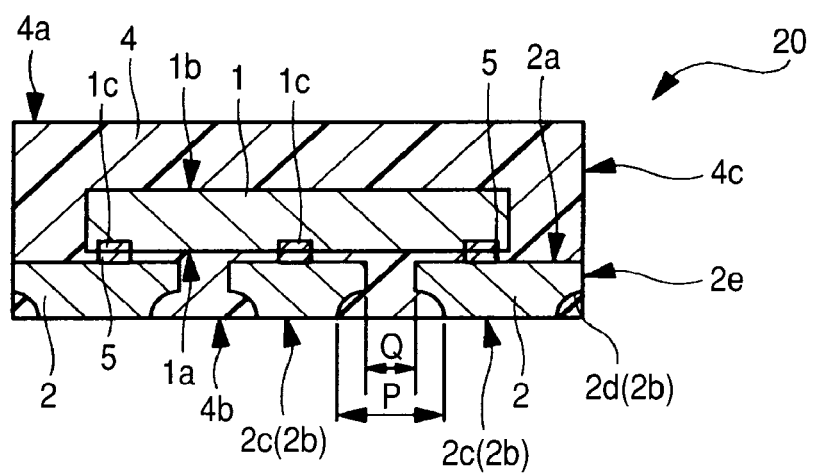
FIG. 56 is a sectional view illustrating an example of the structure cut along line B-B of FIG. 54.

FIG. 50 is a plan view illustrating the structure of the semiconductor device in the modification to the fourth embodiment of the invention; FIG. 51 is a side view illustrating an example of the structure of the semiconductor device illustrated in FIG. 50 as viewed from the direction A; FIG. 52 is a side view illustrating an example of the structure of the semiconductor device illustrated in FIG. 50 as viewed from the direction B; and FIG. 53 is a bottom view illustrating an example of the structure of the semiconductor device illustrated in FIG. 50 on the back surface side. FIG. 54 is a plan view illustrating an example of the structure of the semiconductor device illustrated in FIG. 50 as seen through a sealing body and a semiconductor chip; FIG. 55 is a sectional view illustrating an example of the structure cut along line A-A of FIG. 54; and FIG. 56 is a sectional view illustrating an example of the structure cut along line B-B of FIG. 54.

The semiconductor device in the modification to the fourth embodiment is QFN (Quad Flat Non-leaded Package) 20 with a flip chip bonding structure having six pins like the SON 19.

Description will be given to the detailed configuration of the QFN 20 in the modification with reference to FIG. 50 to FIG. 56. The QFN 20 includes: a semiconductor chip 1 having a main surface 1a with multiple electrode pads 1c (Refer to FIG. 55) formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and a sealing body 4 having a main surface 4a and a back surface 4b located on the opposite side to the main surface 4a.

As illustrated in FIG. 53 and FIG. 54, the QFN 20 also has six lead terminals 2 like the SON 19. As illustrated in FIG. 55 and FIG. 56, each of the six lead terminals 2 has its upper surface 2a electrically coupled with a corresponding electrode pad 1c of the semiconductor chip 1 through a bump. That is, the semiconductor chip 1 is flip chip bonded to the six lead terminals 2 through gold bumps 5.

As illustrated in FIG. 55 and FIG. 56, the lower surface 2b of each of the six lead terminals 2 has a first lower surface 2c exposed in the back surface 4b of the sealing body 4; and a second lower surface 2d positioned between the upper surface 2a and first lower surface 2c of the one of the six lead terminals 2 and arranged in the sealing body 4.

Also in the QFN 20, the respective first lower surfaces 2c of the six lead terminals 2 are exposed in the back surface 4b of the sealing body 4; and the first lower surface 2c of each of the six lead terminals 2 makes an external terminal of the semiconductor device in the modification to the fourth embodiment.

The second lower surface 2d of each of the six lead terminals 2 is formed by half etching the back surface of the corresponding lead terminal 2. As illustrated in FIG. 55 and FIG. 56, each second lower surface 2d is formed by shaving the peripheral portion of the back surface of the corresponding lead terminal 2 by half etching.

As mentioned above, the peripheral portion of the back surface of each lead terminal 2 is half etched. In each lead terminal 2, as a result, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface 2c).

Therefore, also in the QFN 20 in the modification, as illustrated in FIG. 55 and FIG. 56, the following takes place as viewed in a plane: the distance P between adjacent first lower surfaces 2c of the six lead terminals 2 is longer than the distance Q between adjacent upper surfaces 2a thereof (P>Q). The distance (P) between adjacent first lower surfaces 2c of the six lead terminals 2 and the distance (Q) between adjacent upper surfaces 2a thereof are taken in the direction along the direction of arrangement of the six lead terminals 2. However, the relation of P>Q also holds in the distances in the directions of the diagonal lines of the six lead terminals 2.

Each of the six lead terminals 2 has two side surfaces 2e continuing into its upper surface 2a and second lower surface 2d. As illustrated in FIG. 51 and FIG. 52, the 10 side surfaces 2e in total are exposed in the four side surfaces 4c of the sealing body 4.

In each side surface 4c of the sealing body 4, part of the side surface 4c of the sealing body 4 is arranged around each side surface 2e of the lead terminals 2. More specific description will be given. In each exposed side surface 2e of each lead terminal 2, the peripheral portion of the back surface of the lead terminal 2 is shaven by half etching and formed in a recessed shape. Molding resin is filled so that the recessed portions (second lower surfaces 2d) are covered therewith. As a result, each exposed side surface 2e of each lead terminal 2 is encircled with part of the side surfaces 4c of the sealing body 4.

Also in the QFN 20 in the modification to the fourth embodiment, the production of a solder bridge can be suppressed when it is solder mounted to a mounting board or the like by taking the following measure: the distance between adjacent first lower surfaces 2c of the six lead terminals 2 exposed in the back surface 4b of the sealing body 4 is made longer than the distance between adjacent upper surfaces 2a thereof.

More specific description will be given. With a narrow pitch between external terminals, in downsized semiconductor devices, a solder bridge is produced during solder mounting. Also in the QFN 20 in the modification to the fourth embodiment, the production of a solder bridge during solder mounting can be suppressed by lengthening the distance between adjacent first lower surfaces 2c of the six lead terminals 2 to be external terminals.

As a result, it is possible to reduce the size and thickness of the QFN 20 and further enhance the reliability of the QFN 20.

The other respects in the structure and the other effects of the QFN 20 in the modification to the fourth embodiment are the same as those of the semiconductor package 6 in the first embodiment and description thereof will be omitted.

(Fifth Embodiment)

Figure 57:
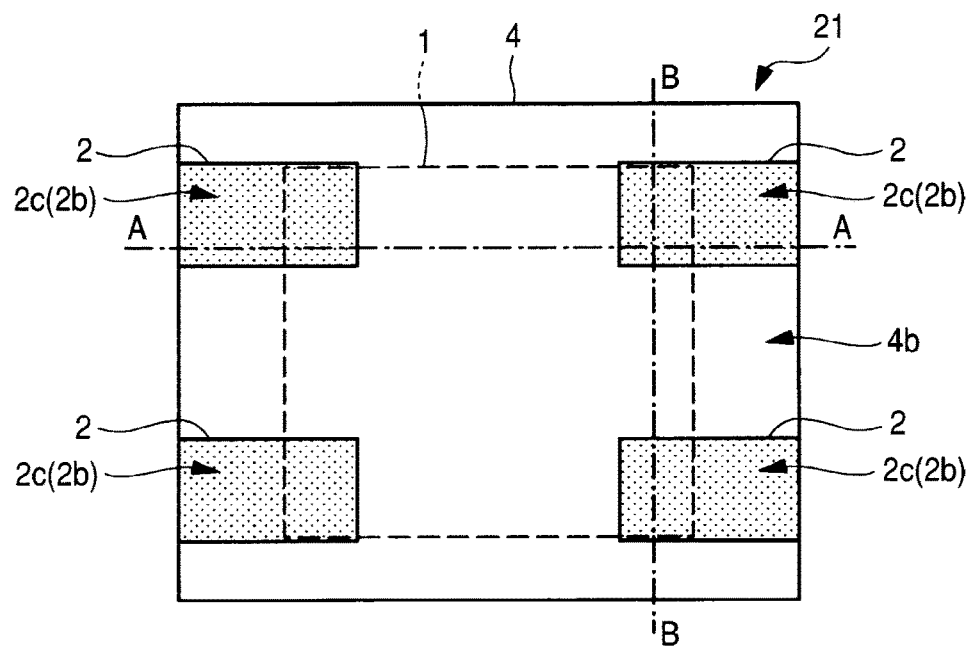
FIG. 57 is a bottom view illustrating an example of the structure of a semiconductor device in a fifth embodiment of the invention on the back surface side.
Figure 58:
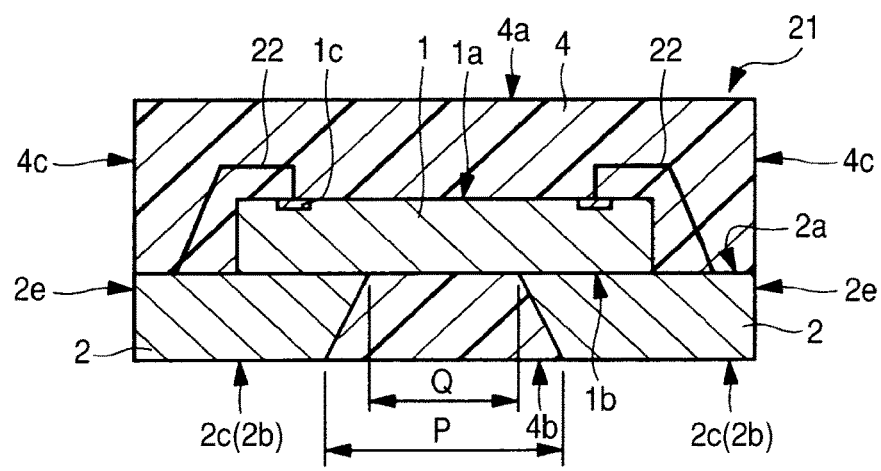
FIG. 58 is a sectional view illustrating an example of the structure cut along line A-A of FIG. 57.

FIG. 57 is a bottom view illustrating an example of the structure of a semiconductor device in the fifth embodiment of the invention on the back surface side; FIG. 58 is a sectional view illustrating an example of the structure cut along line A-A of FIG. 57; and FIG. 59 is a sectional view illustrating an example of the structure cut along line B-B of FIG. 57.

The semiconductor device in the fifth embodiment adopts a wire bonding coupling structure, not the flip chip bonding structure. In the description of the fifth embodiment, a four-pin semiconductor package 21 similar with the semiconductor package 6 in the first embodiment will be taken as an example.

The semiconductor package 21 in the fifth embodiment is different from the semiconductor package 6 in the first embodiment mainly in that: the flip chip bonding structure is replaced with the wire bonding coupling structure. As for the other respects in structure, it is basically the same as the semiconductor package 6 in the first embodiment.

Figure 59:
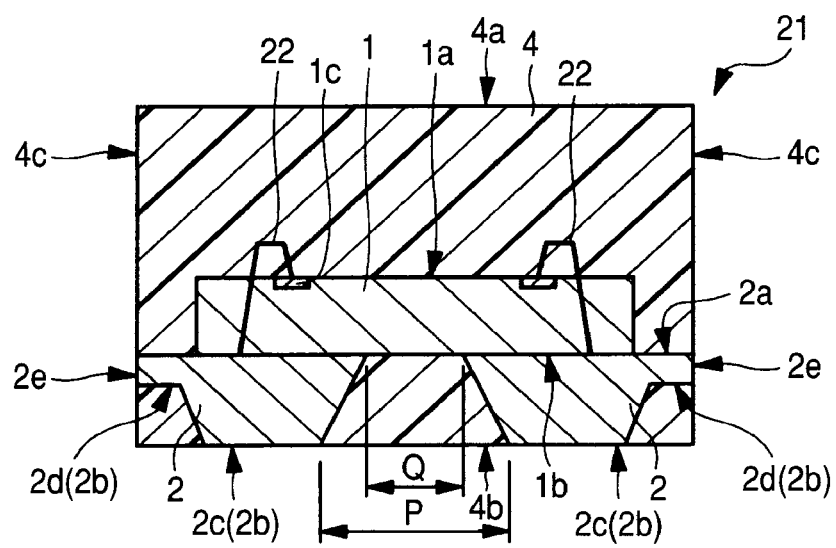
FIG. 59 is a sectional view illustrating an example of the structure cut along line B-B of FIG. 57.

As illustrated in FIG. 58 and FIG. 59, the semiconductor chip 1 is placed over the upper surface 2a of each lead terminal 2 with its main surface 1a facing upward. Each electrode pad is formed in the main surface 1a of the semiconductor chip 1 is electrically coupled with the upper surface 2a of a corresponding lead terminal 2 through a wire 22 such as gold wire.

As in the semiconductor package 6 in the first embodiment, part of each lead terminal 2, each wire 22, and the semiconductor chip 1 are resin-sealed with a sealing body 4 formed of sealing resin (resin).

At this time, as illustrated in FIG. 57, the first lower surface 2c of each lead terminal 2 is exposed also in the back surface 4b of the sealing body 4.

More specific description will be given. Also in the semiconductor package 21 in the fifth embodiment, each of the respective lower surfaces 2b of the four lead terminals 2 includes the following, like the semiconductor package 6 in the first embodiment, as illustrated in FIG. 58 and FIG. 59: a first lower surface 2c exposed in the back surface 4b of the sealing body 4; and a second lower surface 2d positioned between the upper surface 2a and first lower surface 2c of the one of the four lead terminals 2 and arranged in the sealing body 4.

Also in the semiconductor package 21, therefore, the following measure is taken as illustrated in FIG. 57: the respective first lower surfaces 2c of the four lead terminals 2 are exposed in the back surface 4b of the sealing body 4; and the first lower surface 2c of each of the four lead terminals 2 makes an external terminal of the semiconductor device in the fifth embodiment.

Also in the semiconductor package 21 in the fifth embodiment, as illustrated in FIG. 58 and FIG. 59, the following takes place as viewed in a plane: the distance P between adjacent first lower surfaces 2c of the four lead terminals 2 is longer than the distance Q between adjacent upper surfaces 2a thereof (P>Q). The distance P between adjacent first lower surfaces 2c of the four lead terminals 2 and the distance Q between adjacent upper surfaces 2a thereof are taken in the direction along the direction of arrangement of the four lead terminals 2. However, the relation of P>Q also holds in the distances in the directions of the diagonal lines of the four lead terminals 2.

Each of the four lead terminals 2 has side surfaces 2e continuing into its upper surface 2a and second lower surface 2d. Eight side surfaces 2e in total are exposed in the four side surfaces 4c of the sealing body 4.

Also in the semiconductor package 21 in the fifth embodiment, the production of a solder bridge can be suppressed when it is solder mounted to a mounting board or the like by taking the following measure: the distance between adjacent first lower surfaces 2 of the four lead terminals 2 exposed in the back surface 4b of the sealing body 4 is made longer than the distance between adjacent upper surfaces 2a thereof.

More specific description will be given. With a narrow pitch between external terminals, in downsized semiconductor devices, a solder bridge is produced during solder mounting. Also in the semiconductor package 21 in the fifth embodiment, the production of a solder bridge during solder mounting can be suppressed by lengthening the distance between adjacent first lower surfaces 2c of the four lead terminals 2 to be external terminals.

As a result, it is possible to reduce the size and thickness of the semiconductor package 21 and further enhance the reliability of the semiconductor package 21.

As described up to this point, the major features related to the lead terminal 2 are not limited to the flip chip bonding structure. It can also be applied to the wire bonding coupling structure as long as the package size is within such a range that interference between a capillary and a chip edge does not occur.

The other respects in the structure and the other effects of the semiconductor package 21 in the fifth embodiment are the same as those of the semiconductor package 6 in the first embodiment and description thereof will be omitted.

(Sixth Embodiment)

In the description of the first to fifth embodiments, a small resin-sealed semiconductor device assembled using an etching frame has been taken as an example. In the description of the sixth embodiment, a semiconductor device assembled using an electroforming frame will be taken as an example.

Figure 61:
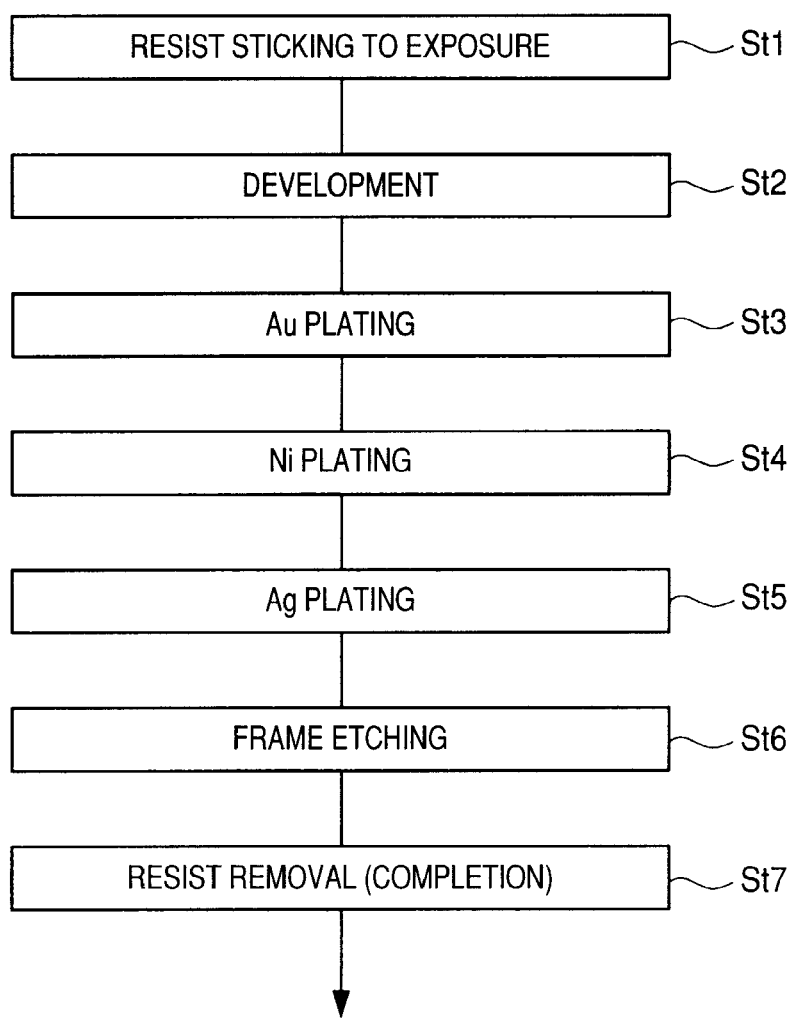
FIG. 61 is a drawing illustrating the details of a flow of the fabrication of an electroforming frame.

First, description will be given to the electroforming frame. The electroforming frame is fabricated by the following method:

FIG. 61 illustrates a flow of the fabrication of the electroforming frame and FIGS. 62(a) to 62(g) illustrate the details of the respective steps in FIG. 61.

Figure 62A:
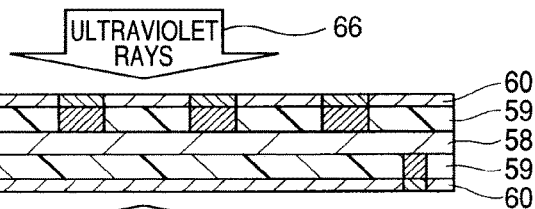
FIG. 62(a) is a drawing illustrating the details of Step St1 in FIG. 61.

First, the processing from resist sticking to exposure, described as Step St1 in FIG. 61, is carried out. FIG. 62(a) illustrates the details of Step St1 in FIG. 61. At this step, a film-like resist 59 is stuck to the front and back surfaces of SUS (stainless steel) 58 and a film mask 60 is placed over the resist 59. Openings are formed beforehand in portions of the film mask 60 corresponding to places where the SUS 58 is to be plated at subsequent plating steps. When the film mask 60 is irradiated with ultraviolet rays 66, the ultraviolet rays 66 are applied only to the resist positioned under the openings in the film mask 60.

Figure 62B:
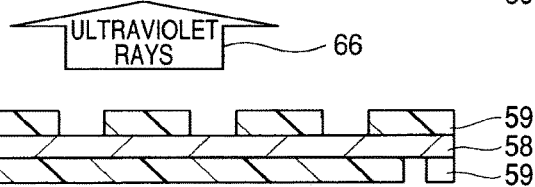
FIG. 62(b) is a drawing illustrating the details of Step St2 in FIG. 61.

Subsequently, the development described as Step St2 in FIG. 61 is carried out. FIG. 62(b) illustrates the details of Step St2 in FIG. 61. At this step, the film mask 60 arranged over the resist 59 is removed and developer is used to elute the resist 59 on the portions to which ultraviolet rays 66 were applied at Step St1 and remove it. As a result, part of the front and back surfaces of the SUS 58 as the base is exposed in the portions where the resist 59 was removed.

Figure 62C:
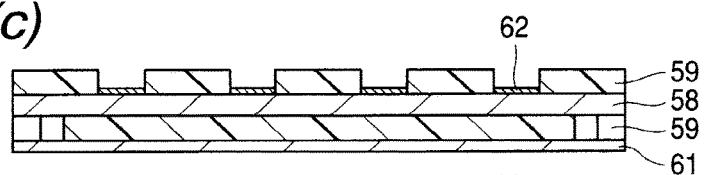
FIG. 62(c) is a drawing illustrating the details of Step St3 in FIG. 61.

Subsequently, the Au plating described as Step St3 in FIG. 61 is carried out. FIG. 62(c) illustrates the details of Step St3 in FIG. 61. At this step, a protective film 61 is stuck to the resist 59 on the back surface side of the SUS 58 and the SUS 58 exposed in the portions where the resist 59 was removed at Step St2 is subjected to Au plating 62. The plating thickness in the Au plating 62 is approximately 0.2 μm.

Figure 62D:
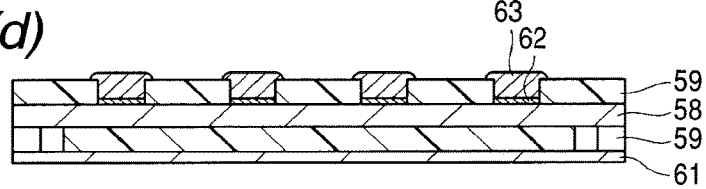
FIG. 62(d) is a drawing illustrating the details of Step St4 in FIG. 61.

Subsequently, the Ni plating described as Step St4 in FIG. 61 is carried out. FIG. 62(d) illustrates the details of Step St4 in FIG. 61. At this step, the Au plating 62 applied at Step St3 is subjected to Ni plating 63. The plating thickness in the Ni plating 63 is approximately 60 μm. The Ni plating 63 is so applied that it is thicker than the thickness of the resist 59 and is larger than each opening in the resist 59 as viewed in a plane. For this reason, the cross-sectional shape of the Ni plating 63 is a mushroom shape. (It has the overhang portion 2i illustrated in FIG. 62(g).) The reason why this shape is adopted will be described later.

Figure 62E:
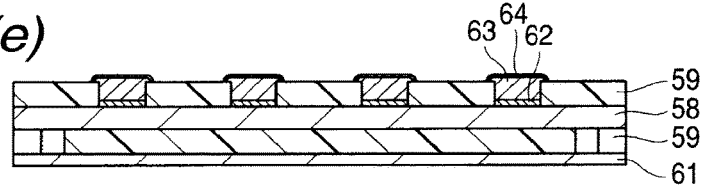
FIG. 62(e) is a drawing illustrating the details of Step St5 in FIG. 61.

Subsequently, the Ag plating described as Step St5 in FIG. 61 is carried out. FIG. 62(e) illustrates the details of Step St5 in FIG. 61. At this step, the Ni plating 63 applied at Step St4 is subjected to Ag plating 64. The plating thickness in the Ag plating 64 is approximately 2.5 μm.

Figure 62F:
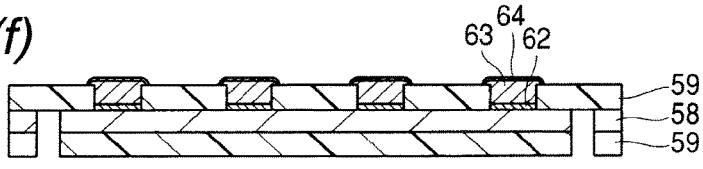
FIG. 62(f) is a drawing illustrating the details of Step St6 in FIG. 61.

Subsequently, the frame etching described as Step St6 in FIG. 61 is carried out. FIG. 62(f) illustrates the details of Step St6 in FIG. 61. At this step, first, the protective film 61 stuck to the resist 59 on the back surface of the SUS 58 is removed and the SUS 58 is further etched with chemical from the openings in the resist 59 to form the outer frame (outline) of a frame.

Figure 62G:
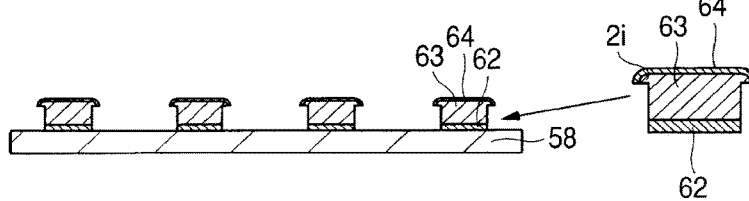
FIG. 62(g) is a drawing illustrating the details of Step St7 in FIG. 61.

Last, the resist removal described as Step St7 in FIG. 61 is carried out. FIG. 62(g) illustrates the details of Step St7 in FIG. 61. At this step, the resist 59 left on the front and back surfaces of the SUS 58 is removed. This completes an electroforming frame in which the Au plating 62, Ni plating 63, and Ag plating 64 are stacked over the SUS 58 in this order.

Figure 63:
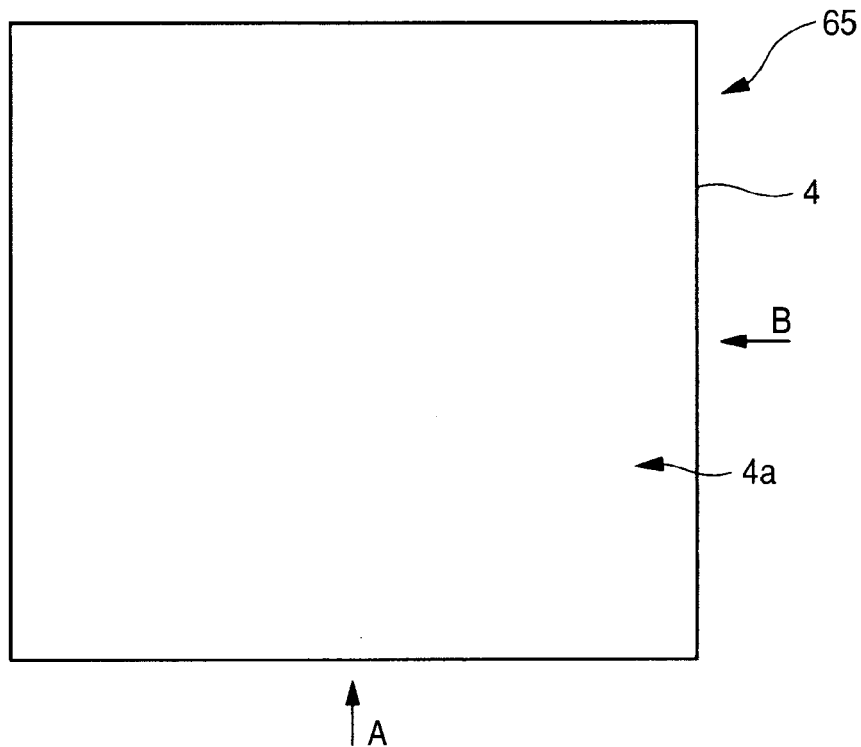
FIG. 63 is a plan view illustrating an example of the structure of a semiconductor device in a sixth embodiment of the invention.
Figure 64:
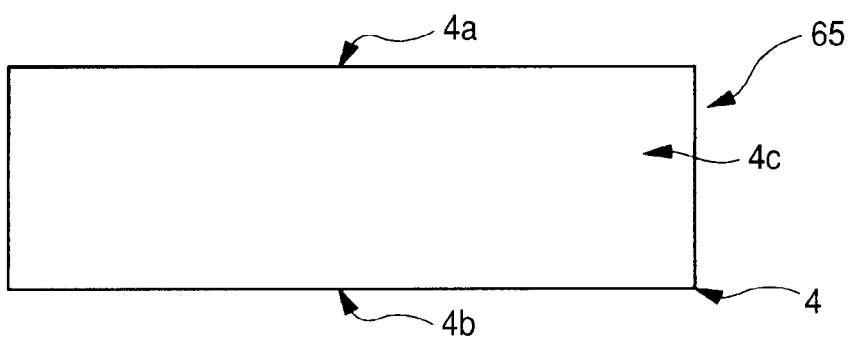
FIG. 64 is a side view illustrating an example of the structure of the semiconductor device illustrated in FIG. 63 as viewed from the direction A.
Figure 65:
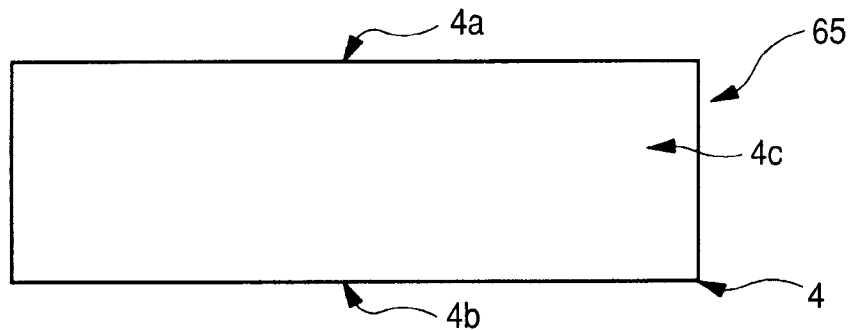
FIG. 65 is a side view illustrating an example of the structure of the semiconductor device illustrated in FIG. 63 as viewed from the direction B.
Figure 66:
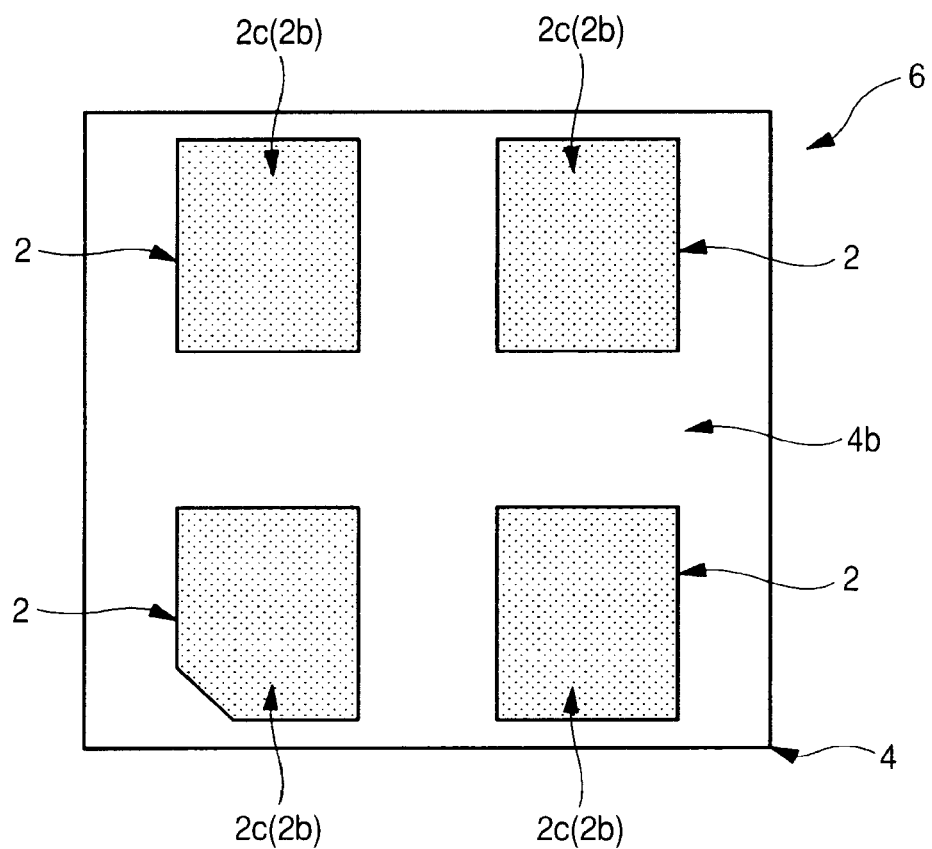
FIG. 66 is a bottom view illustrating an example of the structure of the semiconductor device illustrated in FIG. 63 on the back surface side.
Figure 67:
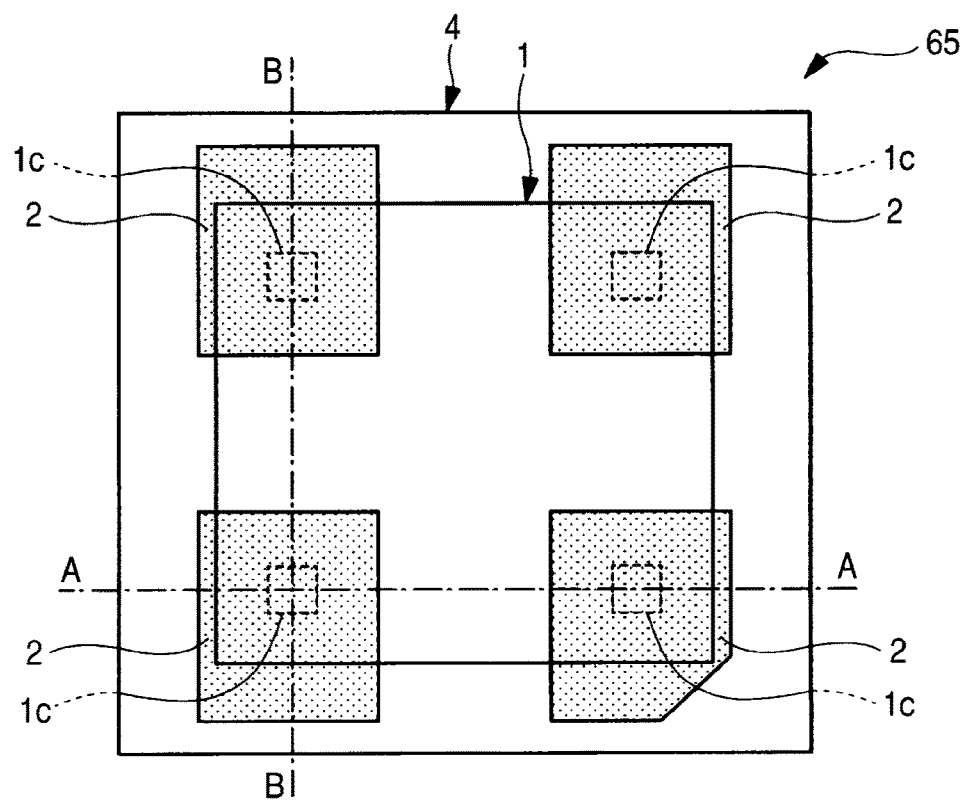
FIG. 67 is a plan view illustrating an example of the structure of the semiconductor device illustrated in FIG. 63 as seen through a sealing body and a semiconductor chip.
Figure 68:
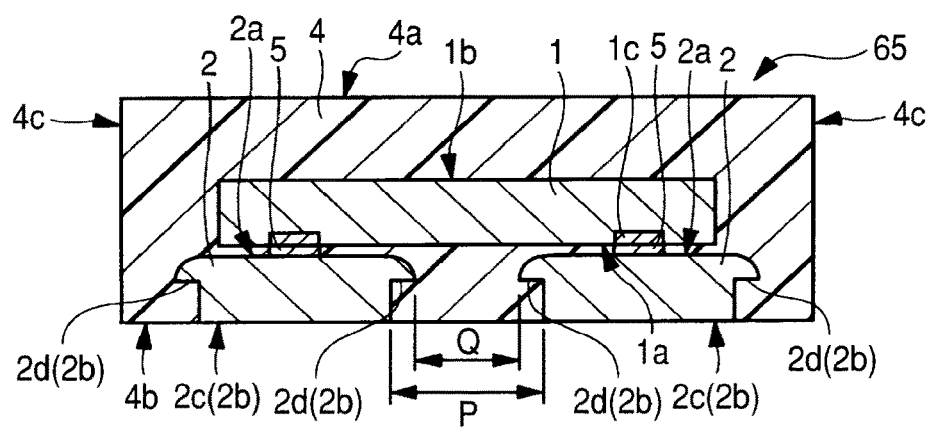
FIG. 68 is a sectional view illustrating an example of the structure cut along line A-A of FIG. 67.
Figure 69:
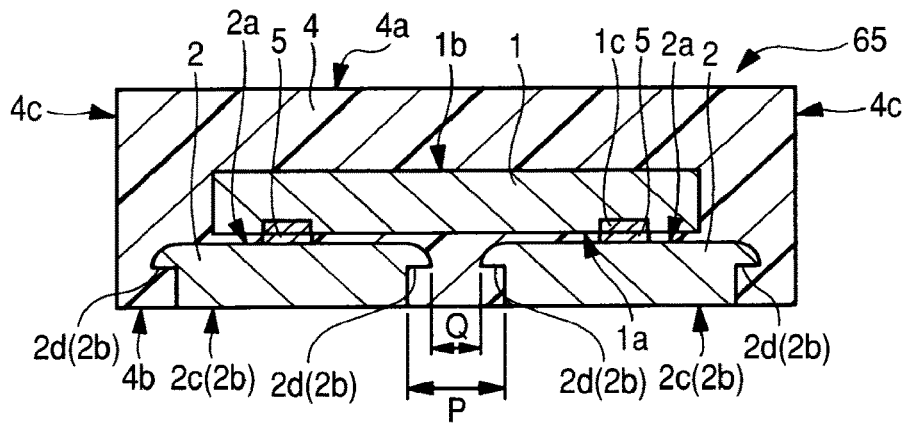
FIG. 69 is a sectional view illustrating an example of the structure cut along line B-B of FIG. 67.
Figure 70:
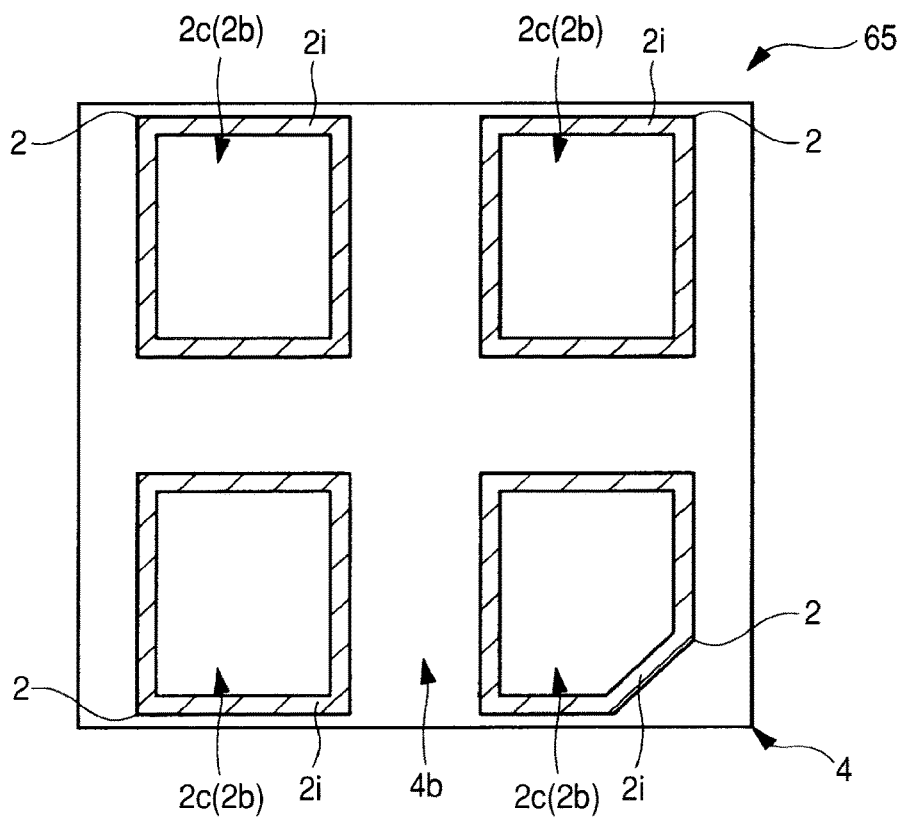
FIG. 70 is a plan view illustrating an example of an area of an overhang portion in the lead terminals of the semiconductor device illustrated in FIG. 63.
Figure 71:
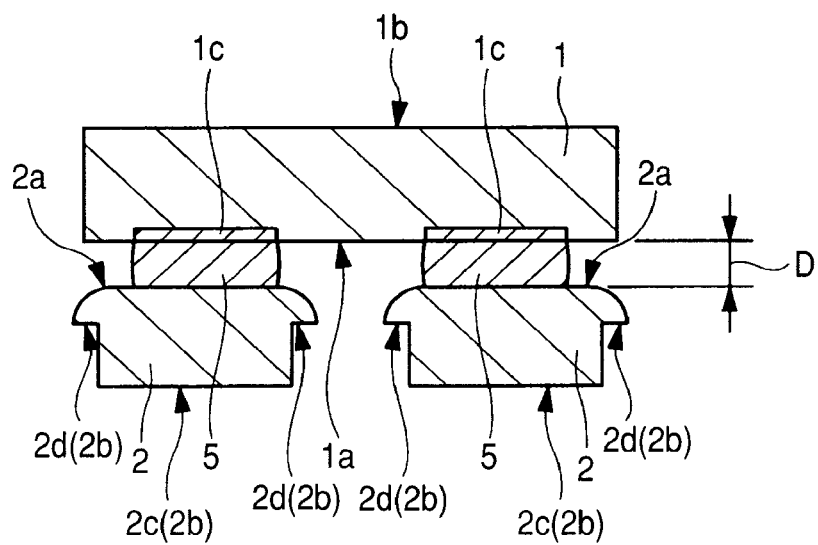
FIG. 71 is an enlarged partial sectional view illustrating an example of the structure of a flip chip bonded portion of the semiconductor device illustrated in FIG. 63.

FIG. 63 is a plan view illustrating an example of the structure of a semiconductor device in the sixth embodiment of the invention; FIG. 64 is a side view illustrating an example of the structure of the semiconductor device illustrated in FIG. 63 as viewed from the direction A; FIG. 65 is a side view illustrating an example of the structure of the semiconductor device illustrated in FIG. 63 as viewed from the direction B; and FIG. 66 is a bottom view illustrating an example of the structure of the semiconductor device illustrated in FIG. 63 on the back surface side. FIG. 67 is a plan view illustrating an example of the structure of the semiconductor device illustrated in FIG. 63 as seen through a sealing body and a semiconductor chip; FIG. 68 is a sectional view illustrating an example of the structure cut along line A-A of FIG. 67; FIG. 69 is a sectional view illustrating an example of the structure cut along line B-B of FIG. 67; FIG. 70 is a plan view illustrating an example of the overhang portions in the lead terminals of the semiconductor device illustrated in FIG. 63; and FIG. 71 is an enlarged partial sectional view illustrating an example of the structure of a flip chip bonded portion of the semiconductor device illustrated in FIG. 63.

Description will be given to the detailed configuration of a semiconductor device 65 with an electroforming frame structure in the sixth embodiment with reference to FIG. 63 to FIG. 71. The semiconductor device 65 includes: a semiconductor chip 1 having a main surface 1a with multiple electrode pads is (Refer to FIG. 68) formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and a sealing body 4 having a main surface 4a and a back surface 4b located on the opposite side to the main surface 4a.

As illustrated in FIG. 66 and FIG. 67, the semiconductor device 65 has four lead terminals 2. As illustrated in FIG. 68 and FIG. 69, each of the four lead terminals 2 has its upper surface 2a electrically coupled with a corresponding electrode pad 1c of the semiconductor chip 1 through a bump. That is, the semiconductor chip 1 is flip chip bonded to the four lead terminals 2 through multiple bumps. The chief material of the bumps is, for example, gold. Therefore, the semiconductor chip 1 is flip chip bonded to the four lead terminals 2 through the gold bumps 5.

As illustrated in FIG. 68 and FIG. 69, the lower surface 2b of each of the four lead terminals 2 has: a first lower surface 2c exposed in the back surface 4b of the sealing body 4; and a second lower surface 2d positioned between the upper surface 2a and first lower surface 2c of the one of the four lead terminals 2 and arranged in the sealing body 4. The distance (lead thickness) from each upper surface 2a to the corresponding second lower surface 2d is shorter (thinner) than the distance (lead thickness) from the upper surface 2a to the corresponding first lower surface 2c.

In the semiconductor device 65, the respective first lower surfaces 2c of the four lead terminals 2 are exposed in the back surface 4b of the sealing body 4; and the first lower surface 2c of each of the four lead terminals 2 makes an external terminal of the semiconductor device 65 in the sixth embodiment.

As described in relation to the manufacturing method for the electroforming frame, the second lower surface 2d of each of the four lead terminal 2 is formed by taking the following measure: the Ni plating 63 is applied so that it is larger than each opening in the resist 59 (the overhang portions 2i shaded in FIG. 70) as viewed in a plane. In each lead terminal 2, for this reason, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface).

Therefore, also in the semiconductor device 65 in the sixth embodiment, as illustrated in FIG. 68 and FIG. 69, the following takes place as viewed in a plane: the distance P between adjacent first lower surfaces 2c of the four lead terminals 2 is longer than the distance Q between adjacent upper surfaces 2a thereof (P>Q). The distance P between adjacent first lower surfaces 2c of the four lead terminals 2 and the distance Q between adjacent upper surfaces 2a thereof are taken in the direction along the direction of arrangement of the four lead terminals 2. However, the relation of P>Q also holds in the distances in the directions of the diagonal lines of the four lead terminals 2.

Also in the semiconductor device 65 in the sixth embodiment, as mentioned above, the production of a solder bridge can be suppressed when it is solder mounted to a mounting board or the like by taking the following measure: the distance between adjacent first lower surfaces 2c of the four lead terminals 2 exposed in the back surface 4b of the sealing body 4 is made longer than the distance between adjacent upper surfaces 2a thereof.

Each lead terminal 2 has the overhang portion 2i and the lower surface of each overhang portion 2i, that is, its portion as the second lower surface 2d bites into the sealing body 4. The adoption of this structure is intended to prevent coming-off of a lead terminal 2. The mushroom-like cross-sectional shape of the Ni plating 63 described in relation to Step St4 in FIG. 61 and FIG. 62(d) is also intended to prevent the same.

As the result of the foregoing, it is possible to reduce the size and thickness of the semiconductor device 65 and further enhance the reliability of the semiconductor device 65.

The other respects in the structure and the other effects of the semiconductor device 65 in the sixth embodiment are the same as those of the semiconductor package 6 in the first embodiment and description thereof will be omitted.

Figure 72:
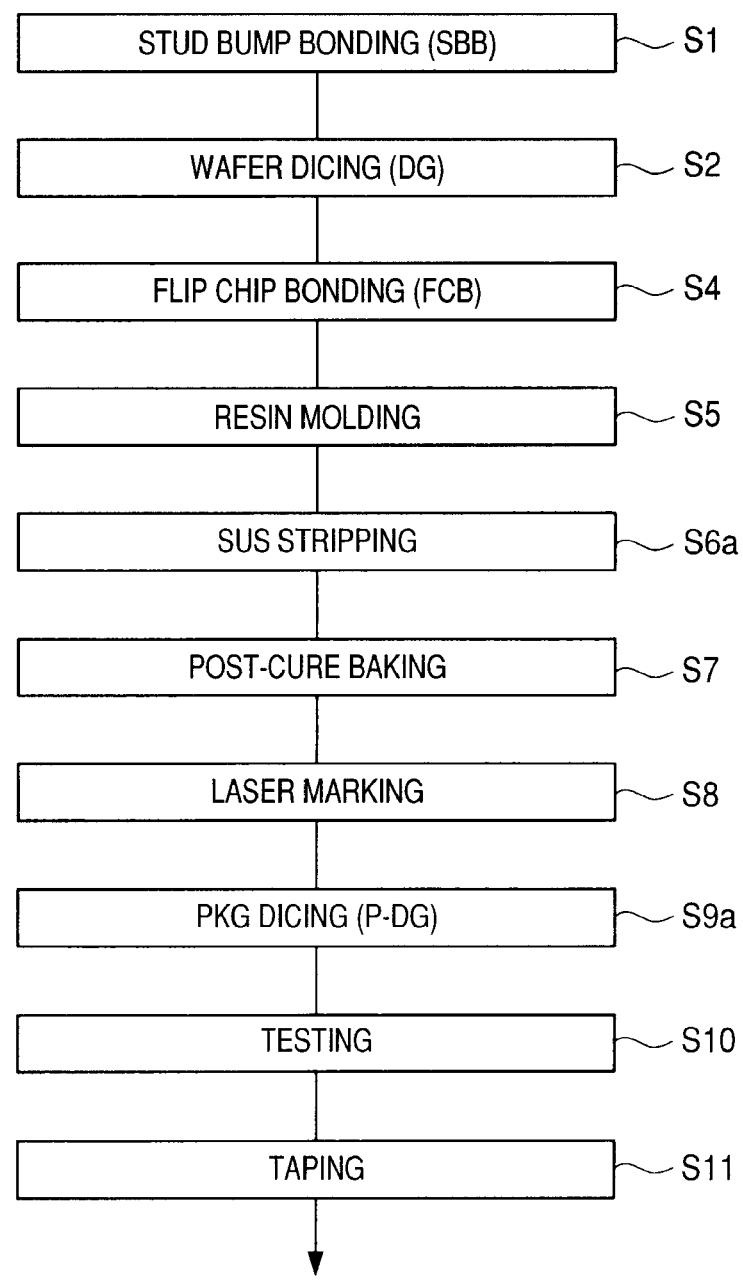
FIG. 72 is a manufacturing flowchart illustrating an example of the assembling procedure for a semiconductor device in the sixth embodiment of the invention.

Description will be given to a manufacturing method for the semiconductor device 65 in the sixth embodiment. The manufacturing method for the semiconductor device 65 in the sixth embodiment is basically the same as that described above in relation to the third embodiment. FIG. 72 is a manufacturing flowchart illustrating an example of the assembling procedure for a semiconductor device in the sixth embodiment of the invention. It is different from the manufacturing flowchart in FIG. 22 in three points:

First, in the flow of manufacture in FIG. 72, the step for frame tape sticking described as Step S3 in FIG. 22 is deleted. This is one of the effects of the replacement of the etching frame with the electroforming frame. Since the SUS 58 fulfills the role of the frame tape 13, the necessity for the frame tape 13 can be obviated.

Figure 73:
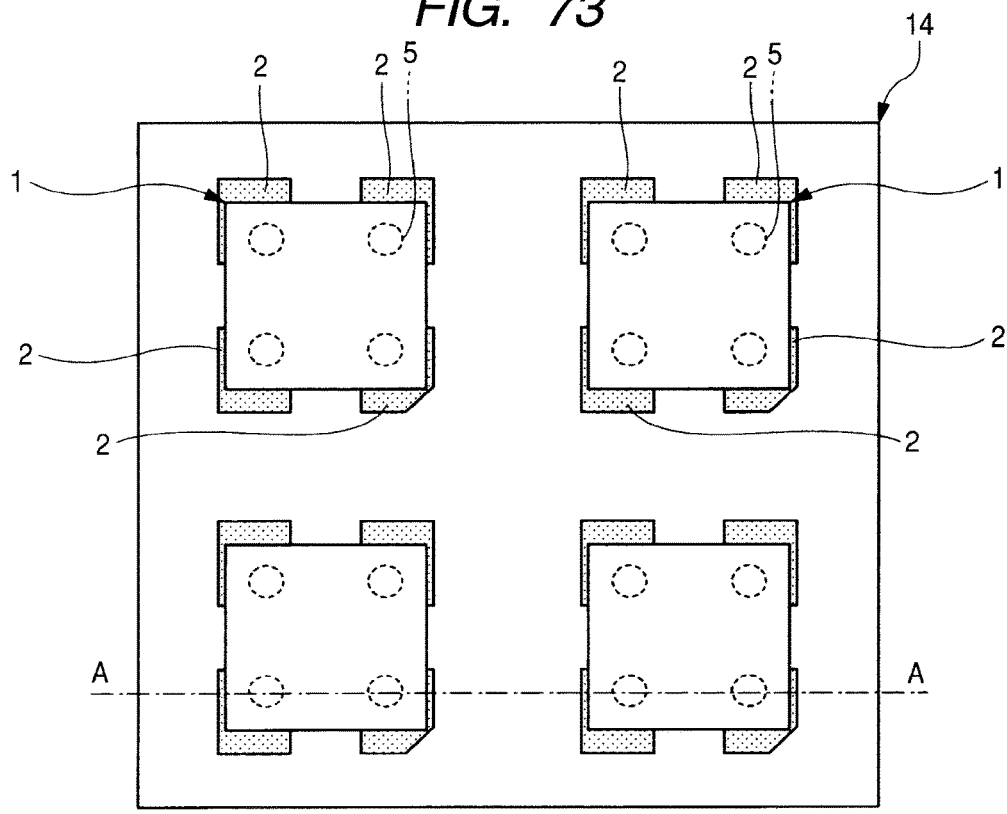
FIG. 73 is a plan view illustrating an example of the structure after SUS stripping in the assembly of the semiconductor device in FIG. 72.
Figure 74:
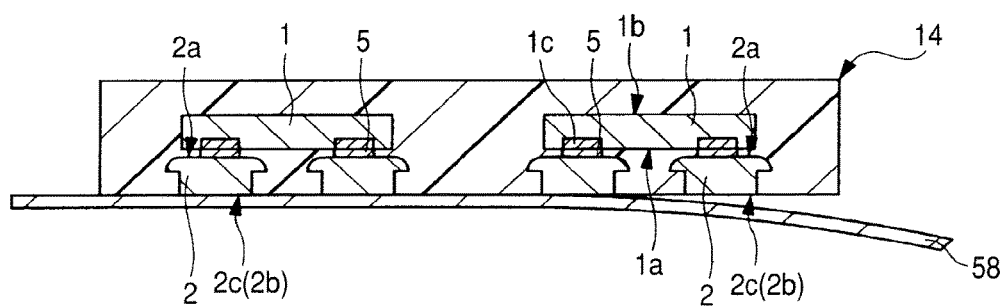
FIG. 74 is a sectional view illustrating an example of the structure cut along line A-A of FIG. 73.

Second, the step for tape stripping described as Step S6 in FIG. 22 is replaced with the SUS stripping step described as Step S6a in FIG. 72. FIG. 73 is a plan view illustrating an example of the structure after the SUS stripping in the assembly of the semiconductor device in FIG. 72. FIG. 74 is a sectional view illustrating an example of the structure cut along line A-A of FIG. 73. As illustrated in FIG. 73 and FIG. 74, the SUS 58 stuck to the back surface of the blanket sealing body 14 (the lower surface of each lead terminal 2) is stripped.

Figure 75:
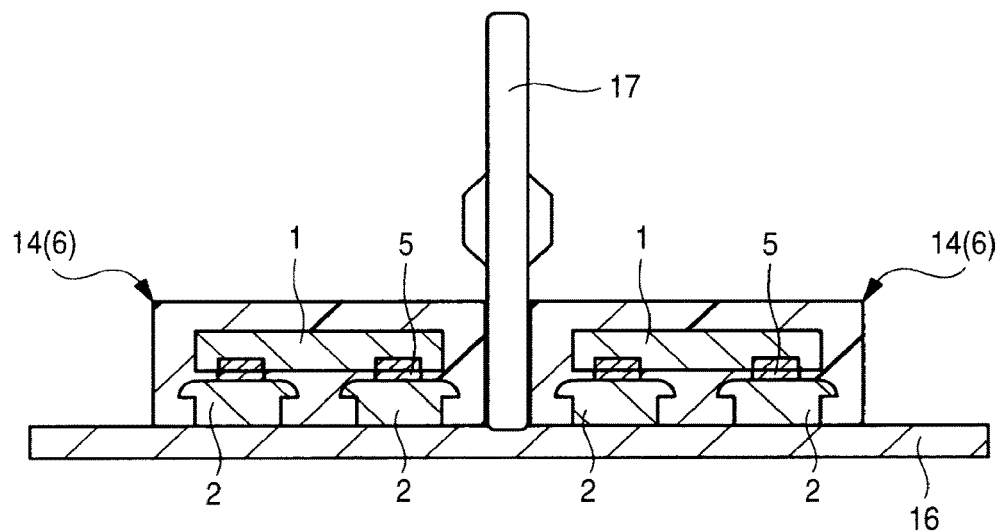
FIG. 75 is a sectional view illustrating an example of the detailed structure during PKG dicing.
Figure 76:
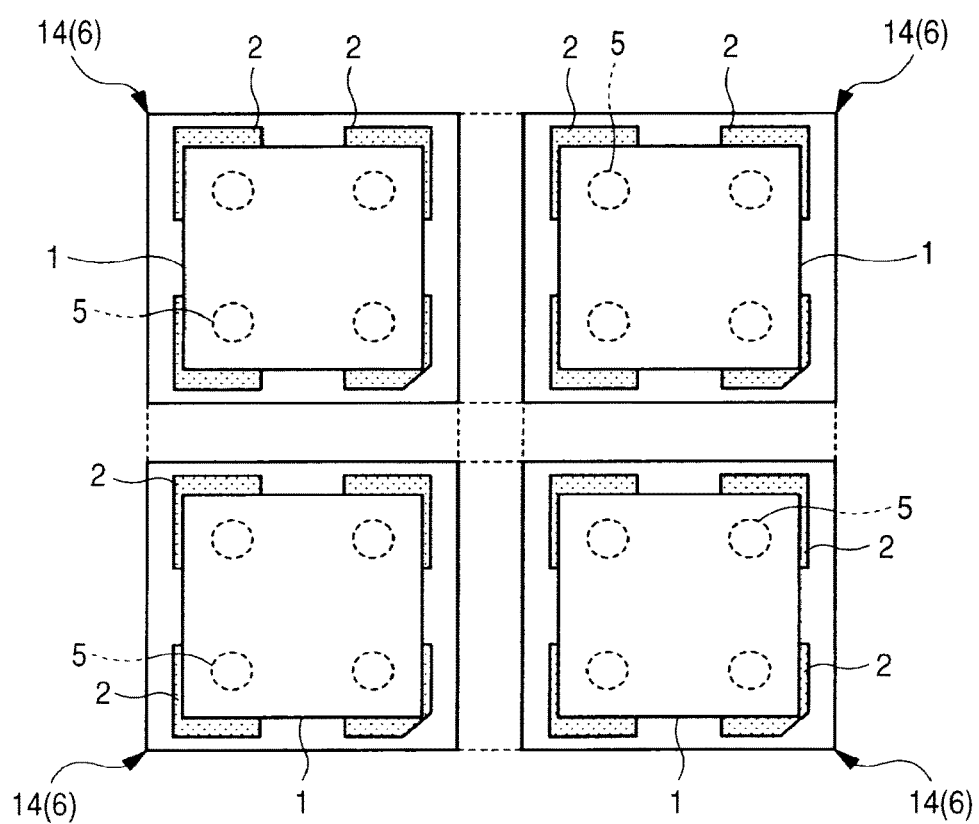
FIG. 76 is a plan view illustrating an example of the structure after the PKG dicing illustrated in FIG. 75.

Third, the PKG dicing step is different. At the step for PKG dicing (P-DG) described as Step S9 in FIG. 22, two materials, the blanket sealing body 14 and the lead terminals 2 are cut. In the dicing (P-DG) at Step S9a in FIG. 72, meanwhile, only the material of the blanket sealing body 14 is cut. FIG. 75 is a sectional view illustrating an example of the detailed structure at the time of PKG dicing and FIG. 76 is a plan view illustrating an example of the structure after the PKG dicing illustrated in FIG. 75. The semiconductor device 65 in the sixth embodiment uses an electroforming frame and each lead terminal 2 is individually formed by stacking plating layers as described above. Therefore, there is no portion laid across (coupling together) individual packages (semiconductor devices) unlike the etching frame. This makes it unnecessary to cut the lead terminals 2 in PKG dicing. As mentioned above, use of the electroforming frame obviates the necessity for cutting lead terminals and only the blanket sealing body 14 is cut. Therefore, it is possible to enhance the traveling speed of a blade in dicing as compared with cases where an etching frame is used. Since the lead terminals harder than the blanket sealing body 14 are not cut, the durability of the blade can be enhanced. This also leads to the shortening of the process time of the PKG dicing step and the reduction of jig and tool costs and thus it is effective in reducing the cost of the entire semiconductor device.

(Seventh Embodiment)

Figure 77:
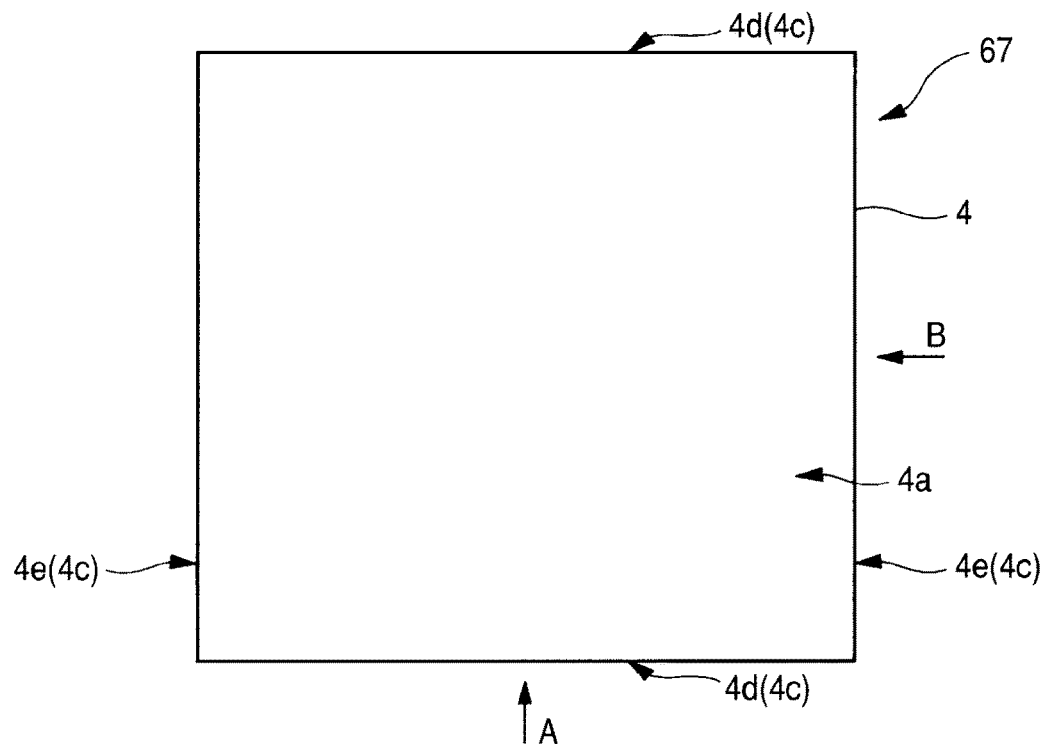
FIG. 77 is a plan view illustrating an example of the structure of a semiconductor device in a seventh embodiment of the invention.
Figure 78:
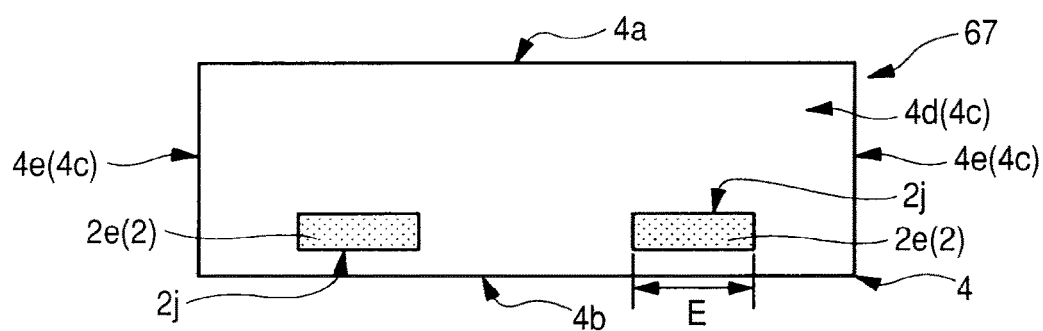
FIG. 78 is a side view illustrating an example of the structure of the semiconductor device illustrated in FIG. 77 as viewed from the direction A.
Figure 79:
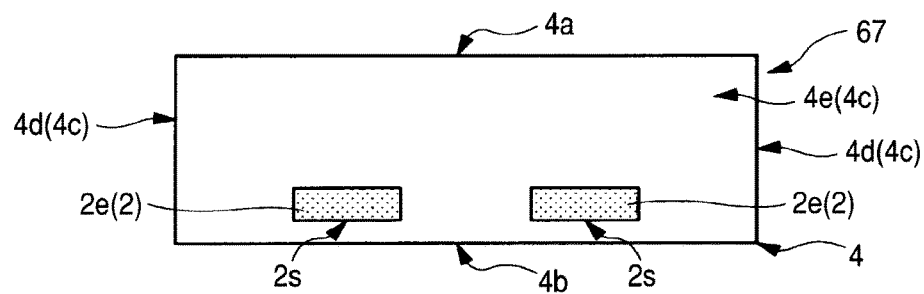
FIG. 79 is a side view illustrating an example of the structure of the semiconductor device illustrated in FIG. 77 as viewed from the direction B.
Figure 80:
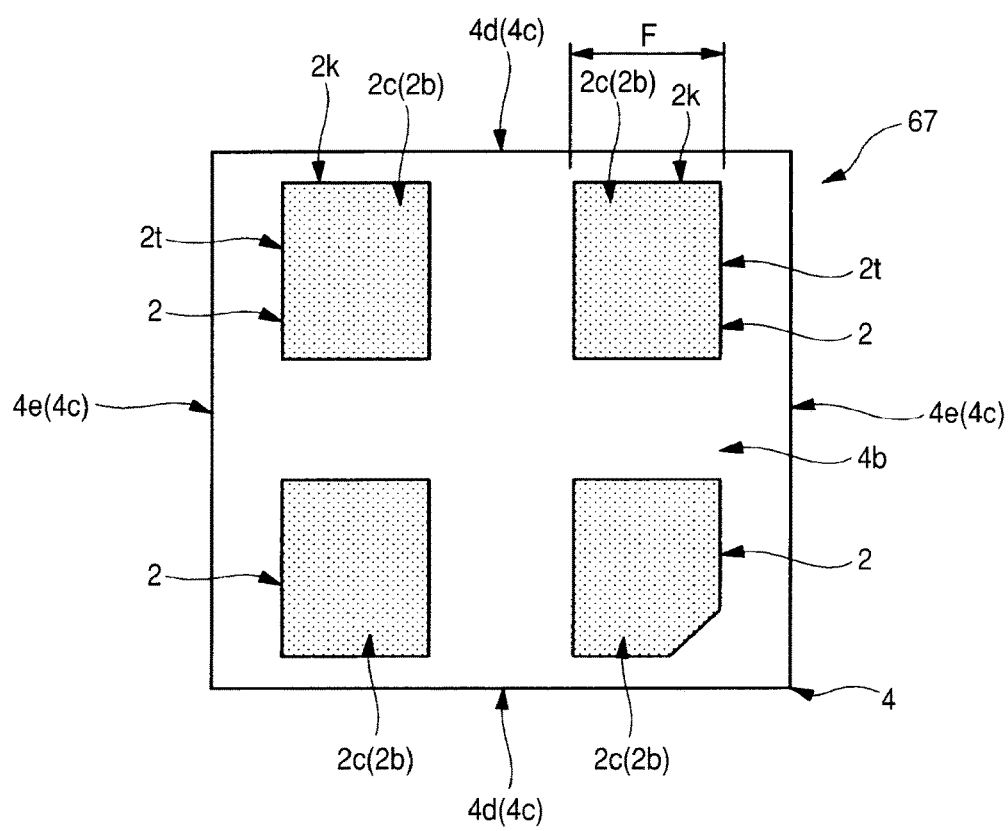
FIG. 80 is a bottom view illustrating an example of the structure of the semiconductor device illustrated in FIG. 77 on the back surface side.
Figure 81:
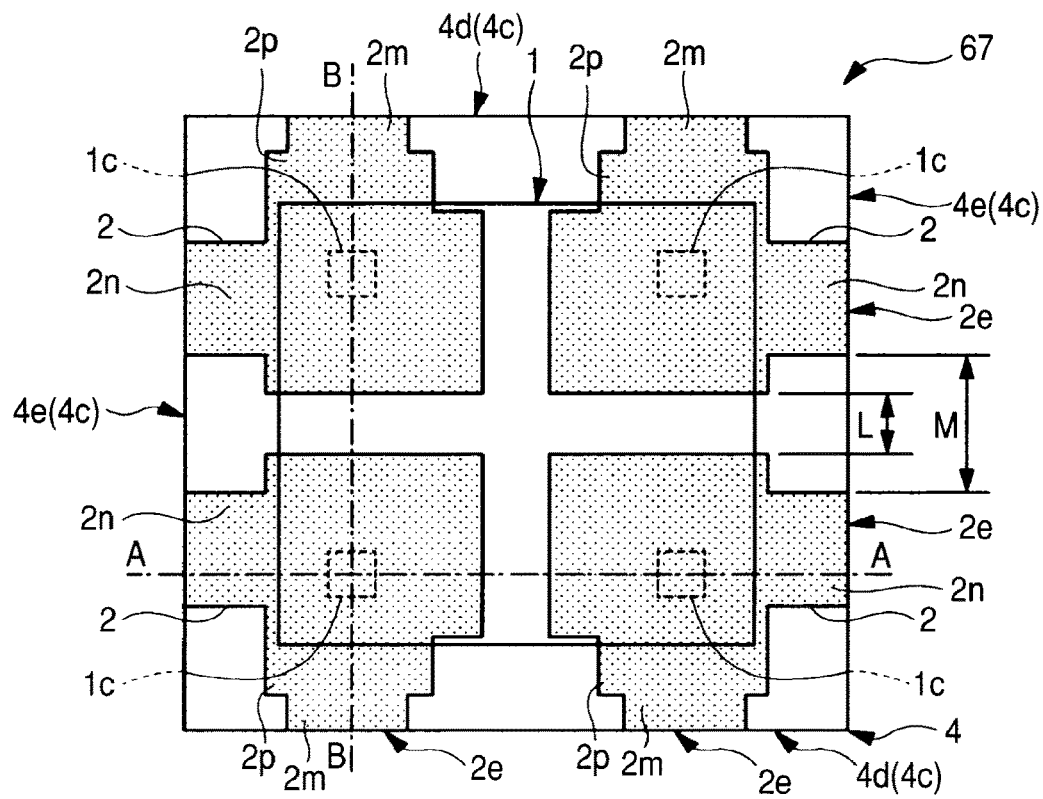
FIG. 81 is a plan view illustrating an example of the structure of the semiconductor device illustrated in FIG. 77 as seen through a sealing body and a semiconductor chip.
Figure 82:
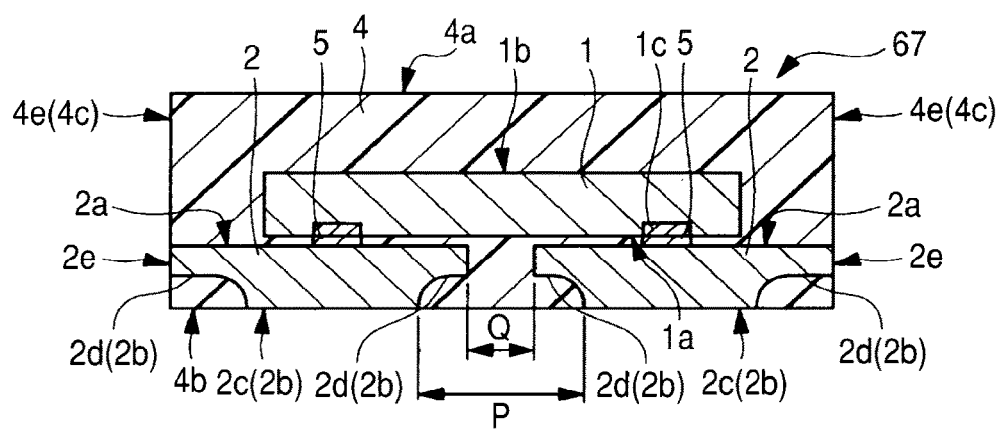
FIG. 82 is a sectional view illustrating an example of the structure cut along line A-A of FIG. 81.
Figure 83:
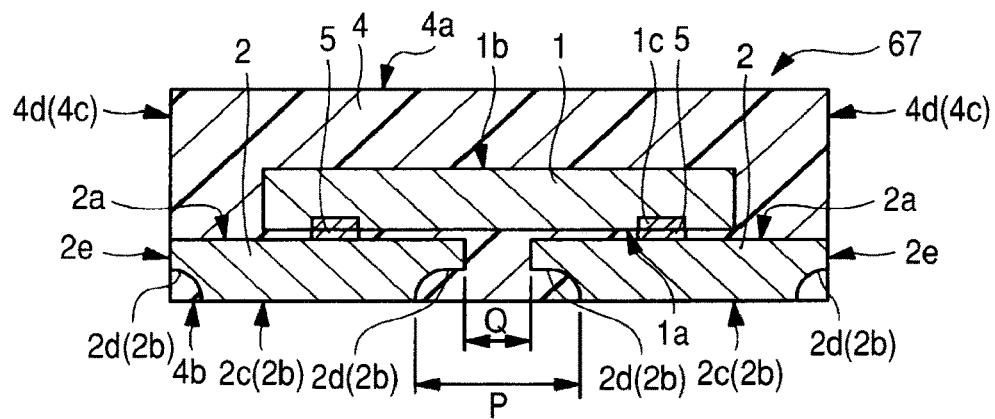
FIG. 83 is a sectional view illustrating an example of the structure cut along line B-B of FIG. 81.
Figure 84:
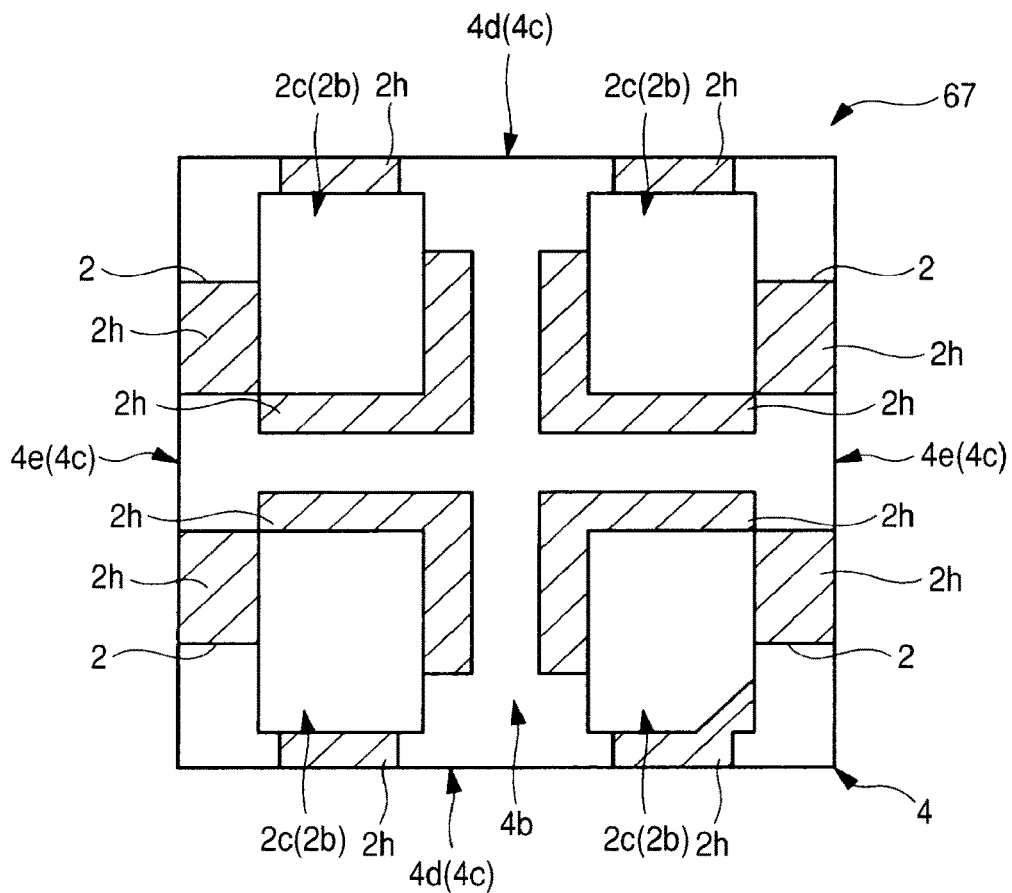
FIG. 84 is a plan view illustrating an example of half etching areas in the lead terminals of the semiconductor device illustrated in FIG. 77.

FIG. 77 is a plan view illustrating an example of the structure of a semiconductor device in the seventh embodiment of the invention; FIG. 78 is a side view illustrating an example of the structure of the semiconductor device illustrated in FIG. 77 as viewed from the direction A; FIG. 79 is a side view illustrating an example of the structure of the semiconductor device illustrated in FIG. 77 as viewed from the direction B; and FIG. 80 is a bottom view illustrating an example of the structure of the semiconductor device illustrated in FIG. 77. FIG. 81 is a plan view illustrating an example of the structure of the semiconductor device illustrated in FIG. 77 as seen through a sealing body and a semiconductor chip; FIG. 82 is a sectional view illustrating an example of the structure cut along line A-A of FIG. 81; FIG. 83 is a sectional view illustrating an example of the structure cut along line B-B of FIG. 81; and FIG. 84 is a plan view illustrating an example of half etching areas in the lead terminals of the semiconductor device illustrated in FIG. 77.

The semiconductor device in the seventh embodiment illustrated in FIG. 77 to FIG. 84 is a small resin-sealed semiconductor package 67 assembled using a lead frame like the semiconductor package 6 in the first embodiment.

In the semiconductor package 67 in the seventh embodiment, the following measure is taken: the width of each lead terminal 2 along first side surfaces 4d as one set of the opposite side surfaces 4c of the sealing body 4 is increased as compared with the semiconductor package 6 in the first embodiment.

The reason why the width of each lead terminal 2 is increased is to enhance the degree of freedom in the pad arrangement of the electrode pads 1c of the semiconductor chip 1 in flip chip bonding (to enhance the flexibility of flip chip bonding). In this example, the width is increased by 0.06 mm or so as compared with each lead terminal 2 of the semiconductor package 6 in the first embodiment to expand the flip chip bonding areas. Each lead terminal 2 has offset portions (half etched portions 2h) buried in the sealing body 4 for the following purposes: to reduce stress during dicing for package segmentation; to reduce plate burrs during dicing; and to enhance the pull-out strength of the lead terminal 2. The degree of adhesion between the metal lead terminals 2 and resin is originally lower than the degree of adhesion between the semiconductor chip 1 and the resin. When the width of each lead terminal 2 is increased, consequently, the following takes place: the straight line length of each place where the metal lead terminal 2 and the resin are in contact with each other is further lengthened. This further reduces the degree of adhesion between the lead terminal 2 and the resin and as a result, the holding force of the resin at each offset portion (half etched portion 2h) (the adhesion between the lead terminal 2 and the resin) is weakened.

If package dicing is carried out in this state, peeling may be caused in the boundary between a lead terminal 2 and the resin by stress during dicing.

The semiconductor package 67 in the seventh embodiment illustrated in FIG. 77 to FIG. 84 has a structure that makes it possible to reduce peeling between a lead terminal 2 and resin during dicing.

The basic structure of the semiconductor package 67 in the seventh embodiment is the same as that of the semiconductor package 6 in the first embodiment.

Description will be given to the configuration of the semiconductor package 67 in the seventh embodiment with reference to FIG. 77 to FIG. 84. The semiconductor package 67 includes: a semiconductor chip 1 having a main surface 1a with multiple electrode pads (terminals) is formed therein and a back surface 1b located on the opposite side to the main surface 1a; multiple lead terminals 2 each having an upper surface 2a with the semiconductor chip 1 placed thereover and a lower surface 2b located on the opposite side to the upper surface 2a; and a sealing body 4 having a main surface 4a and a back surface 4b located on the opposite side to the main surface 4a.

The semiconductor package 67 has four lead terminals 2. As illustrated in FIG. 82 and FIG. 83, each of the four lead terminals 2 has its upper surface 2a electrically coupled with a corresponding electrode pad 1c of the semiconductor chip 1 through a gold bump 5. That is, the semiconductor chip 1 is flip chip bonded to the four lead terminals 2 through the multiple gold bumps 5.

As illustrated in FIG. 82 and FIG. 83, the lower surface 2b of each of the four lead terminals 2 has: a first lower surface 2c exposed in the back surface 4b of the sealing body 4; and a second lower surface 2d positioned between the upper surface 2a and first lower surface 2c of the one of the four lead terminals 2 and arranged in the sealing body 4. The distance (lead thickness) from each upper surface 2a to the corresponding second lower surface 2d is shorter (thinner) than the distance (lead thickness) from the upper surface 2a to the corresponding first lower surface 2c.

As illustrated in FIG. 80, that is, the respective first lower surfaces 2c of the four lead terminals 2 are exposed in the back surface 4b of the sealing body 4; and the first lower surface 2c of each of the four lead terminals 2 makes an external terminal of the semiconductor device in the seventh embodiment.

The second lower surface 2d of each of the four lead terminals 2 is formed by half etching the back surface of the corresponding lead terminal 2. As illustrated in FIG. 82 and FIG. 83, each second lower surface 2d is formed by shaving the peripheral portion of the back surface of the corresponding lead terminal 2 by half etching. FIG. 84 shows the half etching areas of each lead terminal 2 as seen through the sealing body 4 from the back surface 4b side. In FIG. 84, the shaded areas indicate half etched portions 2h as areas subjected to half etching. In the half etched portions 2h of each lead terminal 2, therefore, the lead terminal 2 is reduced in thickness. The surfaces of the respective thinned areas of the lead terminals 2 facing toward the back surface 4b of the sealing body 4 are the second lower surfaces 2d.

As mentioned above, the peripheral portion of the back surface of each lead terminal 2 is half etched. In each lead terminal 2, as a result, the area of the first lower surface 2c exposed in the back surface 4b of the sealing body 4 is smaller than the area of the upper surface 2a where the semiconductor chip 1 is flip chip bonded (the area of the upper surface 2a>the area of the first lower surface 2c).

Therefore, in the semiconductor package 67, as illustrated in FIG. 82 and FIG. 83, the following takes place as viewed in a plane: the distance P between adjacent first lower surfaces 2c of the four lead terminals 2 is longer than the distance Q between adjacent upper surfaces 2a thereof (P>Q). The distance P between adjacent first lower surfaces 2c of the four lead terminals 2 and the distance Q between adjacent upper surfaces 2a thereof are taken in the direction along the direction of arrangement of the four lead terminals 2. However, the relation of P>Q also holds in the distances in the directions of the diagonal lines of the four lead terminals 2.

Each of the four lead terminals 2 has two side surfaces 2e continuing into its upper surface 2a and second lower surface 2d. As illustrated in FIG. 78 and FIG. 79, two of eight side surfaces 2e in total are exposed in each of the four side surfaces 4c (two first side surfaces 4d and two second side surfaces 4e) of the sealing body 4.

In each side surface 4c of the sealing body 4, part of the side surface 4c of the sealing body 4 is arranged around the exposed side surfaces 2e of each lead terminal 2. More specific description will be given to the exposed side surfaces 2e of each lead terminal 2. The peripheral portion of the back surface of each lead terminal 2 is shaven by half etching and formed in a recessed shape. Molding resin is filled so that the recessed portions (second lower surfaces 2d) are covered therewith. As a result, the exposed side surfaces 2e of each lead terminal 2 are encircled with part of the side surfaces 4c of the sealing body 4. That is, they become the offset portions (half etched portions 2h).

In each side surface 4c of the sealing body 4, as illustrated in FIG. 81, the distance M between adjacent side surfaces 2e of the four lead terminals 2 is longer than the distance L between adjacent upper surfaces 2a thereof (M>L). (The side surfaces 4c of the sealing body 4 are comprised of the following side surfaces: first side surfaces 4d belonging to one of two sets of opposite side surfaces and second side surfaces 4e that intersect with the first side surfaces 4d and belong to the other of the two sets.)

Description will be given to features (different from those of the semiconductor package 6 in the first embodiment) of the semiconductor package 67 in the seventh embodiment.

In the semiconductor package 67, each of the lead terminals is so formed that the following is implemented: its first side located on the side surface side of the lead terminal 2 exposed in a side surface 4c of the sealing body 4, illustrated in FIG. 78, will be designated as first side 2j and the length of the first side 2j will be taken as E. The following first side illustrated in FIG. 80 will be designated as first side 2k: a first side located on the first lower surface 2c side of the lead terminal 2 exposed in the back surface 4b of the sealing body 4 and positioned in the same direction as the side surface-side first side (first side 2j). The length of the first side 2k will be taken as F. The lead terminals are so formed that the length E of each first side 2j is shorter than the length F of each first side 2k (E<F).

More detailed description will be given. As illustrated in FIG. 81, the following measure is taken in each of the four lead terminals 2 of the semiconductor package 67: the width of an end portion 2m including a side surface 2e of the lead terminal 2 exposed in a first side surface 4d belonging to one of the two sets of opposite side surfaces of the four side surfaces 4c of the sealing body 4 is made smaller than the width of its base portion 2p. In other words, each lead terminal 2 is in such a shape that the corners of its end portion 2m on both sides are cut to make the width of the tip of its end portion 2m narrower than the width of its base portion 2p.

As a result, the length E of the first side 2j is shorter than the length F of the first side 2k. The first side (side surface-side first side) 2j is that of the side surface 2e of each lead terminal 2 exposed in a first side surface 4d of the sealing body 4 as illustrated in FIG. 78. The first side (lower surface-side first side) 2k is that of the first lower surface 2c of the lead terminal 2 exposed in the back surface 4b of the sealing body 4, positioned in the same direction as the first side 2j, as illustrated in FIG. 80.

As illustrated in FIG. 81, the width of each the following end portion is not reduced: the end portion 2n including the side surface 2e of each lead terminal 2, exposed in a second side surface 4e belonging to the other of the two sets of opposite side surfaces of the four side surfaces 4c of the sealing body 4. In other words, neither of the corners of the other end portion 2n of each lead terminal 2 on both sides is cut.

As mentioned above, the width of the end portion 2m including the side surface 2e of each lead terminal 2 exposed in a first side surface 4d belonging to one of two sets of opposite side surfaces of the four side surfaces 4c of the sealing body 4 is made narrower than its base portion 2p. As a result, it is possible to shorten the straight line length of each place where a lead terminal 2 and the resin are in contact with each other in an offset portion (half etched portion 2h).

The assembling method for the semiconductor package 67 in the seventh embodiment is the same as the assembling method for the semiconductor package 6 described in relation to the third embodiment and repetitive description thereof will be omitted. A sheet-like lead frame 12 (Refer to FIG. 26) is prepared. In this lead frame, multiple lead terminals 2 are so formed that the distance between the first lower surfaces 2c illustrated in FIG. 82 is longer than the distance between the upper surfaces 2a (P>Q) as viewed in the plane illustrated in FIG. 81; and the width of the end portion 2m of part of each lead terminal 2 is narrower than the width of its base portion 2p. The semiconductor package is assembled using this lead frame 12. In this assembly, the lead terminals are so formed that the length E of the first side 2j is shorter than the length F of the first side 2k (E<F). The first side 2j (side surface-side first side) is that of the side surface 2e of each lead terminal 2 exposed in a side surface 4c (first side surface 4d) of the sealing body 4, illustrated in FIG. 78. The first side 2k is that of the first lower surface 2c of the lead terminal 2 exposed in the back surface 4b of the sealing body 4, positioned in the same direction as the first side 2j, illustrated in FIG. 80.

According to the semiconductor package 67 in the seventh embodiment and the assembling method therefor, the same effects as in the semiconductor package 6 in the first embodiment can be obtained. More specific description will be given. As mentioned above, the distance between adjacent first lower surfaces 2c of the four lead terminals 2 exposed in the back surface 4b of the sealing body 4 is longer than the distance between adjacent upper surfaces 2a of the lead terminals 2. (The distance between adjacent upper surfaces 2a of the four lead terminals 2 is shorter than the distance between adjacent first lower surfaces 2c located on the back surface 4b side of the sealing body 4.) This achieves two things: suppression of the production of a solder bridge when the semiconductor device is solder mounted and expansion of the range of size of semiconductor chips that can be placed. As a result, it is possible to reduce the size and thickness of the semiconductor package 67 and further enhance the reliability of the semiconductor package 67.

Further, in the semiconductor package 67 in the seventh embodiment, as mentioned above, the length E of the first side 2j is made shorter than the length F of the first side 2k. The first side 2j is that of the side surface 2e of each lead terminal 2, exposed in a first side surface 4d (side surface 4c) of the sealing body 4. The first side 2k is that of the first lower surface 2c of the lead terminal 2 exposed in the back surface 4b of the sealing body 4. This increases the places of the offset portions (half etched portions 2h) of the lead terminals 2 encircled with the resin. Therefore, it is possible to further enhance the pull-out strength of each lead terminal 2.

According to the assembly of the semiconductor package 67, the straight line length of each place where the lead terminal 2 and the resin are in contact with each other in an offset portion (half etched portion 2h) is shortened. As a result, reduction in the degree of adhesion between each lead terminal 2 and the resin can be suppressed. Even though stress is produced by friction between the work piece and a dicing blade 17 (Refer to FIG. 34) or the like during dicing, peeling of the lead terminal 2 and the resin from each other can be reduced.

As mentioned above, the length E of the first side 2j is shorter than the length F of the first side 2k. The first side 2j is that of the side surface 2e of each lead terminal 2 exposed in a first side surface 4d of the sealing body 4. The first side 2k is that of the first lower surface 2c of the lead terminal 2 exposed in the back surface 4b of the sealing body 4. This makes it possible to reduce the cross-sectional area of each lead terminal 2 to be cut during dicing and thus reduce stress produced during dicing.

As a result, it is possible to reduce the occurrence of peeling of each lead terminal 2 and the resin from each other during dicing.

Since the amount of each lead terminal 2 cut with the dicing blade 17 during dicing can be reduced, the life of the dicing blade 17 can be lengthened.

The other respects in structure and the other effects of the semiconductor package 67 in the seventh embodiment and the other effects obtained by the assembling method for the semiconductor package 67 are the same as the following: the other respects in structure and the other effects of the semiconductor package 6 in the first embodiment and the other effects obtained by the assembling method therefor. Therefore, the description thereof will be omitted.

Description will be given to modifications to the seventh embodiment.

Figure 85:
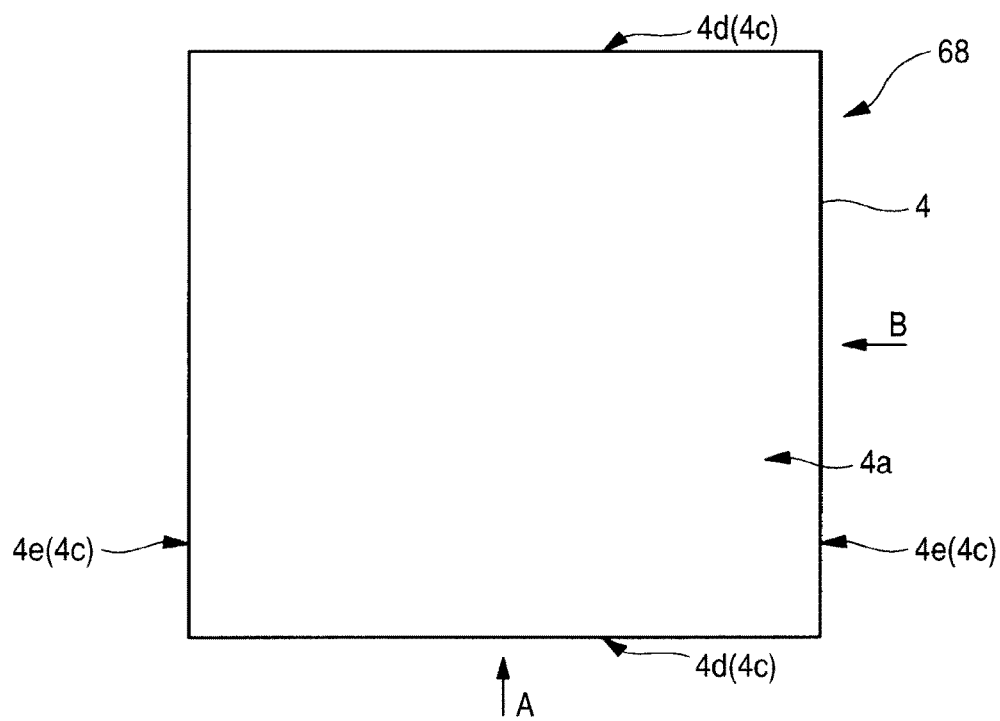
FIG. 85 is a plan view illustrating the structure of a semiconductor device in a first modification to the seventh embodiment of the invention.
Figure 86:
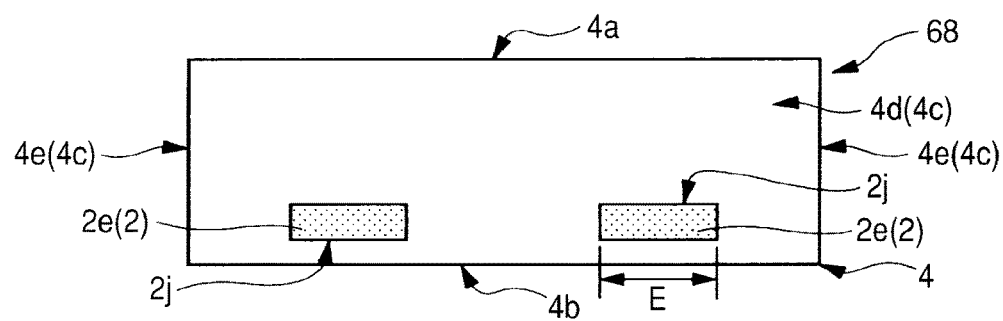
FIG. 86 is a side view illustrating an example of the structure of the semiconductor device illustrated in FIG. 85 as viewed from the direction A.
Figure 87:
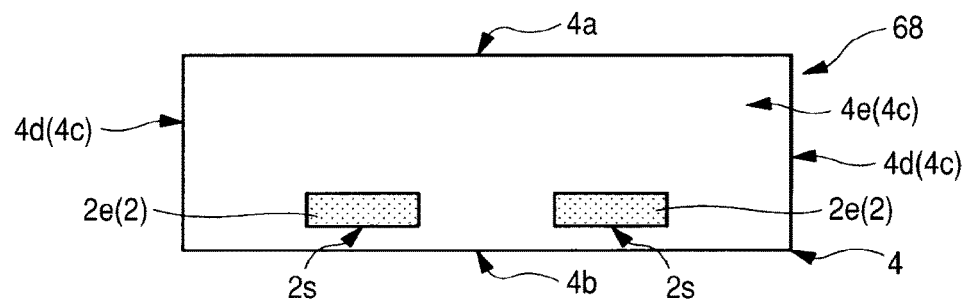
FIG. 87 is a side view illustrating an example of the structure of the semiconductor device illustrated in FIG. 85 as viewed from the direction B.
Figure 88:
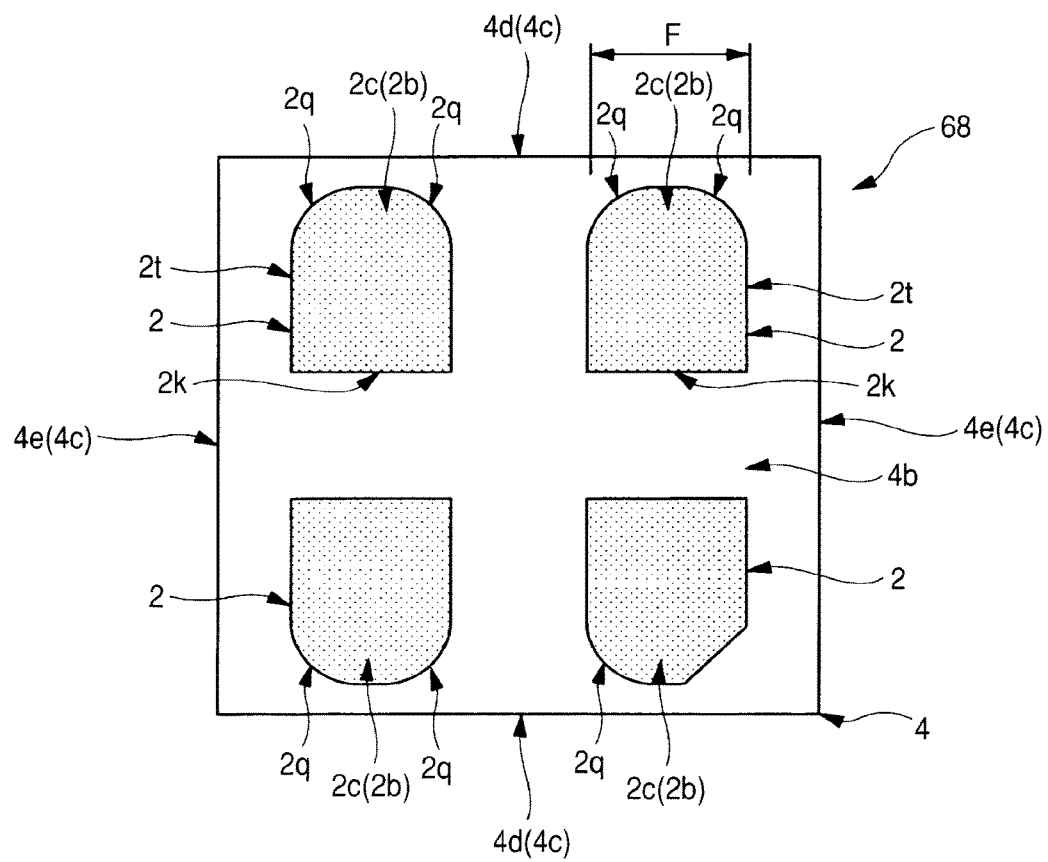
FIG. 88 is a bottom view illustrating an example of the structure of the semiconductor device illustrated in FIG. 85 on the back surface side.
Figure 89:
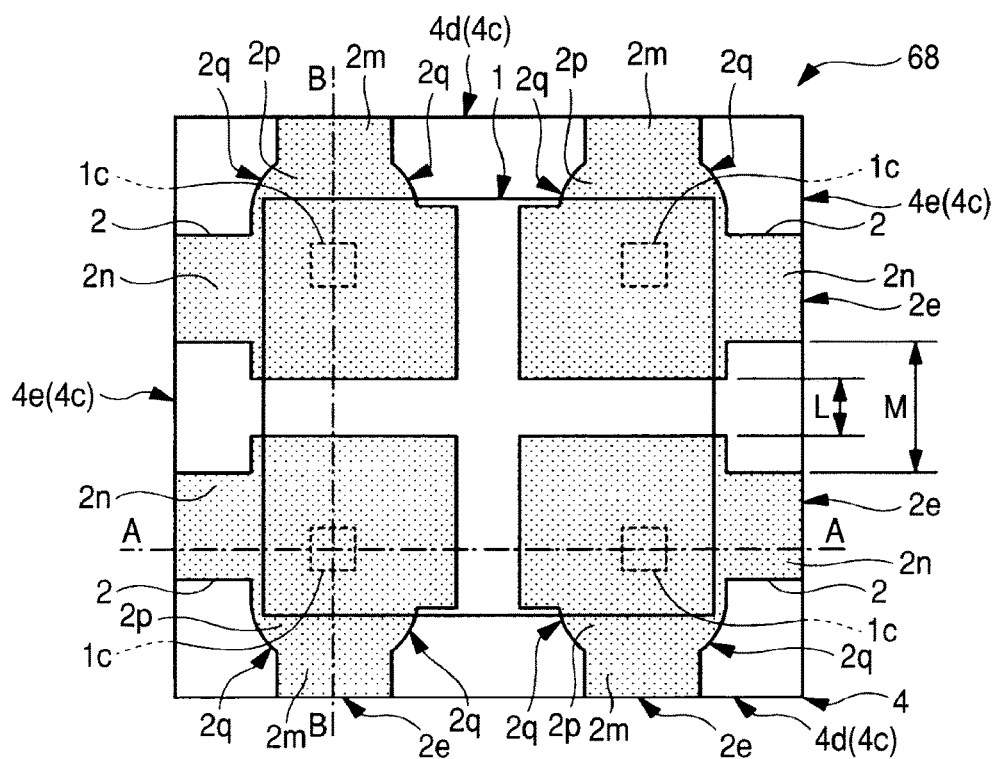
FIG. 89 is a plan view illustrating an example of the structure of the semiconductor device illustrated in FIG. 85 as seen through a sealing body and a semiconductor chip.
Figure 90:
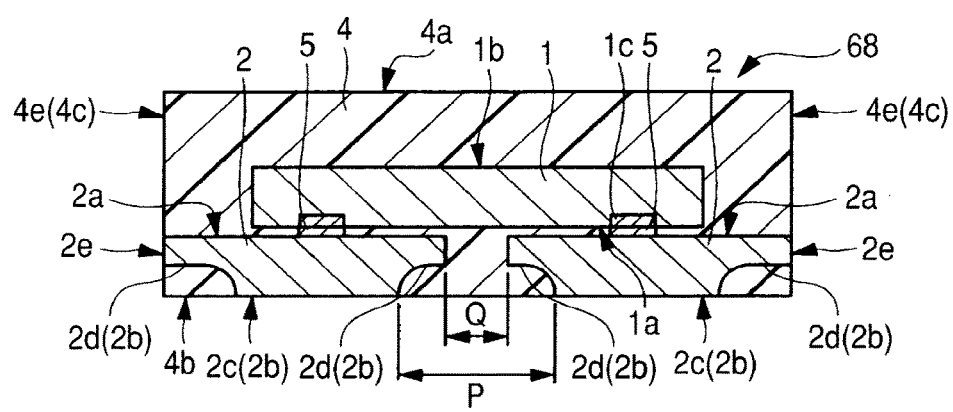
FIG. 90 is a sectional view illustrating an example of the structure cut along line A-A of FIG. 89.
Figure 91:
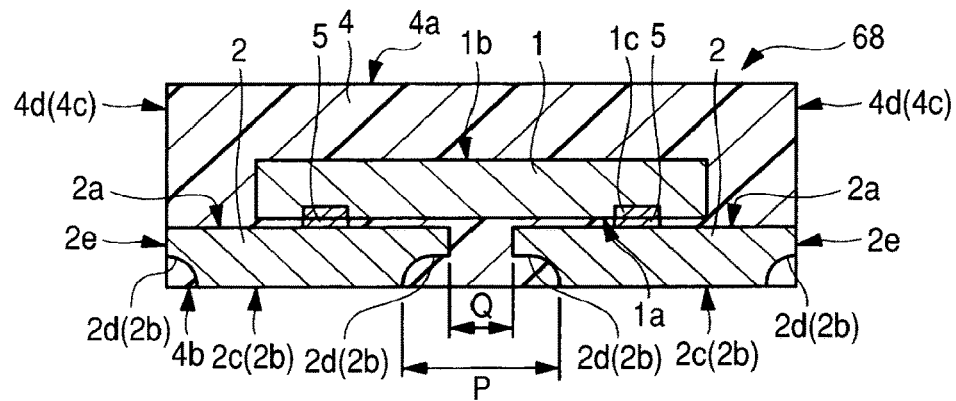
FIG. 91 is a sectional view illustrating an example of the structure cut along line B-B of FIG. 89.
Figure 92:
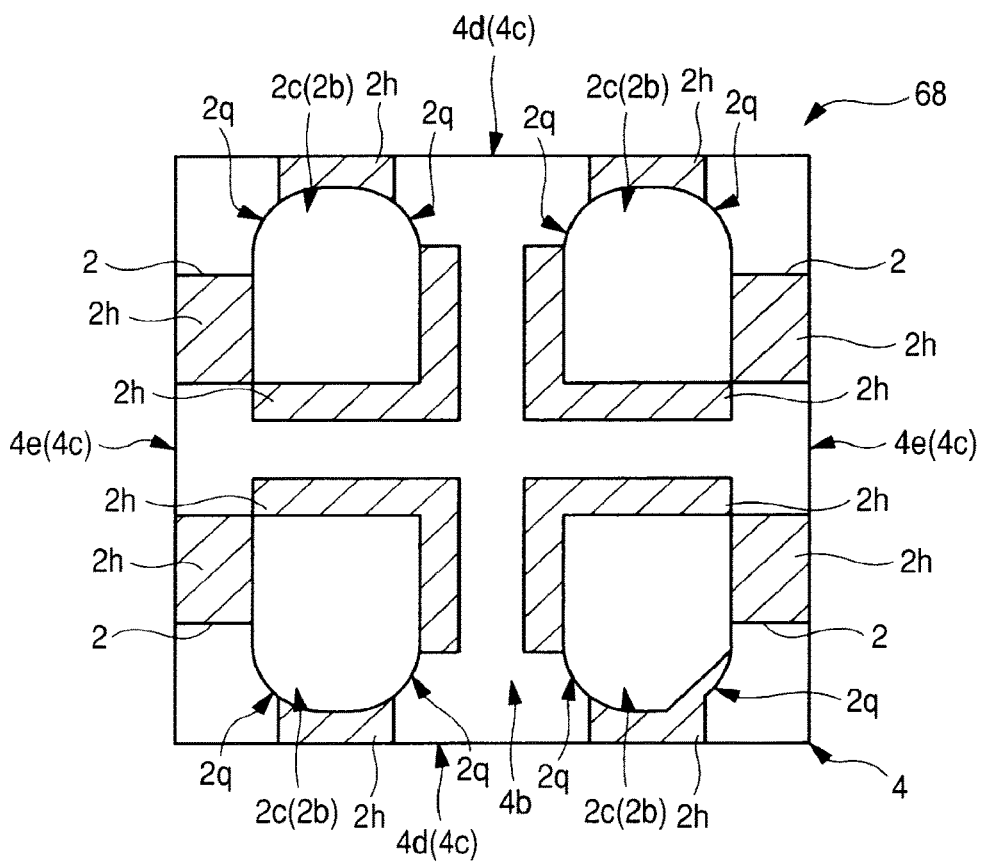
FIG. 92 is a plan view illustrating an example of half etching areas in the lead terminals of the semiconductor device illustrated in FIG. 85.

FIG. 85 is a plan view illustrating the structure of a semiconductor device in a first modification to the seventh embodiment of the invention; FIG. 86 is a side view illustrating an example of the structure of the semiconductor device illustrated in FIG. 85 as viewed from the direction A; FIG. 87 is a side view illustrating an example of the structure of the semiconductor device illustrated in FIG. 85 as viewed from the direction B; and FIG. 88 is a bottom view illustrating an example of the structure of the semiconductor device illustrated in FIG. 85 on the back surface side. FIG. 89 is a plan view illustrating an example of the structure of the semiconductor device illustrated in FIG. 85 as seen through a sealing body and a semiconductor chip; FIG. 90 is a sectional view illustrating an example of the structure cut along line A-A of FIG. 89; FIG. 91 is a sectional view illustrating an example of the structure cut along line B-B of FIG. 89; and FIG. 92 is a plan view illustrating an example of half etching areas in the lead terminals of the semiconductor device illustrated in FIG. 85.

The semiconductor device in the first modification illustrated in FIG. 85 to FIG. 92 is substantially the same semiconductor package 68 as the semiconductor package 67. A difference from the semiconductor package 67 is in that an R shape (arc shape) 2q facing outward is formed at corners on both sides of the base portion 2p of each lead terminal 2 buried in the resin as illustrated in FIG. 89.

As mentioned above, an R shape (arc shape) 2q facing outward is formed at corners on both sides of the base portion 2p of each lead terminal 2. As a result, it is possible to further reduce the straight line length of each place where the lead terminal 2 and the resin are in contact with each other in an offset portion (half etched portion 2h).

As the result of the formation of the R shape 2q facing outward at both sides of the base portion 2p of each lead terminal 2, the following takes place as illustrated in FIG. 88: an R shape 2q is also formed at corners of the first lower surface 2c of each lead terminal 2 exposed in the back surface 4b of the sealing body 4.

In the semiconductor package 68 in the first modification, as mentioned above, an R shape 2q facing outward is formed at corners on both sides of the base portion 2p of each lead terminal 2 buried in the resin. As a result, it is possible to implement the following: a sufficient area for flip chip bonding is ensured; and the straight line length of each place where the lead terminal 2 and the resin are in contact with each other in an offset portion (half etched portion 2h) is further shortened as compared with the semiconductor package 67. Therefore, reduction in the degree of adhesion between each lead terminal 2 and the resin can be further suppressed.

Consequently, even though stress is produced by friction between the work piece and a dicing blade 17 (Refer to FIG. 34) or the like during dicing in the assembly of the semiconductor package 68, the following can be implemented: peeling of the lead terminal 2 and the resin from each other can be further reduced.

The other respects in structure and the other effects of the semiconductor package 68 in the first modification and the assembling method for the semiconductor package 68 and the other effects obtained by this assembling method are the same as the following: those obtained by the semiconductor package 67 in the seventh embodiment and the assembling method therefor. Therefore, the description thereof will be omitted.

Figure 93:
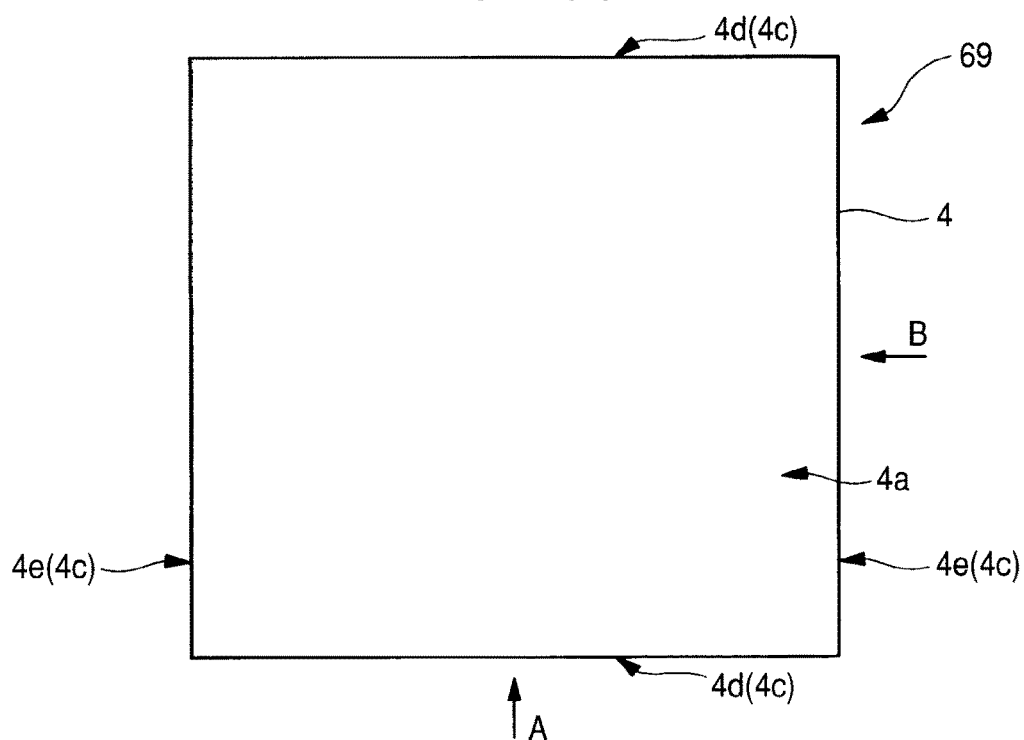
FIG. 93 is a plan view illustrating the structure of a semiconductor device in a second modification to the seventh embodiment of the invention.
Figure 94:
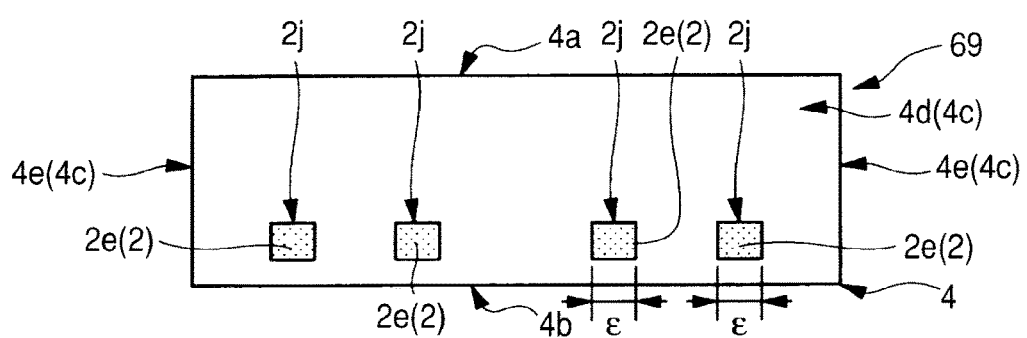
FIG. 94 is a side view illustrating an example of the structure of the semiconductor device illustrated in FIG. 93 as viewed from the direction A.
Figure 95:
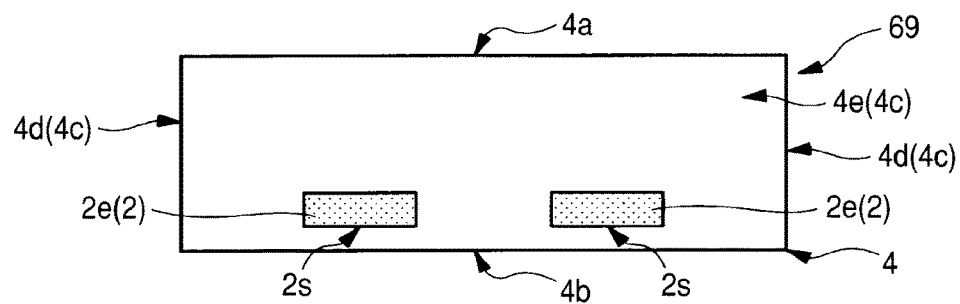
FIG. 95 is a side view illustrating an example of the structure of the semiconductor device illustrated in FIG. 93 as viewed from the direction B.
Figure 96:
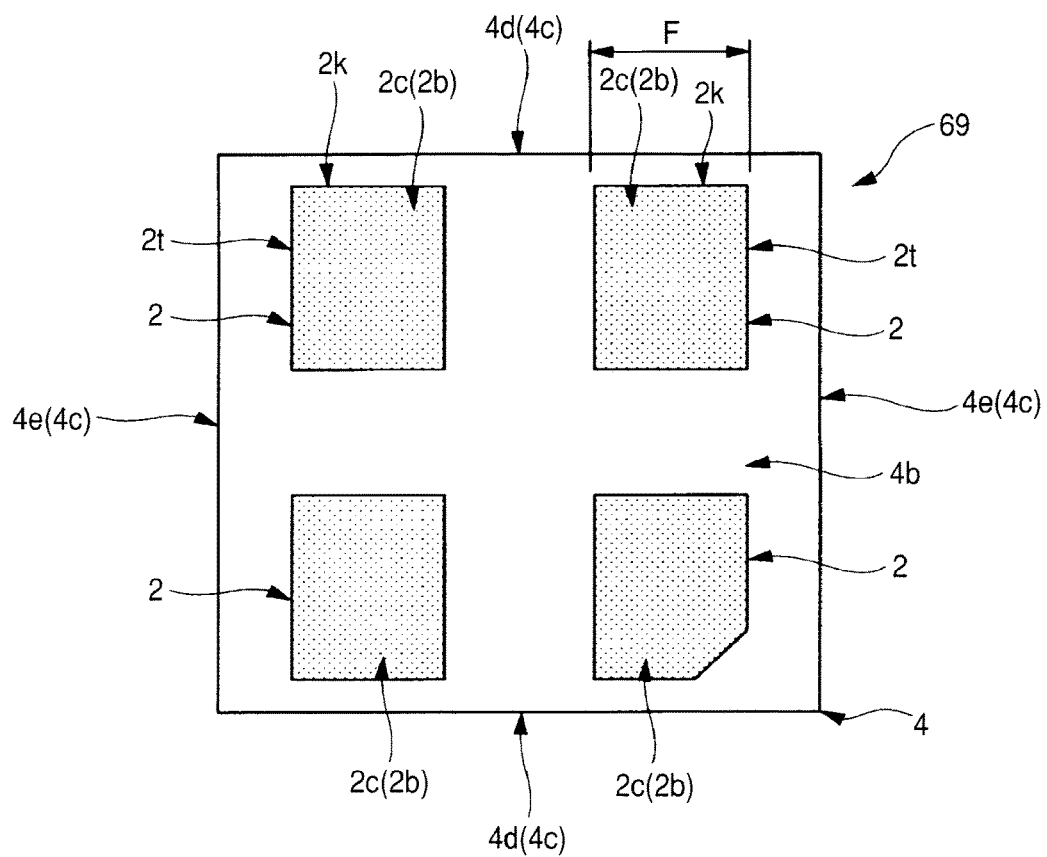
FIG. 96 is a bottom view illustrating an example of the structure of the semiconductor device illustrated in FIG. 93 on the back surface side.
Figure 97:
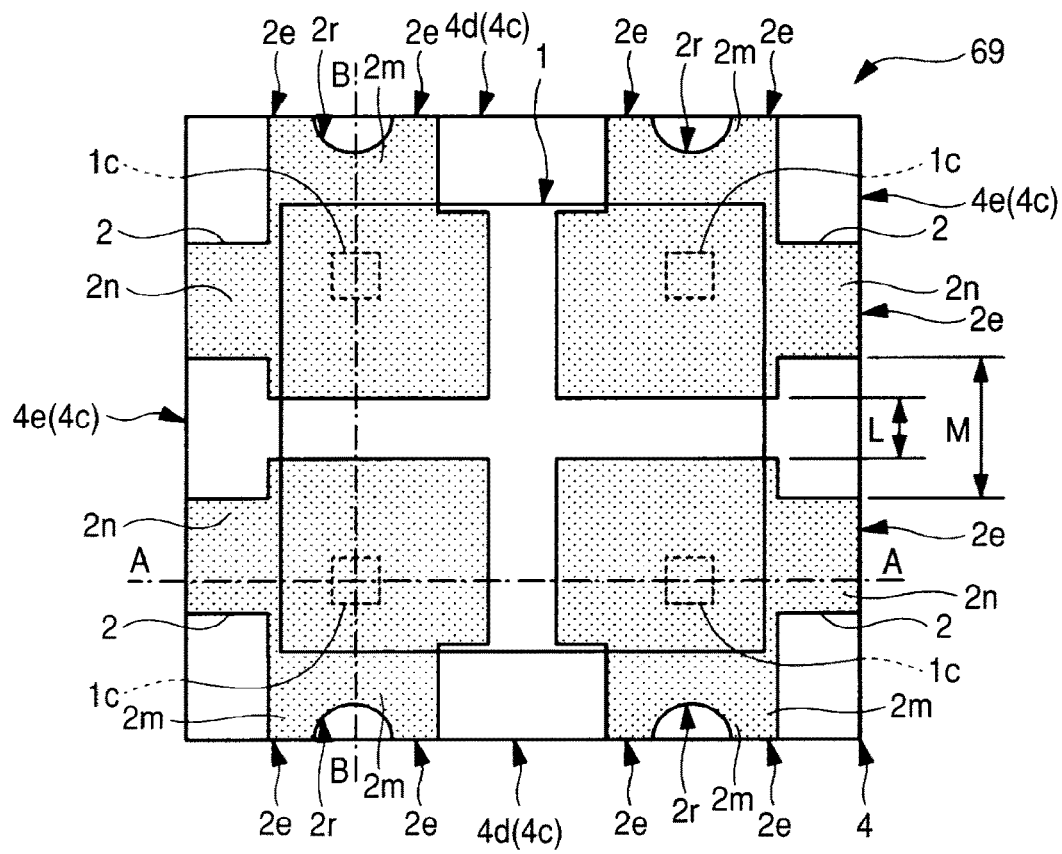
FIG. 97 is a plan view illustrating an example of the structure of the semiconductor device illustrated in FIG. 93 as seen through a sealing body and a semiconductor chip.
Figure 98:
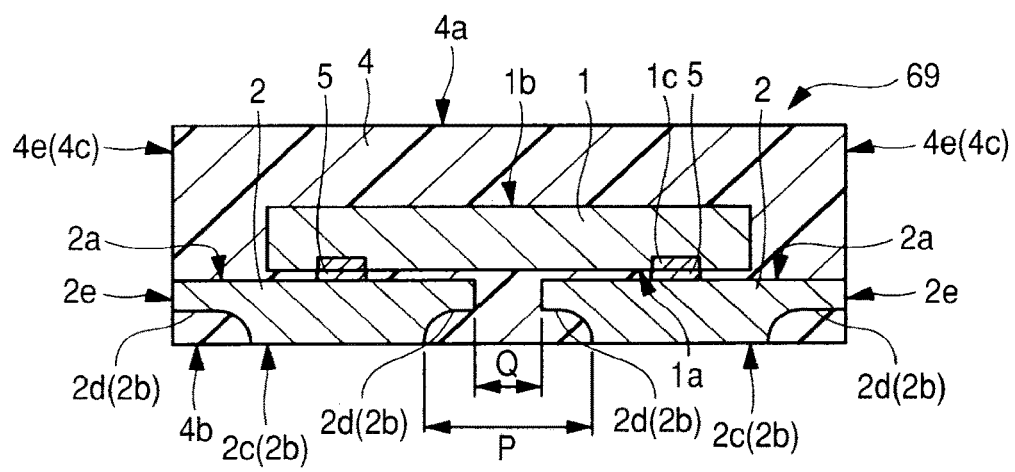
FIG. 98 is a sectional view illustrating an example of the structure cut along line A-A of the FIG. 97.
Figure 99:
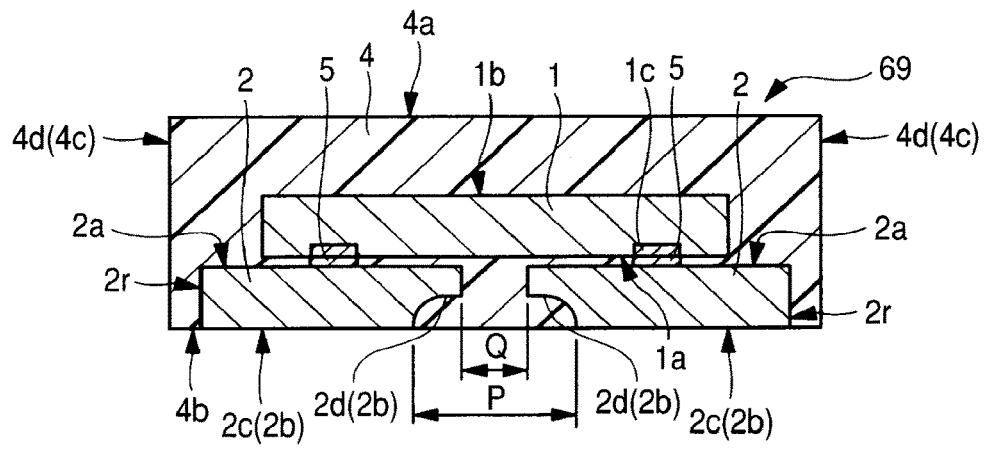
FIG. 99 is a sectional view illustrating an example of the structure cut along line B-B of FIG. 97.
Figure 100:
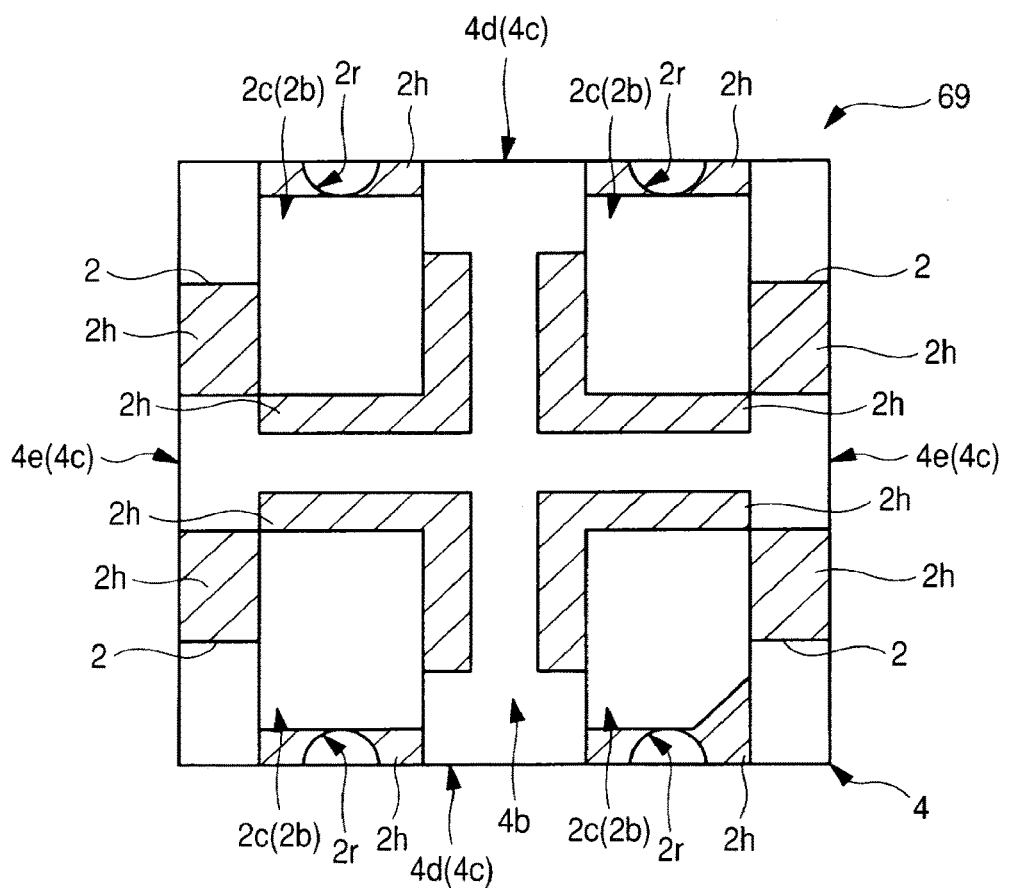
FIG. 100 is a plan view illustrating an example of half etching areas in the lead terminals of the semiconductor device illustrated in FIG. 93.

FIG. 93 is a plan view illustrating the structure of a semiconductor device in a second modification to the seventh embodiment of the invention; FIG. 94 is a side view illustrating an example of the structure of the semiconductor device illustrated in FIG. 93 as viewed from the direction A; FIG. 95 is a side view illustrating an example of the structure of the semiconductor device illustrated in FIG. 93 as viewed from the direction B; and FIG. 96 is a bottom view illustrating an example of the structure of the semiconductor device illustrated in FIG. 93 on the back surface side. FIG. 97 is a plan view illustrating an example of the structure of the semiconductor device illustrated in FIG. 93 as seen through a sealing body and a semiconductor chip; FIG. 98 is a sectional view illustrating an example of the structure cut along line A-A of FIG. 97; FIG. 99 is a sectional view illustrating an example of the structure cut along line B-B of FIG. 97; and FIG. 100 is a plan view illustrating an example of half etching areas in the lead terminals of the semiconductor device illustrated in FIG. 93.

The semiconductor device in the second modification illustrated in FIG. 93 to FIG. 100 is substantially the same semiconductor package 69 as the semiconductor package 67. A difference from the semiconductor package 67 is in that the following measure is taken in the four lead terminals 2 as illustrated in FIG. 97: a cut portion 2r is formed in the end portion 2m of each lead terminal 2 exposed in a first side surface 4d belonging to one of two sets of opposite side surfaces of the four side surfaces 4c of the sealing body 4.

More specific description will be given. A cut portion 2r forming a semicircular shape as viewed in a plane as illustrated in FIG. 97 is formed at the end portion 2m of each lead terminal 2 exposed in a first side surface 4d of the sealing body 4. Each of these cut portions 2r communicates with the upper surface 2a side of a lead terminal 2 and the back surface 4b side of the sealing body 4 in an offset portion (half etched portion 2h) as illustrated in FIG. 99. Each lead terminal is so structured that the resin on the upper surface 2a side and the resin on the lower surface 2b side are coupled to each other through resin (part of the sealing body 4) filled in these cut portions 2r.

As illustrated in FIG. 94, therefore, the resin (part of the sealing body 4) filled in cut portions 2r is exposed in a first side surface 4d of the sealing body 4. It is exposed in the first side surface 4d so that it divides the side surface 2e of a lead terminal 2 into right and left parts.

Letting the sum (ε+ε) of the length ε of each of two first sides 2j divided and shortened be as E, the sum E is shorter than the length F of the first side (lower surface-side first side) 2k as illustrated in FIG. 96 (E<F). The first side 2k is that of the first lower surface 2c of each lead terminal 2 exposed in the back surface 4b of the sealing body 4 and located in the same direction as the first side 2j.

In the semiconductor package 69 in the second modification in this example, a cut portion 2r is not formed in an end portion 2n exposed in a second side surface 4e belonging to the other of two sets of the opposite side surfaces of the sealing body 4 as illustrated in FIG. 97. However, the invention is not limited to this configuration and a cut portion may also be formed at each end portion 2n exposed in each second side surface 4e.

In the semiconductor package 69 in the second modification, as mentioned above, a cut portion 2r is formed at the end portion 2m of each lead terminal 2 exposed in a first side surface 4d of the sealing body 4. Thus each lead terminal is so structured that the resin filled in each cut portion 2r couples together the resin on the upper surface 2a side and the resin on the lower surface 2b side. The resin filled in each cut portion couples them together so that it divides the side surface 2e of the lead terminal 2. As a result, each divided end portion 2m of each lead terminal 2 can be encircled with resin.

This makes it possible to further enhance the pull-out strength of each lead terminal 2 of the semiconductor package 69 as compared with the semiconductor package 67.

Further, it is possible to further reduce the cross-sectional area of each lead terminal 2 to be cut during dicing in the assembly of the semiconductor package 69 as compared with the case of the semiconductor package 67. Thus it is possible to further reduce stress produced during dicing.

As a result, it is possible to further reduce the occurrence of peeling of a lead terminal 2 and the resin from each other during dicing.

Further, it is possible to further reduce the amount of each lead terminal 2 cut with the dicing blade 17 (Refer to FIG. 34) during dicing as compared with the case of the semiconductor package 67. Therefore, the life of the dicing blade 17 can be further lengthened.

In the description of the semiconductor packages 67, 68, and 69 in the seventh embodiment, the following cases have been taken as examples: cases where the following measure is taken only at the end portions 2m (four places) exposed in the first side surfaces 4d belonging to one of two sets of the opposite side surfaces of the sealing body 4: an end portion 2m narrower in width than the base portion 2p of each lead terminal 2 is provided or a cut portion 2r is provided at each end portion 2m. However, the invention is not limited to this. These measure may be taken at an end portion 2n exposed in a second side surface 4e belonging to the other of two sets of the opposite side surfaces of the sealing body 4.

In case of the semiconductor package 67, for example, the length of each second side (side surface-side second side) 2s may be made shorter than the length of each second side (lower surface-side second side) 2t. The second side 2s is that of the side surface 2e of each lead terminal 2 exposed in a second side surface 4e of the sealing body 4 illustrated in FIG. 79. The second side 2t is that of the first lower surface 2c of the lead terminal 2 exposed in the back surface 4b of the sealing body 4 and located in the same direction as the second side 2s, illustrated in FIG. 80. Or, the width of each end portion 2n may be narrowed by cutting it on both sides thereof or each end portion 2n may be provided with a cut portion 2r.

Further, these measures may be taken both at the end portion 2m and at the end portion 2n of each lead terminal 2.

In the semiconductor packages 67, 68, 69 in the seventh embodiment, an end portion 2m narrower in width than the base portion 2p of each lead terminal 2 is provided or a cut portion 2r is provided in each end portion 2m. These measures can also be applied to the semiconductor devices 6, 8, 19 to 21, and 65 in the first to sixth embodiments.

Up to this point, concrete description has been given to the invention made by the present inventors based on embodiments thereof. However, the invention is not limited to the above embodiments and can be variously modified without departing from the subject matter thereof, needless to add.

Some examples will be taken. In the description of the first to sixth embodiments, cases where the number of pins of a semiconductor device is four or six have been taken as examples. However, the number of pins of the semiconductor device is not limited to four or six and may be more than six.

The gold bumps (bumps, stud bumps) 5 in the above-mentioned first to fourth and sixth embodiments may be replaced with stud bumps of, for example, cupper (Cu). The wires 22 in the fifth embodiment may be copper wires, not gold wires. In any case, the material cost can be reduced by changing the material from gold to copper. "Gold" cited here includes "gold alloy" and "copper" includes "copper alloy."

The stud bumps in the above-mentioned first to fourth and sixth embodiments may be plating bumps of gold or copper. Plating bumps are formed in a lump in a wafer process and it is possible to suppress the processing cost per bump as compared with stud bumps which are individually formed one by one. Further, solder bumps using Sn—Pb highmelting point solder or Sn—Ag lead-free solder may be adopted. The solder bumps may be formed by the above-mentioned plating or formed by printing and ref lowing solder paste. In case of solder bumps, electrical coupling can be obtained by placing multiple solder bumps over lead terminals through flux and ref lowing them in a lump. Therefore, it is possible to suppress the processing cost per chip as compared with stud bumps.

The lead frame 12 used in the above-mentioned third embodiment may be a lead frame formed by pressing. In this case, it is advisable to form the second lower surface 2d of each lead terminal 2 by coining. Pressing and coining are higher in processing speed per lead frame as compared with etching and thus the cost of a lead frame can be suppressed.

The flip chip bonding structure described in relation to the first to fourth, sixth, and seventh embodiments is such that: a distance of 20 μm or above is ensured as the distance D between the main surface 1a of the semiconductor chip 1 and the upper surface 2a of each of the four lead terminals 2 before molding resin (sealing resin) is filled. Instead, underfill (liquid resin) of the same thermosetting epoxy resin as the molding resin and the like may be used. The underfill resin is higher in flowability than the molding resin; therefore, it is possible to closely fill the gap between the semiconductor chip 1 and each lead terminal 2. For this reason, it is possible to make the distance D between the main surface 1a of the semiconductor chip 1 and the upper surface 2a of each of the four lead terminals 2 smaller than 20 μm. Therefore, the thickness of the semiconductor device can be further reduced as compared with a structure in which the gap is filled with molding resin.

The use of the semiconductor chip is not limited to a voltage regulator or voltage detector and can be applied to, for example, diodes and various sensors.

The flip chip bonding structure described in relation to the first to fourth, sixth, and seventh embodiments is such that: a distance of 20 μm or above is ensured as the distance D between the main surface 1a of the semiconductor chip 1 and the upper surface 2a of each of the four lead terminals 2 and then molding resin (sealing resin) is filled. However, the invention is not limited to this structure. For example, the following structure may be adopted: the diameter of filler in resin is reduced; and the distance D between the main surface 1a of the semiconductor chip 1 and the upper surface 2a of each of the four lead terminals 2 is set to 20 μm or below as long as there is no problem in terms of flowability or fillability.

The invention is suitable for small electronic devices.

What is claimed is:

1. A semiconductor device comprising:
    a semiconductor chip having a first surface over which four electrode pads are arranged and a second surface opposite the first surface;
    four external terminals; and
    a sealing body sealing the semiconductor chip and a part of each of the four external terminals,
    wherein each of the four external terminals has a first top surface, a first bottom surface opposite the first top surface, and a second bottom surface opposite the first top surface and between the first top surface and the first bottom surface in a thickness direction thereof,
    wherein, in a plan view from the first bottom surface side, the second bottom surface surrounds the first bottom surface,
    wherein the semiconductor chip is mounted over the first top surface of each of the four external terminals such that the first surface of the semiconductor chip faces the first top surface of each of the four external terminals, with each of the four electrode pads being electrically connected with the first top surface of a corresponding one of the four external terminals via a metal bump,
    wherein each of the four external terminals has no portion except for the first bottom surface exposed from the sealing body,
    wherein, in a plan view from the second surface side of the semiconductor chip, the second surface of the semiconductor chip has a rectangular shape, and
    wherein, in the plan view from the second surface side of the semiconductor chip, each of four corner points of the second surface is located so as not to lie outside a perimeter of the first top surface of a corresponding one of four the external terminals,
    wherein the four external terminals include a first external terminal which is overlapped with one of four corner points of the semiconductor chip in the plan view,
    wherein, in the plan view from the first bottom surface side of each of the external terminals, the first external terminal is shaped differently than the other three external terminals, which have substantially the same shape, and
    wherein each of the four electrode pads of the semiconductor chip overlaps the first bottom surface side of the corresponding four external terminals in the plan view from the second surface side of the semiconductor chip.

2. The semiconductor device according to claim 1, wherein, in the plan view from the second surface side of the semiconductor chip, each of the electrode pads is arranged in an area of the first surface with which the semiconductor chip and the first top surface of each of four external terminals overlap.

3. The semiconductor device according to claim 1, wherein each of the four external terminals is composed of a laminated body of Ag plating, Ni plating, and Au plating,
    wherein the first top surface is composed of the Ag plating, and
    wherein the first bottom surface is composed of the Au plating.

4. The semiconductor device according to claim 1, wherein a distance between the main surface of the semiconductor chip and the first top surface of each of the external terminals is at least 20 um,
    wherein the sealing body includes filler, and
    wherein the filler's particle size is 10 um or so on an average.

5. A semiconductor device comprising:
    a semiconductor chip having a first surface over which four electrode pads are arranged and a second surface opposite the first surface;
    four external terminals; and
    a sealing body sealing the semiconductor chip and a part of each of the external terminals,
    wherein each of the four external terminals has a top surface and a bottom surface opposite the top surface,
    wherein, an area of the top surface is greater than an area of the bottom surface,
    wherein the semiconductor chip is mounted over the top surface of each of the four external terminals such that the first surface thereof faces the top surface of each of the four external terminals, with each of the four electrode pads being electrically connected with the top surface of a corresponding one of the four external terminals via a metal bump, wherein each of the four external terminals has no portion except for a portion of the bottom surface exposed from the sealing body, wherein, in a plan view from the second surface side of the semiconductor chip, the second surface of the semiconductor chip has a rectangular shape, wherein, in the plan view from the second surface side of the semiconductor chip, each of four corner points of the second surface is located so as not to lie outside a perimeter of the top surface of a corresponding one of the four external terminals, wherein the four external terminals include a first external terminal which is overlapped with one of four corner points of the semiconductor chip in the plan view, wherein, in the plan view from the first bottom surface side of each of the four external terminals, the first external terminal is shaped differently than the other three external terminals, which have substantially the same shape, and wherein each of the four electrode pads of the semiconductor chip overlaps the first bottom surface side of the corresponding four external terminals in the plan view from the second surface side of the semiconductor chip.

6. The semiconductor device according to claim 5, wherein each of the four external terminals has a step portion covered by the sealing body.

7. The semiconductor device according to claim 5, wherein each of the four external terminals is composed of a laminated body of Ag plating, Ni plating, and Au plating, wherein the top surface is composed of the Ag plating, and wherein the bottom surface is composed of the Au plating.

8. The semiconductor device according to claim 5, wherein a distance between the main surface of the semiconductor chip and the first top surface of each of the external terminals is at least 20 um wherein the sealing body includes filler, and wherein the filler's particle size is 10 um or so on an average.

* * * * *